(12) United States Patent
Wu

(10) Patent No.: US 11,728,237 B2
(45) Date of Patent: Aug. 15, 2023

(54) SEMICONDUCTOR DEVICE WITH A SUPPORTING MEMBER AND BONDED METAL LAYERS

(71) Applicant: ROHM CO., LTD., Kyoto (JP)

(72) Inventor: Xiaopeng Wu, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 112 days.

(21) Appl. No.: 17/286,367

(22) PCT Filed: Oct. 23, 2019

(86) PCT No.: PCT/JP2019/041515
§ 371 (c)(1),
(2) Date: Apr. 16, 2021

(87) PCT Pub. No.: WO2020/085377
PCT Pub. Date: Apr. 30, 2020

(65) Prior Publication Data
US 2021/0384097 A1 Dec. 9, 2021

(30) Foreign Application Priority Data
Oct. 24, 2018 (JP) .................................. 2018-199930

(51) Int. Cl.
*H01L 23/36* (2006.01)
*H01L 23/29* (2006.01)
*H01L 25/07* (2006.01)

(52) U.S. Cl.
CPC .............. *H01L 23/36* (2013.01); *H01L 23/29* (2013.01); *H01L 25/07* (2013.01)

(58) Field of Classification Search
CPC ...................................................... H01L 23/36
(Continued)

(56) References Cited

U.S. PATENT DOCUMENTS

2017/0309499 A1* 10/2017 Oi .................... H05K 1/0203

FOREIGN PATENT DOCUMENTS

| CN | 105189109 A | 12/2015 |
| JP | 2003-68953 A | 3/2003 |

(Continued)

OTHER PUBLICATIONS

International Search Report issued in PCT/JP2019/041515, dated Dec. 24, 2019 (1 page).

(Continued)

*Primary Examiner* — Ajay Arora
(74) *Attorney, Agent, or Firm* — Hamre, Schumann, Mueller & Larson, P.C.

(57) ABSTRACT

The semiconductor device includes a supporting member, a conductive member, and a semiconductor element. The supporting member has a supporting surface facing in a thickness direction. The conductive member has an obverse surface facing the same side as the supporting surface faces in the thickness direction, and a reverse surface opposite to the obverse surface. The conductive member is bonded to the supporting member such that the reverse surface faces the supporting surface. The semiconductor element is bonded to the obverse surface. The semiconductor device further includes a first metal layer and a second metal layer. The first metal layer covers at least a part of the supporting surface. The second metal layer covers the reverse surface. The first metal layer and the second layer are bonded to each other by solid phase diffusion.

16 Claims, 48 Drawing Sheets

(58) Field of Classification Search
USPC .......................................................... 257/713
See application file for complete search history.

(56) References Cited

FOREIGN PATENT DOCUMENTS

| | | | |
|---|---|---|---|
| JP | 2009-158787 A | | 7/2009 |
| JP | 2013-222909 A | | 10/2013 |
| JP | 2014-22579 A | | 2/2014 |
| JP | 2016152385 A | * | 8/2016 |

OTHER PUBLICATIONS

Office Action received in the corresponding Japanese Patent application, dated Oct. 25, 2022, and machine translation (7 pages).
Office Action received in the corresponding Chinese Patent application, dated May 25, 2023, and machine translation (11 pages).

* cited by examiner

SEMICONDUCTOR DEVICE WITH A SUPPORTING MEMBER AND BONDED METAL LAYERS

TECHNICAL FIELD

The present disclosure relates to a semiconductor device provided with a semiconductor element, and in particular to a semiconductor device in which the semiconductor element is a switching element.

BACKGROUND ART

Conventionally, a semiconductor device provided with a semiconductor element such as a MOSFET or an IGBT is widely known. Patent document 1 discloses an example of a semiconductor device including such a semiconductor element. In the semiconductor device, conductive members (metal patterns 4a and 4b in Patent document 1) made of a metal foil are arranged on a supporting member (an insulating substrate 11 in Patent document 1). The semiconductor element is bonded to the conductive members.

During the use of the semiconductor device disclosed in Patent document 1, the temperature of the conductive members rises due to heat generated from the semiconductor element. The conductive members made of a metal foil are relatively thin, and therefore have a characteristic that the heat resistance per unit length in a direction perpendicular to a thickness direction is high. This poses a problem that the temperature of the conductive members gradually decreases, and parts of the conductive members, which are located near the semiconductor element, are maintained at high temperature.

PRIOR ART DOCUMENT

Patent Document

Patent Document 1: JP-A-2009-158787

SUMMARY OF THE INVENTION

Technical Problem

In view of the above circumstances, an object of the present disclosure is to provide a semiconductor device capable of improving heat dissipation.

Solution to Problem

The present disclosure provides a semiconductor device comprising: a supporting member having a supporting surface facing in a thickness direction; a conductive member having an obverse surface facing a same side as the supporting surface faces in the thickness direction, and a reverse surface opposite to the obverse surface, where the conductive member is bonded to the supporting member such that the reverse surface faces the supporting surface; a semiconductor element bonded to the obverse surface; and a first metal layer covering at least a part of the supporting surface, and a second metal layer covering the reverse surface. The first metal layer and the second metal layer are bonded to each other by solid phase diffusion.

The specific configuration of the semiconductor device provided by the present disclosure will be apparent from the detailed description given below with reference to the accompanying drawings.

EMBODIMENTS

Embodiments of the present disclosure will be described with reference to the accompanying drawings.

First Embodiment

Figure 1:
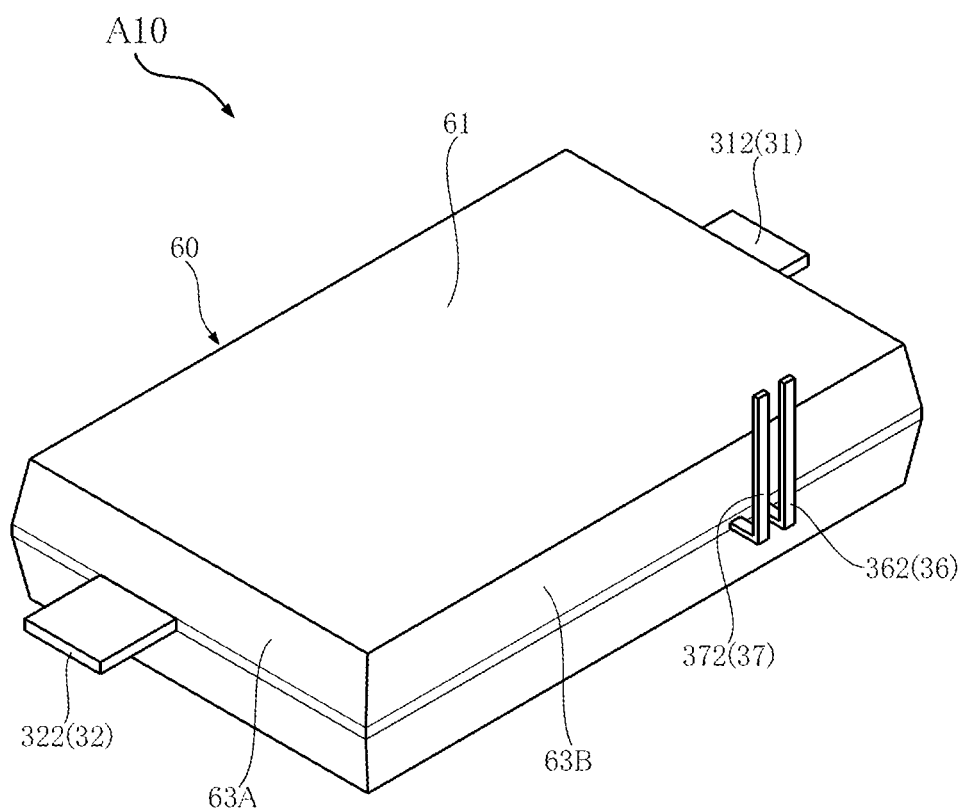
FIG. 1 is a perspective view showing a semiconductor device according to a first embodiment of the present disclosure.
Figure 2:
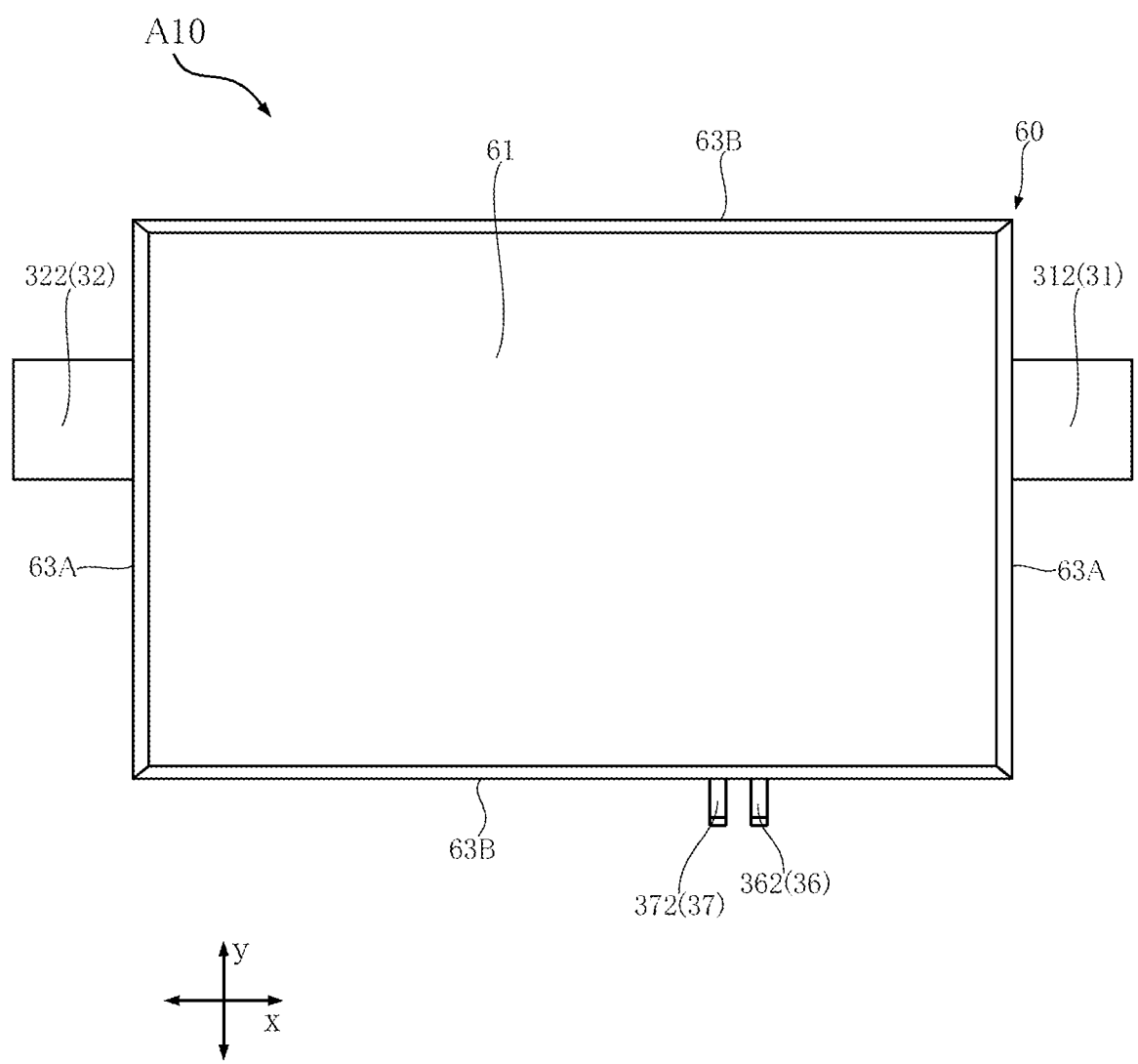
FIG. 2 is a plan view showing the semiconductor device of FIG. 1.
Figure 3:
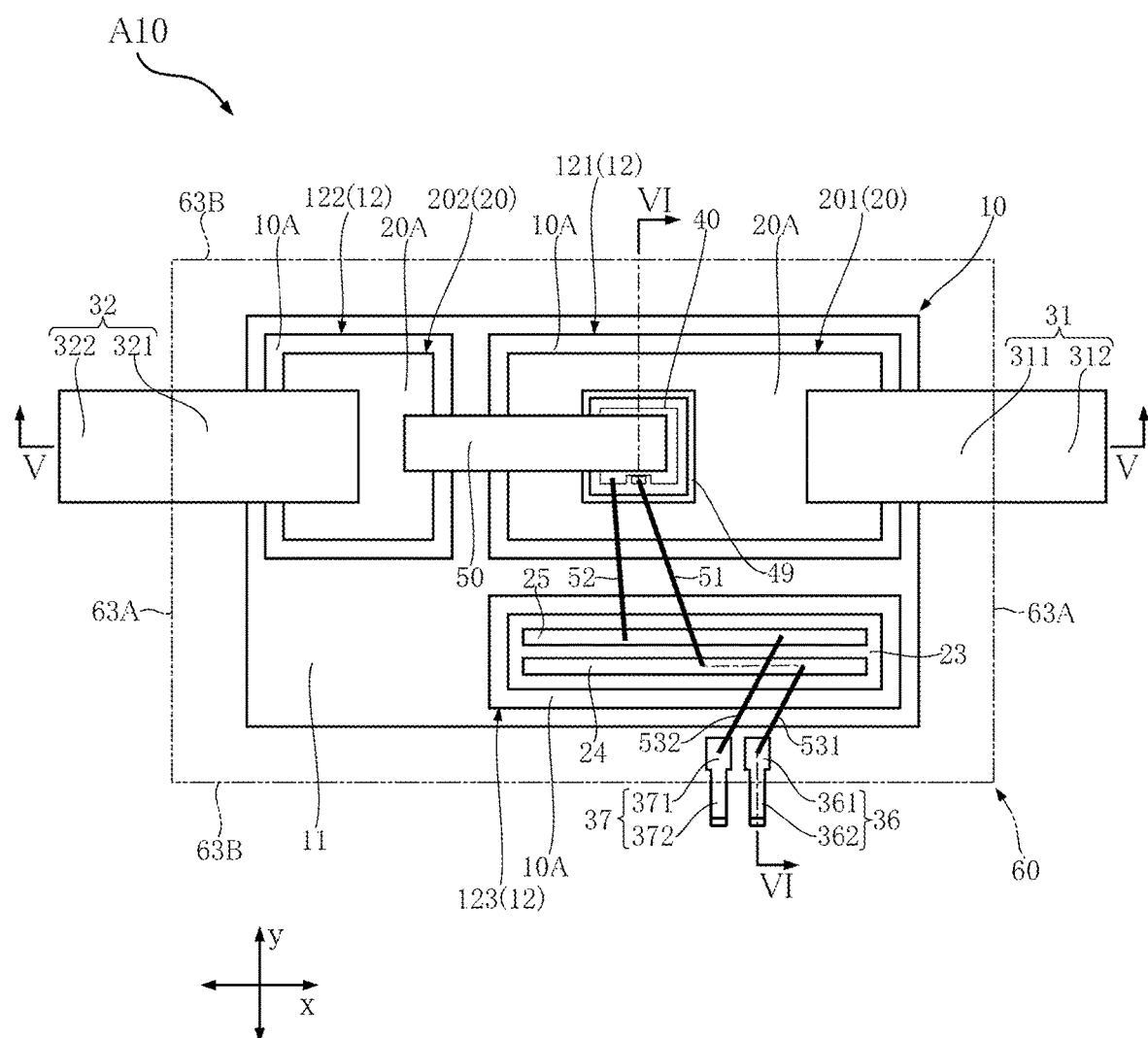
FIG. 3 is a plan view corresponding to FIG. 2 and showing a sealing resin in phantom.

A semiconductor device A10 according to a first embodiment of the present disclosure will be described with reference to FIGS. 1 to 9D. The semiconductor device A10 includes a supporting member 10, a first metal layer 19, a conductive member 20, a second metal layer 29, a first terminal 31, a second terminal 32, a semiconductor element 40, a conduction member 50, and a sealing resin 60. The semiconductor device A10 further includes an insulating layer 23, a gate layer 24, a detection layer 25, a gate terminal 36, a detection terminal 37, a gate wire 51, a detection wire 52, a first wire 531, and a second wire 532. The semiconductor device A10 shown in these figures is a power conversion device (power module) in which the semiconductor element 40 is a MOSFET, for example. The semiconductor device A10 is used as a motor drive source, an inverter device for various electronic products, or a DC/DC converter, for example. FIG. 3 shows the sealing resin 60 in phantom for convenience of understanding. In FIG. 3, the sealing resin 60 shown in phantom is indicated by an imaginary line (two-dot chain line). FIGS. 9C and 9D each show a configuration corresponding to the configuration shown in FIG. 9B, but are different in cross-sectional position.

In the description of the semiconductor device A10, the thickness direction of the supporting member 10 is referred to as "thickness direction z". A direction perpendicular to the thickness direction z is referred to as "first direction x". The direction perpendicular to both the thickness direction z and the first direction x is referred to as "second direction y". As shown in FIGS. 1 and 2, the semiconductor device A10 has a rectangular shape as viewed along the thickness direction z. The first direction x corresponds to the longitudinal direction of the semiconductor device A10. The second direction y corresponds to the transverse direction of the semiconductor device A10. In the description of the semiconductor device A10, the side in the first direction x on which the first terminal 31 is positioned is referred to as "first side in the first direction x", for convenience. The side in the first direction x on which the second terminal 32 is positioned is referred to as "second side in the first direction x".

Figure 4:
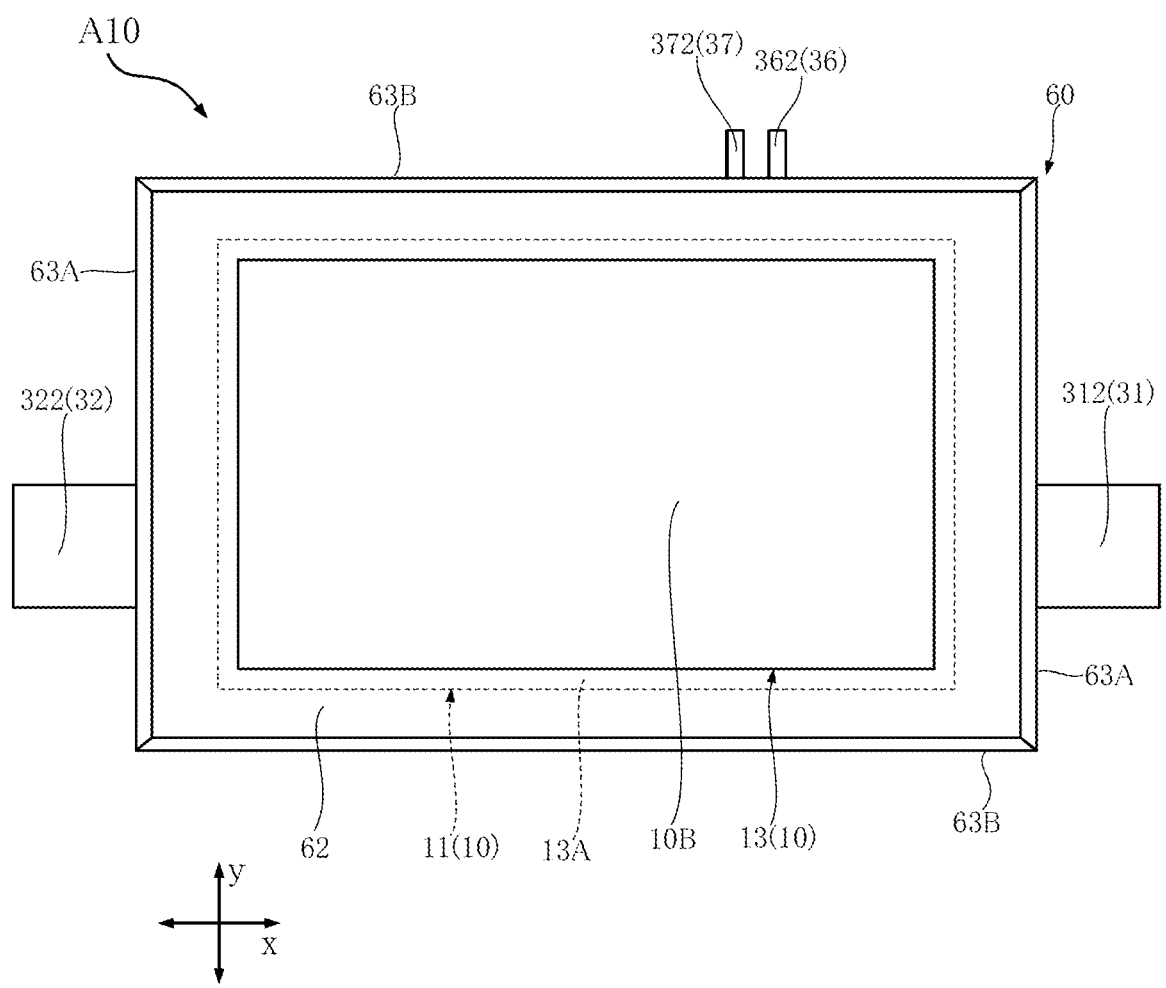
FIG. 4 is a bottom view showing the semiconductor device of FIG. 1.
Figure 5:
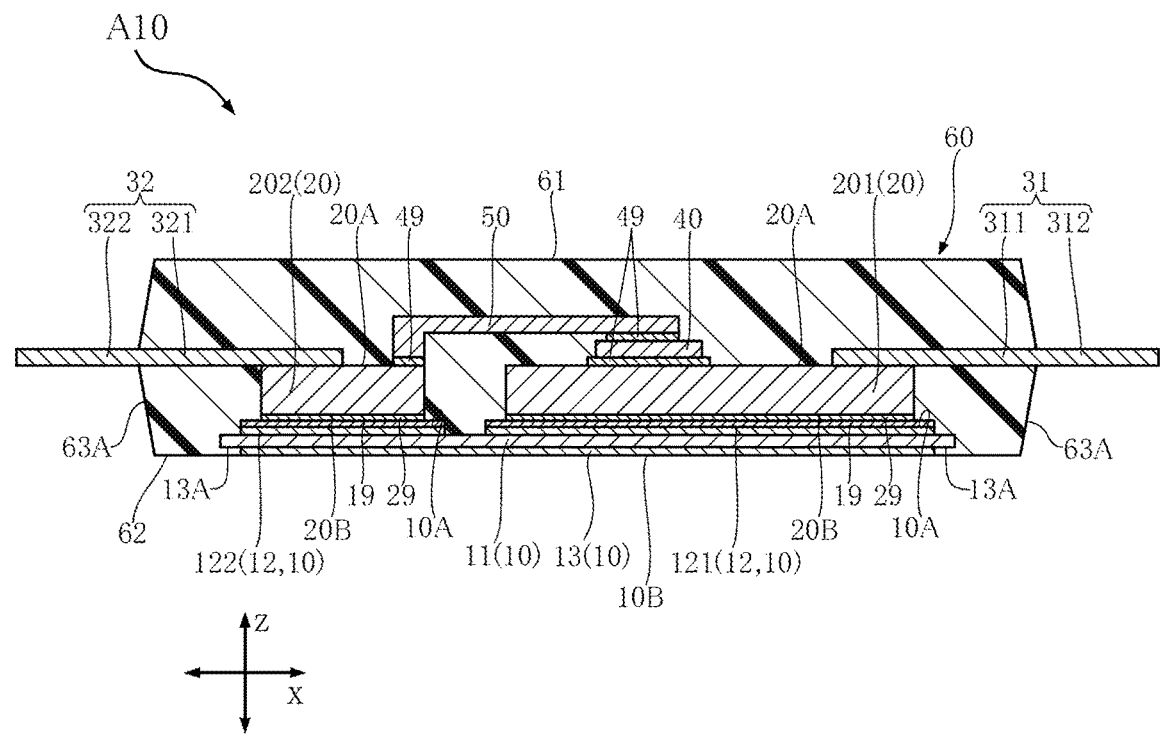
FIG. 5 is a cross-sectional view along line V-V in FIG. 3.
Figure 6:
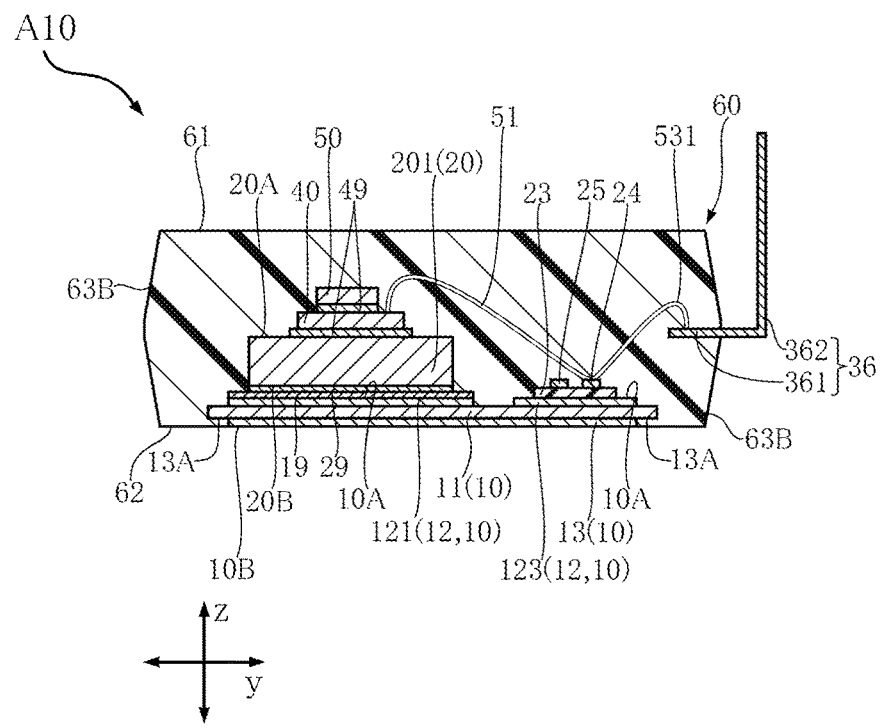
FIG. 6 is a cross-sectional view along line VI-VI in FIG. 3.

As shown in FIGS. 3, 5, and 6, the supporting member 10 supports the conductive member 20. In the example of the semiconductor device A10, the supporting member 10 has a rectangular shape elongated in the first direction x as viewed in the thickness direction z. The supporting member 10 has a supporting surface 10A and a bottom surface 10B that are opposite to each other in the thickness direction z. Of these two surfaces, the supporting surface 10A faces the conductive member 20. As shown in FIGS. 4 to 6, the bottom surface 10B is exposed from the sealing resin 60. When the semiconductor device A10 is attached to a heat sink, the bottom surface 10B faces the heat sink. In the semiconductor device A10, the supporting member 10 has a first supporting plate 11, a second supporting plate 12, and a bottom plate 13.

As shown in FIGS. 5 and 6, the first supporting plate 11 is positioned between the second supporting plate 12 and the bottom plate 13 in the thickness direction z. The first supporting plate 11 is electrically insulative. The first supporting plate 11 is made of a ceramic material having excellent thermal conductivity. One example of the ceramic material is aluminum nitride (AlN).

As shown in FIGS. 3, 5, and 6, the second supporting plate 12 is formed on the first supporting plate 11. The second supporting plate 12 includes the supporting surface 10A. In the semiconductor device A10, the conductive member 20 is bonded to the second supporting plate 12. The second supporting plate 12 is a metal foil made of copper (Cu) or a copper alloy. Thus, the second supporting plate 12 has electrical conductivity. In the example of the semiconductor device A10, the second supporting plate 12 includes three regions, i.e., a first region 121, a second region 122, and a third region 123. The three regions are separated apart from each other. The first region 121 is positioned on the first side in the first direction x. The second region 122 is positioned on the second side in the first direction x with respect to the first region 121. The third region 123 is positioned on the first side in the second direction y with respect to the first region 121. Among these regions, the first region 121 and the third region 123 each have a band-like shape extending in the first direction x as viewed along the thickness direction z.

As shown in FIGS. 5 and 6, the bottom plate 13 is formed on the first supporting plate 11 and positioned opposite to the second supporting plate 12. The bottom plate 13 includes the bottom surface 10B. As with the second supporting plate 12, the bottom plate 13 is a metal foil made of copper or a copper alloy, thereby having electrical conductivity. As shown in FIG. 4, the bottom plate 13 is smaller in area than the first supporting plate 11 as viewed along the thickness direction z. Furthermore, the periphery of the first supporting plate 11 is located more outward than the periphery of the bottom plate 13. As a result, the supporting member 10 is provided with a step 13A surrounding the bottom plate 13, as viewed along the thickness direction z. The step 13A is covered with the sealing resin 60.

In the semiconductor device A10, the supporting member 10 can be easily formed by using a direct bonded copper (DBC) substrate, for example. The DBC substrate is composed of a ceramic plate, and a pair of copper foils flanking a ceramic plate in the thickness direction z. The ceramic plate serves as the first supporting plate 11. Parts of the pair of copper foils are removed by etching to form the second supporting plate 12 and the bottom plate 13.

As shown in FIGS. 5 and 6, the first metal layer 19 covers at least a part of the supporting surface 10A of the supporting member 10. In the semiconductor device A10, the first metal layer 19 covers the supporting surface 10A of each of the first region 121 and the second region 122 of the second supporting plate 12. The first metal layer 19 does not cover the supporting surface 10A of the third region 123 of the second supporting plate 12. As shown in FIG. 9A, the first metal layer 19 has a first layer 191 and a second layer 192. The first layer 191 covers at least a part of the supporting surface 10A. The first layer 191 contains aluminum (Al) as its composition. The second layer 192 is positioned opposite to the supporting member 10 with respect to the first layer 191 in the thickness direction z, and is formed on the first layer 191. The second layer 192 contains silver (Ag) as its composition. The Vickers hardness (HV) of the first layer 191 is smaller than the Vickers hardness of the second layer 192. The thickness t1 of the first layer 191 is larger than the thickness t2 of the second layer 192.

The first metal layer 19 is provided by forming the first layer 191 and the second layer 192 in this order on the supporting surface 10A of the supporting member 10. These layers may be formed by a sputtering method or a vacuum deposition method, for example. When a DBC substrate is used to form the supporting member 10, the first layer 191 and the second layer 192 are formed in this order to cover one of the copper foils which is formed on the ceramic plate on one side in the thickness direction z. Then, the one of the copper foils, along with the first layer 191 and the second layer 192, is partially removed by etching to form the second supporting plate 12 and the first metal layer 19.

Figure 9A:
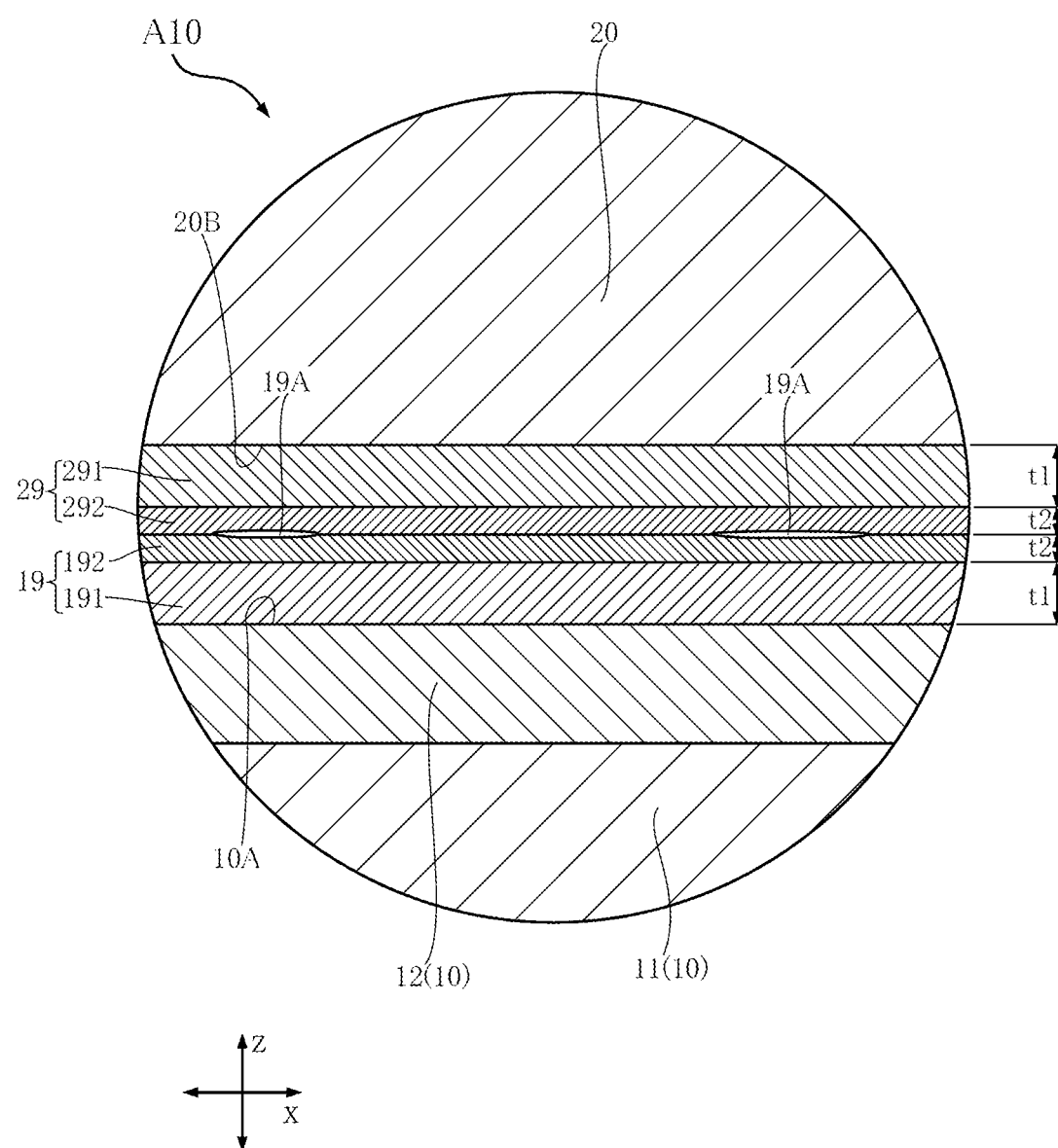
FIG. 9A is a partially enlarged view of FIG. 8.
Figure 9B:
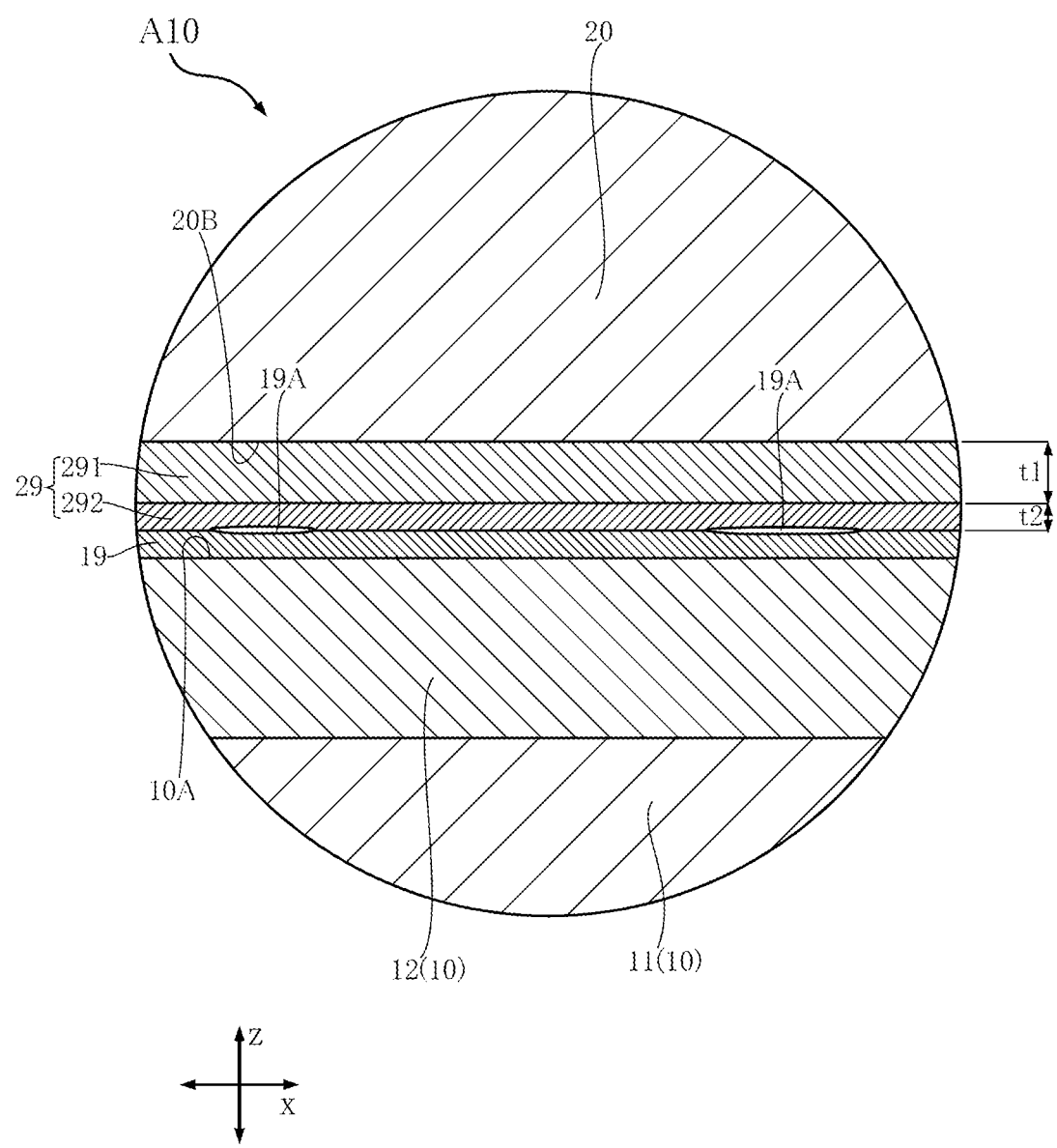
FIG. 9B is a partially enlarged view of FIG. 8.
Figure 9C:
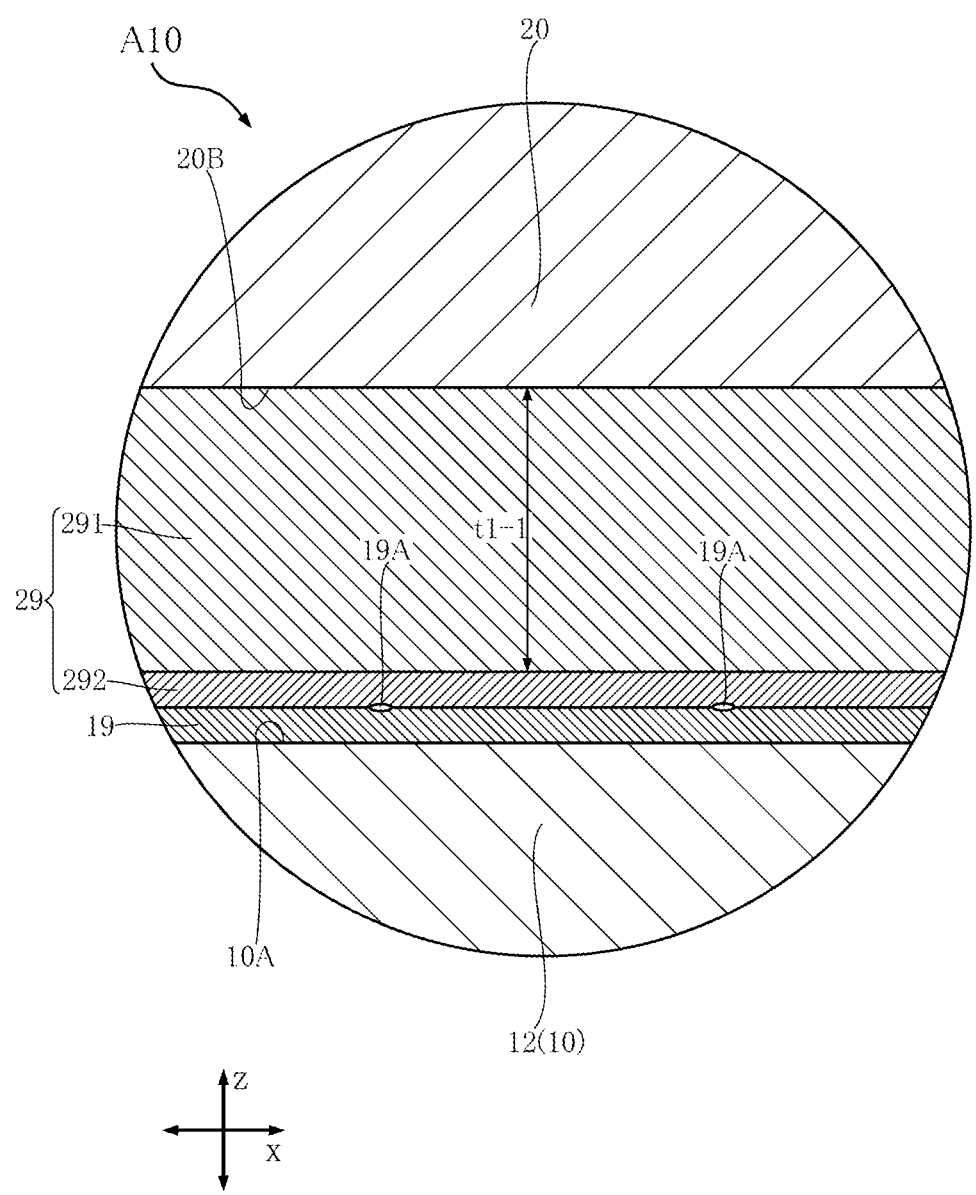
FIG. 9C is a partially enlarged view corresponding to the configuration shown in FIG. 9B, and shows the central portion of a second metal layer as viewed along the thickness direction.
Figure 9D:
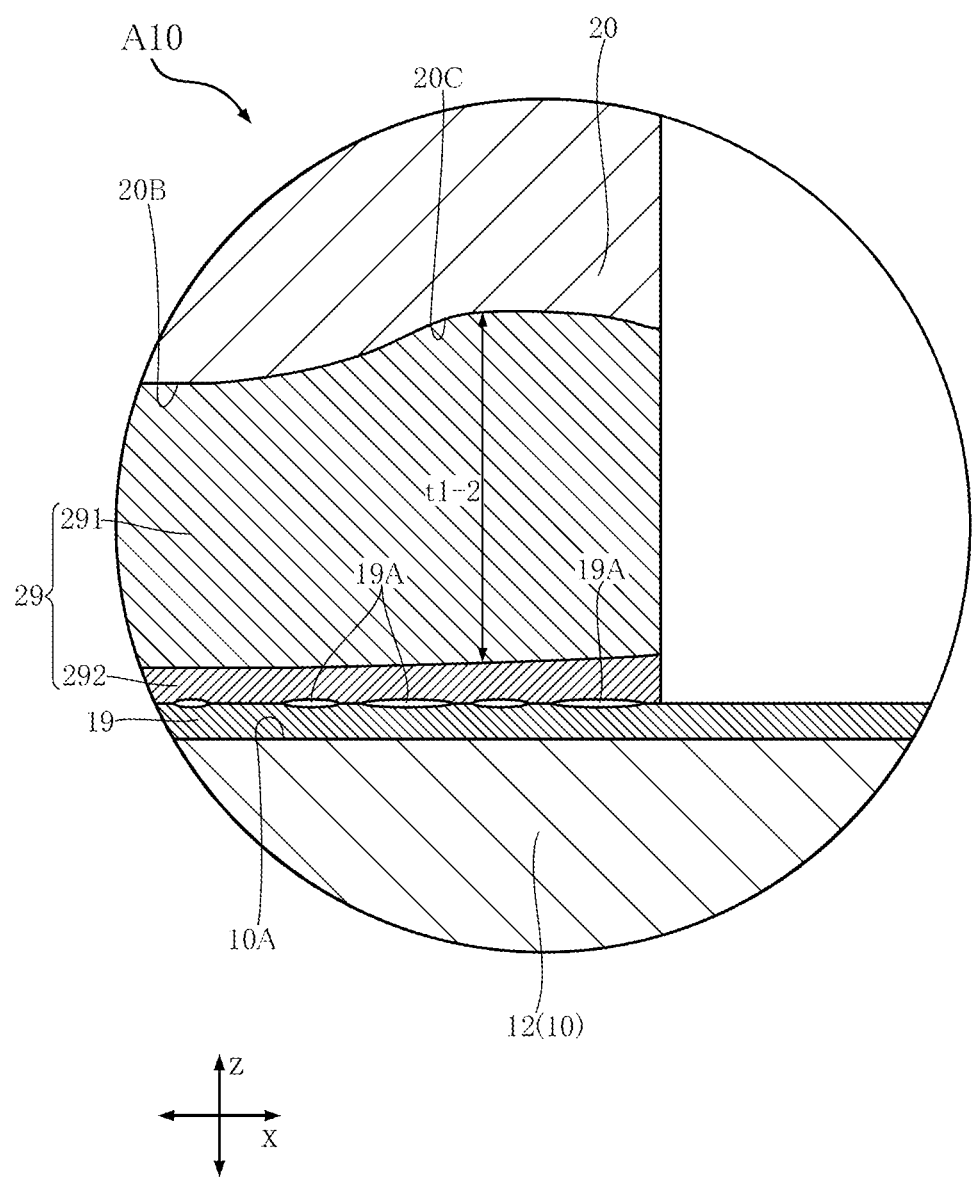
FIG. 9D is a partially enlarged view corresponding to the configuration shown in FIG. 9B, and shows the periphery portion of the second metal layer as viewed along the thickness direction.

As shown in FIG. 9B, the first metal layer 19 may be a single layer. In this case, the first metal layer 19 contains silver as its composition.

As shown in FIGS. 3, 5, and 6, the conductive member 20 is bonded to the second supporting plate 12 of the supporting member 10. In the semiconductor device A10, the conductive member 20 forms the conductive path between the outside of the semiconductor device A10 and the semiconductor element 40, along with the first terminal 31, the second terminal 32, and the conduction member 50. The conductive member 20 has an obverse surface 20A and a reverse surface 20B that are opposite to each other in the thickness direction z. The obverse surface 20A faces the same side as the supporting surface 10A of the supporting member 10 faces in the thickness direction z. The reverse surface 20B faces the supporting surface 10A of the supporting member 10. In the semiconductor device A10, the conductive member 20 is a metal plate made of copper or a copper alloy. As shown in FIG. 8, the thickness Ta of the conductive member 20 is larger than the thickness Tb of the second supporting plate 12. Note that the obverse surface 20A may be plated with silver or with a stack of various metal layers, i.e., an aluminum layer, a nickel (Ni) layer, and a silver layer, which are formed in this order.

As shown in FIGS. 3 to 5, the conductive member 20 includes a first conductive portion 201 and a second conductive portion 202. The first conductive portion 201 is bonded to the first region 121 of the second supporting plate 12. The second conductive portion 202 is bonded to the second region 122 of the second supporting plate 12. Accordingly, the first conductive portion 201 and the second conductive portion 202 are separated apart from each other in the first direction x.

As shown in FIGS. 5 and 6, the second metal layer 29 covers the reverse surface 20B of the conductive member 20 (the first conductive portion 201 and the second conductive portion 202). As shown in FIGS. 9A and 9B, the second metal layer 29 has a first layer 291 and a second layer 292. The first layer 291 covers the reverse surface 20B. The first layer 291 contains aluminum as its composition. The second layer 292 is positioned opposite to the conductive member 20 with respect to the first layer 291 in the thickness direction z, and is formed on the first layer 291. The second layer 292 contains silver as its composition. The Vickers hardness of the first layer 291 is smaller than the Vickers hardness of the second layer 292. The thickness t1 of the first layer 291 is larger than the thickness t2 of the second layer 292.

The second metal layer 29 is provided by forming the first layer 291 and the second layer 292 in this order on the reverse surface 20B of the conductive member 20. These layers may be formed by a sputtering method or a vacuum deposition method, for example.

Next, a method for bonding the supporting member 10 and the conductive member 20 will be described.

First, the first metal layer 19 that covers the supporting surface 10A of the supporting member 10 is brought into contact with the second metal layer 29 that covers the reverse surface 20B of the conductive member 20. At this point, the second layer 192 of the first metal layer 19 makes contact with the second layer 292 of the second metal layer 29. As a result, the supporting surface 10A and the reverse surface 20B face each other.

Next, the first metal layer 19 and the second metal layer 29 are bonded to each other by solid phase diffusion. In order to perform solid phase diffusion with the first metal layer 19 and the second metal layer 29, a high-temperature and high-pressure environment is required. As a condition for the solid phase diffusion, the temperature may be 350° C., and the pressure may be 40 MPa, for example. As a result, the second layer 192 of the first metal layer 19 and the second layer 292 of the second metal layer 29 are bonded to each other by solid phase diffusion. In the illustrated example, the solid phase diffusion is caused to occur in the atmosphere, though it may be caused in a vacuum. With the above process, the conductive member 20 is bonded to the supporting member 10 with the reverse surface 20B of the conductive member 20 facing the supporting surface 10A of the supporting member 10.

As shown in FIGS. 9A and 9B, gaps 19A are formed between the second layer 192 of the first metal layer 19 and the second layer 292 of the second metal layer 29. The gaps 19A are formed when the first metal layer 19 and the second metal layer 29 are bonded to each other by solid phase diffusion.

As shown in FIGS. 9C and 9D, the volume of each gap 19A per unit volume of the second layer 292 of the second metal layer 29 is different between the central portion of the second metal layer 29 as viewed along the thickness direction z and the periphery portion of the second metal layer 29 as viewed along the thickness direction z. The volume of each gap 19A per unit volume of the second layer 292 at the central portion is smaller than the volume of each gap 19A per unit volume of the second layer 292 at the periphery portion.

As shown in FIG. 9D, as viewed along the thickness direction z, the periphery portion of the conductive member 20 is formed with a recess 20C that is recessed from the reverse surface 20B in the thickness direction z. The recess 20C is in contact with the first layer 291 of the second metal layer 29. Furthermore, as shown in FIGS. 9C and 9D, the maximum thickness t1-1 of the central portion of the first layer 291 is smaller than the maximum thickness t1-2 of the periphery portion of the first layer 291, as viewed along the thickness direction z.

As shown in FIGS. 3 and 6, the insulating layer 23 is arranged on the supporting surface 10A of the third region 123 of the second supporting plate 12. The insulating layer 23 has a strip shape extending in the first direction x. One example of the material of the insulating layer 23 is ceramics or glass epoxy resin.

As shown in FIGS. 3 and 6, the gate layer 24 is arranged on the insulating layer 23. The gate layer 24 has a strip shape extending in the first direction x. The gate layer 24 is a metal foil containing copper or a copper alloy. The surface of the gate layer 24 may be silver-plated, for example.

As shown in FIGS. 3 and 6, the detection layer 25 is arranged on the insulating layer 23. The detection layer 25 has a strip shape extending in the first direction x. The detection layer 25 has a width substantially the same as the width of the gate layer 24. As viewed along the thickness direction z, the detection layer 25 is positioned between the gate layer 24 and the first conductive portion 201 in the second direction y. The detection layer 25 is a metal foil made of copper or a copper alloy. The surface of the detection layer 25 may be silver-plated, for example.

As shown in FIGS. 2, 3, and 5, the first terminal 31 is positioned on the first side in the first direction x. The first terminal 31 is connected to the first conductive portion 201. As viewed along the thickness direction z, the first terminal 31 has a strip shape extending in the first direction x. The first terminal 31 is a metal plate made of copper or a copper alloy. The first terminal 31 has a connecting portion 311 and a terminal portion 312. The connecting portion 311 is covered with the sealing resin 60. The connecting portion 311 is connected to the obverse surface 20A of the first conductive portion 201 by, for example, solder bonding or ultrasonic bonding. As a result, the first terminal 31 is electrically connected to the first conductive portion 201. The terminal portion 312 is connected to an end of the connecting portion 311 on the first side in the first direction x. The terminal portion 312 is exposed from the sealing resin 60.

As shown in FIGS. 2, 3, and 5, the second terminal 32 is positioned on the second side in the first direction x. The second terminal 32 is connected to the second conductive portion 202. As viewed along the thickness direction z, the second terminal 32 has a strip shape extending in the first direction x. The second terminal 32 is a metal plate made of e.g., copper. The second terminal 32 has a connecting portion 321 and a terminal portion 322. The connecting portion 321 is covered with the sealing resin 60. The connecting portion 321 is connected to the obverse surface 20A of the second conductive portion 202 by solder bonding or ultrasonic bonding. As a result, the second terminal 32 is electrically connected to the second conductive portion 202. The terminal portion 322 is connected to an end of the connecting portion 321 on the second side in the first direction x. The terminal portion 322 is exposed from the sealing resin 60.

As shown in FIGS. 3 and 5, the semiconductor element 40 is bonded to the obverse surface 20A of the first conductive portion 201 (conductive member 20). The semiconductor element 40 is a metal-oxide-semiconductor field-effect transistor (MOSFET) that is made of a semiconductor material that mainly contains silicon carbide (SiC), for example. Note that the semiconductor element 40 is not limited to a MOSFET, and may be a field effect transistor such as a metal-insulator-semiconductor field-effect transistor (MISFET) or a bipolar transistor such as an insulated gate bipolar transistor (IGBT). The description of the semiconductor device A10 is provided under the assumption that the semiconductor element 40 is an n-channel MOSFET having a vertical structure.

Figure 7:
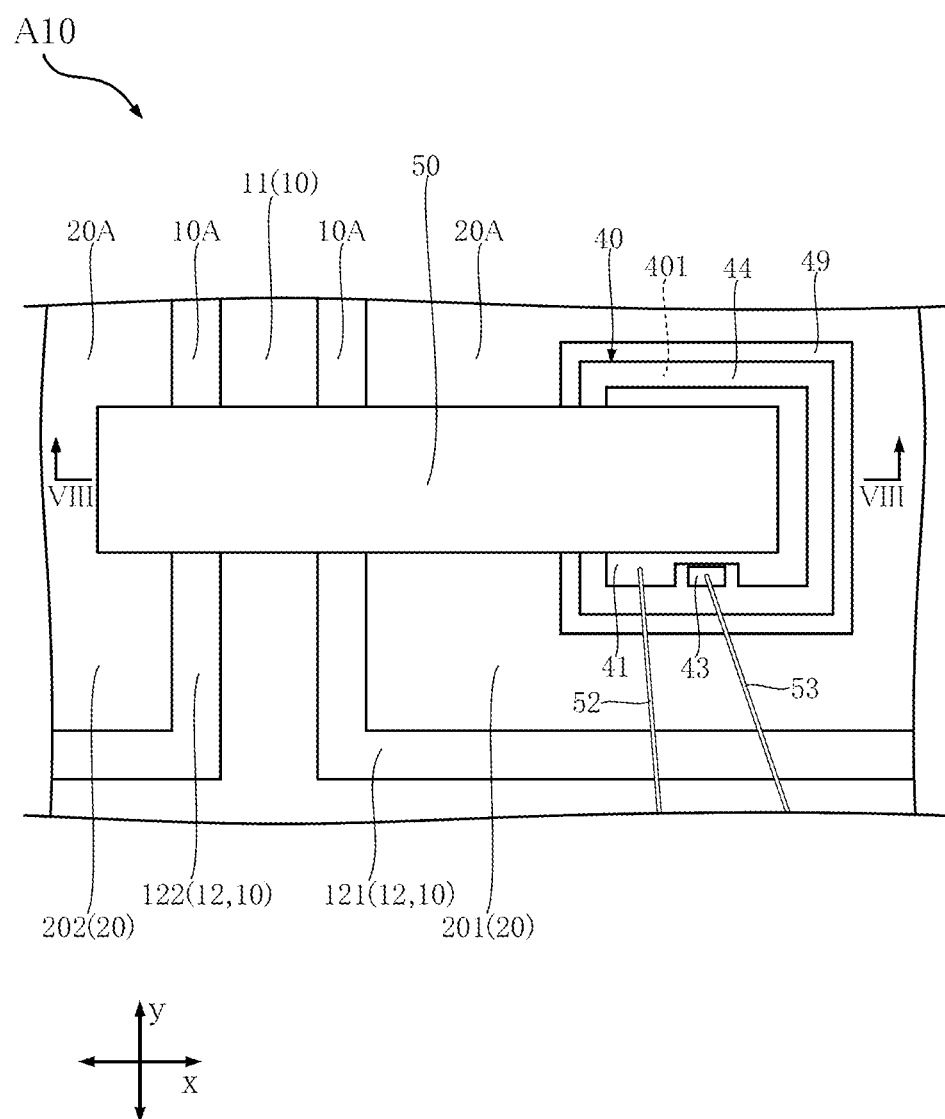
FIG. 7 is a partially enlarged view of FIG. 3.
Figure 8:
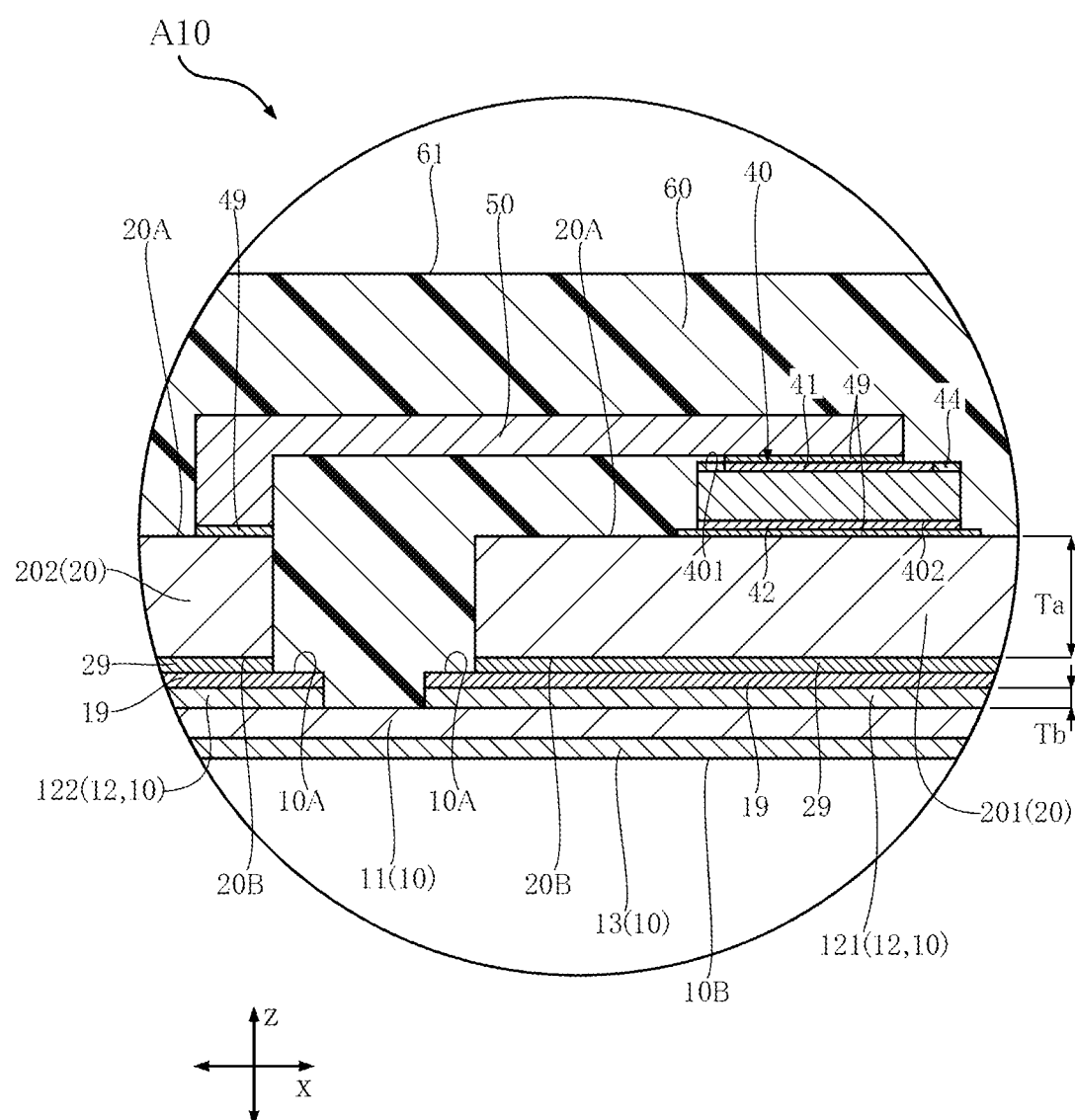
FIG. 8 is a cross-sectional view along line VIII-VIII in FIG. 7.

As shown in FIGS. 7 and 8, the semiconductor element 40 has a first surface 40A, a second surface 40B, a first electrode 41, a second electrode 42, a gate electrode 43, and an insulating film 44. The first surface 40A and the second surface 40B face away from each other in the thickness direction z. The first surface 40A faces the same side as the obverse surface 20A of the first conductive portion 201 faces in the thickness direction z. Accordingly, the second surface 40B opposes the obverse surface 20A.

As shown in FIGS. 7 and 8, the first electrode 41 is provided on the first surface 40A. A source current from within the semiconductor element 40 flows through the first electrode 41.

As shown in FIG. 8, the second electrode 42 is provided over the entirety of the second surface 40B. A drain current flows through the second electrode 42 to the inside of the semiconductor element 40. The second electrode 42 is bonded to the obverse surface 20A of the first conductive portion 201 via a bonding layer 49 having electrical conductivity. One example of the bonding layer 49 is lead-free solder that mainly contains tin (Sn), or calcined silver. As a result, the second electrode 42 is electrically connected to the first conductive portion 201. Thus, the first terminal 31 is electrically connected to the second electrode 42 via the first conductive portion 201. Accordingly, the first terminal 31 corresponds to a drain terminal of the semiconductor device A10.

As shown in FIG. 7, the gate electrode 43 is provided on the first surface 40A. A gate voltage for driving the semiconductor element 40 is applied to the gate electrode 43. The size of the gate electrode 43 is smaller than the size of the first electrode 41.

As shown in FIGS. 7 and 8, the insulating film 44 is provided on the first surface 40A. The insulating film 44 is electrically insulative. The insulating film 44 surrounds the first electrode 41 and the gate electrode 43 as viewed along the thickness direction z. The insulating film 44 is formed by stacking a silicon dioxide ($SiO_2$) layer, a silicon nitride ($Si_3N_4$) layer, and a polybenzoxazole (PBO) layer in this order on the first surface 40A. Note that the polybenzoxazole layer in the insulating film 44 may be replaced with a polyimide layer.

As shown in FIGS. 3 and 5, the conduction member 50 is connected to the first electrode 41 of the semiconductor element 40 and to the obverse surface 20A of the second conductive portion 202. As viewed along the thickness direction z, the conduction member 50 has a strip shape extending in the first direction x. The conduction member 50 is a metal lead made of copper or a copper alloy. The end of the conduction member 50 positioned on the first side in the first direction x is connected to the first electrode 41 via the bonding layer 49. The end of the conduction member 50 on the second side in the first direction x is connected to the obverse surface 20A of the second conductive portion 202 via the bonding layer 49. As a result, the first electrode 41 is electrically connected to the second conductive portion 202. Thus, the second terminal 32 is electrically connected to the first electrode 41 via the second conductive portion 202 and the conduction member 50. Accordingly, the second terminal 32 corresponds to a source terminal of the semiconductor device A10. Note that the conduction member 50 may comprise a plurality of wires. An example of the material of the plurality of wires is aluminum or an aluminum alloy.

As shown in FIG. 3, the gate wire 51 is connected to the gate electrode 43 of the semiconductor element 40 and to the gate layer 24. As a result, the gate electrode 43 is electrically connected to the gate layer 24. One example of the material of the gate wire 51 is gold (Au), aluminum, or an aluminum alloy.

As shown in FIG. 3, the detection wire 52 is connected to the first electrode 41 of the semiconductor element 40 and to the detection layer 25. As a result, the first electrode 41 is electrically connected to the detection layer 25. An example of the material of the detection wire 52 is aluminum or an aluminum alloy.

As shown in FIG. 3, the gate terminal 36 and the detection terminal 37 are adjacent to the supporting member 10 in the second direction y. The gate terminal 36 and the detection terminal 37 are arranged along the first direction x. The gate terminal 36 and the detection terminal 37 are both formed by the same lead frame.

A gate voltage for driving the semiconductor element 40 is applied to the gate terminal 36. The gate terminal 36 has a connecting portion 361 and a terminal portion 362. The connecting portion 361 is covered with the sealing resin 60. As a result, the gate terminal 36 is supported by the sealing resin 60. The surface of the connecting portion 361 may be silver-plated, for example. The terminal portion 362 is connected to the connecting portion 361 and exposed from the sealing resin 60 (see FIG. 6). The terminal portion 362 has an L shape as viewed along the first direction x.

As shown in FIG. 3, the detection terminal 37 is adjacent to the gate terminal 36 in the first direction x. The voltage applied to the first electrode 41 of the semiconductor element 40 (i.e., voltage corresponding to the source current) is detected at the detection terminal 37. The detection terminal 37 has a connecting portion 371 and a terminal portion 372. The connecting portion 371 is covered with the sealing resin 60. As a result, the detection terminal 37 is supported by the sealing resin 60. The surface of the connecting portion 371 may be silver-plated, for example. The terminal portion 372 is connected to the connecting portion 371 and exposed from the sealing resin 60 (see FIGS. 3 and 4). The terminal portion 372 has an L shape as viewed along the first direction x.

As shown in FIG. 3, the first wire 531 is connected to the connecting portion 361 of the gate terminal 36 and to the gate layer 24. As a result, the gate terminal 36 is electrically connected to the gate layer 24. Thus, the gate terminal 36 is electrically connected to the gate electrode 43 of the semiconductor element 40 via the first wire 531, the gate layer 24, and the gate wire 51. An example of the material of the first wire 531 is aluminum or an aluminum alloy.

As shown in FIG. 3, the second wire 532 is connected to the connecting portion 371 of the detection terminal 37 and to the detection layer 25. As a result, the detection terminal 37 is electrically connected to the detection layer 25. Thus, the detection terminal 37 is electrically connected to the first electrode 41 of the semiconductor element 40 via the second wire 532, the detection layer 25, and the detection wire 52. One example of the material of the second wire 532 is aluminum or an aluminum alloy.

As shown in FIG. 5, the sealing resin 60 covers the supporting member 10, respective parts of the first terminal 31 and the second terminal 32, the conductive member 20, the semiconductor element 40, and the conduction member 50. Furthermore, the sealing resin 60 covers the insulating layer 23, the gate layer 24, the detection layer 25, the gate wire 51, the detection wire 52, the first wire 531, the second wire 532, and respective parts of the gate terminal 36 and the detection terminal 37. The sealing resin 60 is made of a material containing a black epoxy resin, for example. As shown in FIGS. 2 to 6, the sealing resin 60 has a top surface 61, a bottom surface 62, and a pair of first side surfaces 63A and a pair of second side surfaces 63B.

As shown in FIGS. 5 and 6, the top surface 61 faces the same side as the supporting surface 10A of the supporting member 10 faces in the thickness direction z. The bottom surface 62 faces away from the top surface 61 in the thickness direction z. As shown in FIG. 4, the bottom surface 10B of the bottom plate 13 (supporting member 10) is exposed from the bottom surface 62. The bottom surface 62 has a frame shape surrounding the bottom plate 13.

As shown in FIG. 5, the pair of first side surfaces 63A are connected to both of the top surface 61 and the bottom surface 62, and face in the first direction x. The terminal portion 312 of the first terminal 31 is exposed from the first side surface 63A positioned on the first side in the first direction x. The terminal portion 322 of the second terminal 32 is exposed from the first side surface 63A positioned on the second side in the first direction x.

As shown in FIG. 6, the pair of second side surfaces 63B are connected to both of the top surface 61 and the bottom surface 62, and face in the second direction y. Both ends of each second side surface 63B in the first direction x are connected to the pair of first side surfaces 63A. The terminal portion 362 of the gate terminal 36 and the terminal portion 372 of the detection terminal 37 are exposed from one of the pair of second side surfaces 63B.

Variation of First Embodiment

Next, a semiconductor device A11, which is a variation of the semiconductor device A10, will be described with reference to FIGS. 10A to 10D. The semiconductor device A11 is different from the semiconductor device A10 in the configurations of the first metal layer 19 and the second metal layer 29. FIGS. 10C and 10D each show a configuration corresponding to the configuration shown in FIG. 10B, but are different in cross-sectional position.

Figure 10A:
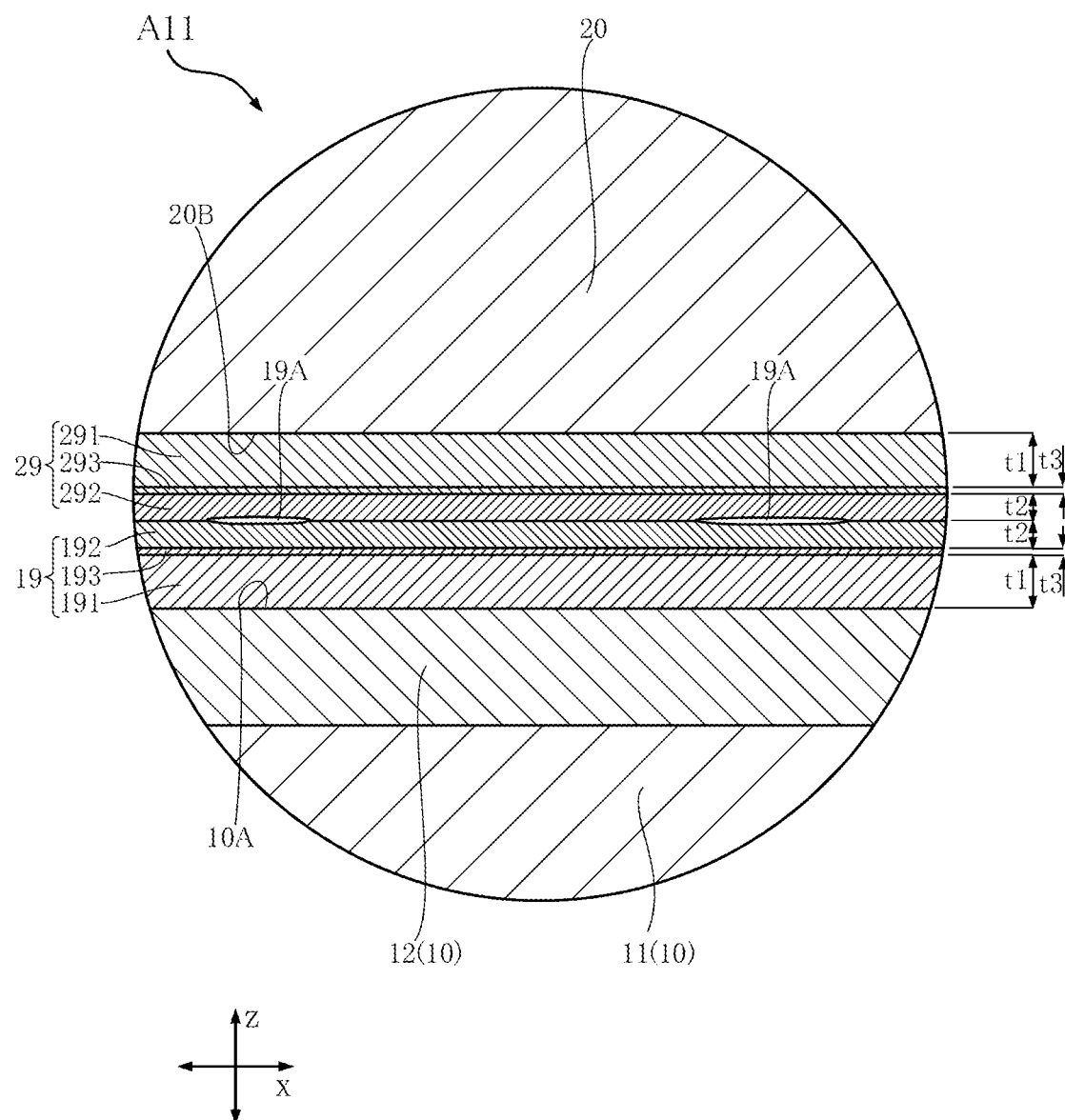
FIG. 10A is a partially enlarged cross-sectional view showing a semiconductor device according to a variation of the first embodiment of the present disclosure.

As shown in FIG. 10A, the first metal layer 19 of the semiconductor device A11 further includes a third layer 193 between the first layer 191 and the second layer 192. The third layer 193 contains nickel as its composition. The thickness t3 of the third layer 193 is smaller than each of the thickness t1 of the first layer 191 and the thickness t2 of the second layer 192.

Figure 10B:
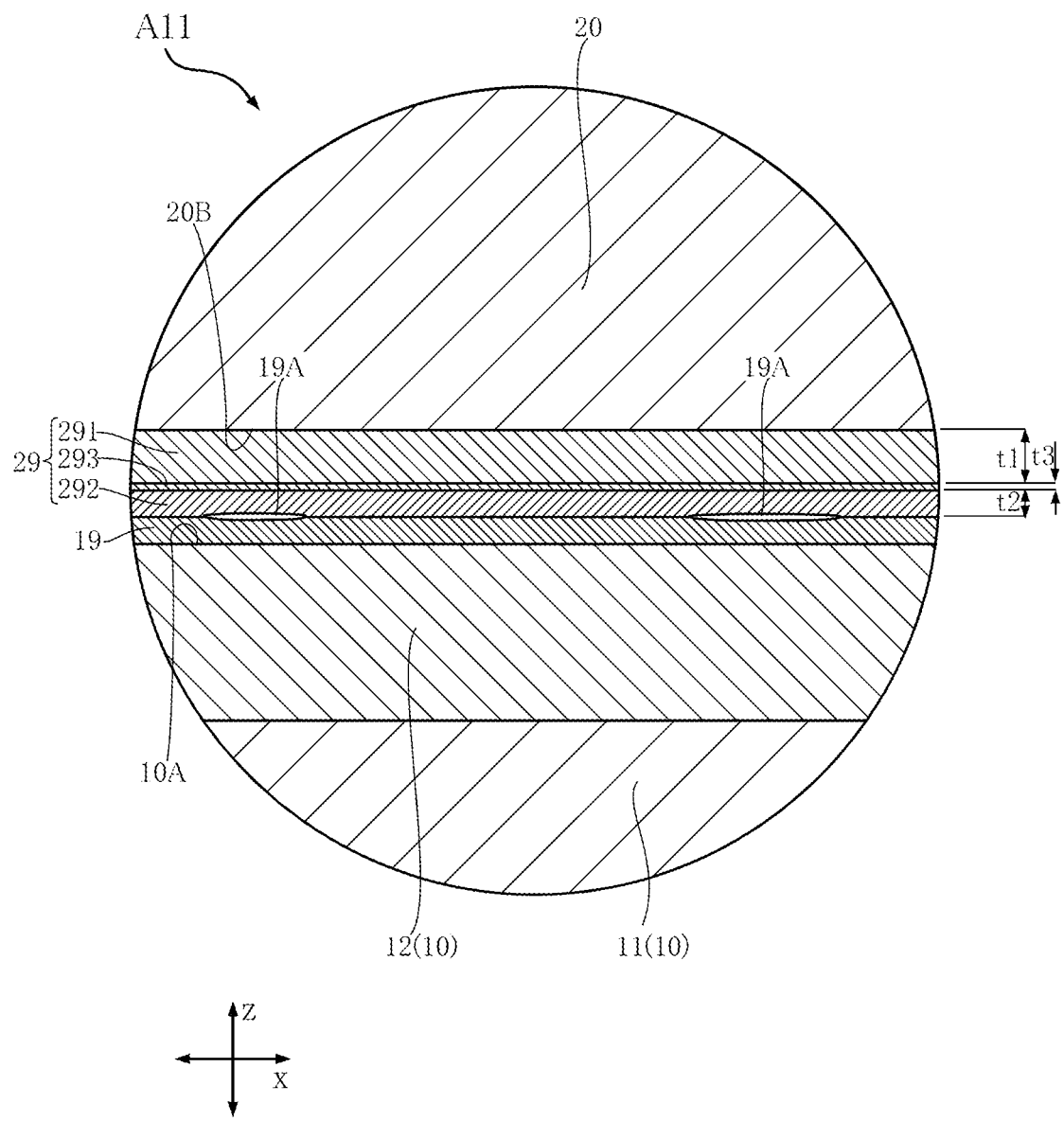
FIG. 10B is a partially enlarged cross-sectional view showing the semiconductor device according to the variation of the first embodiment of the present disclosure.
Figure 10C:
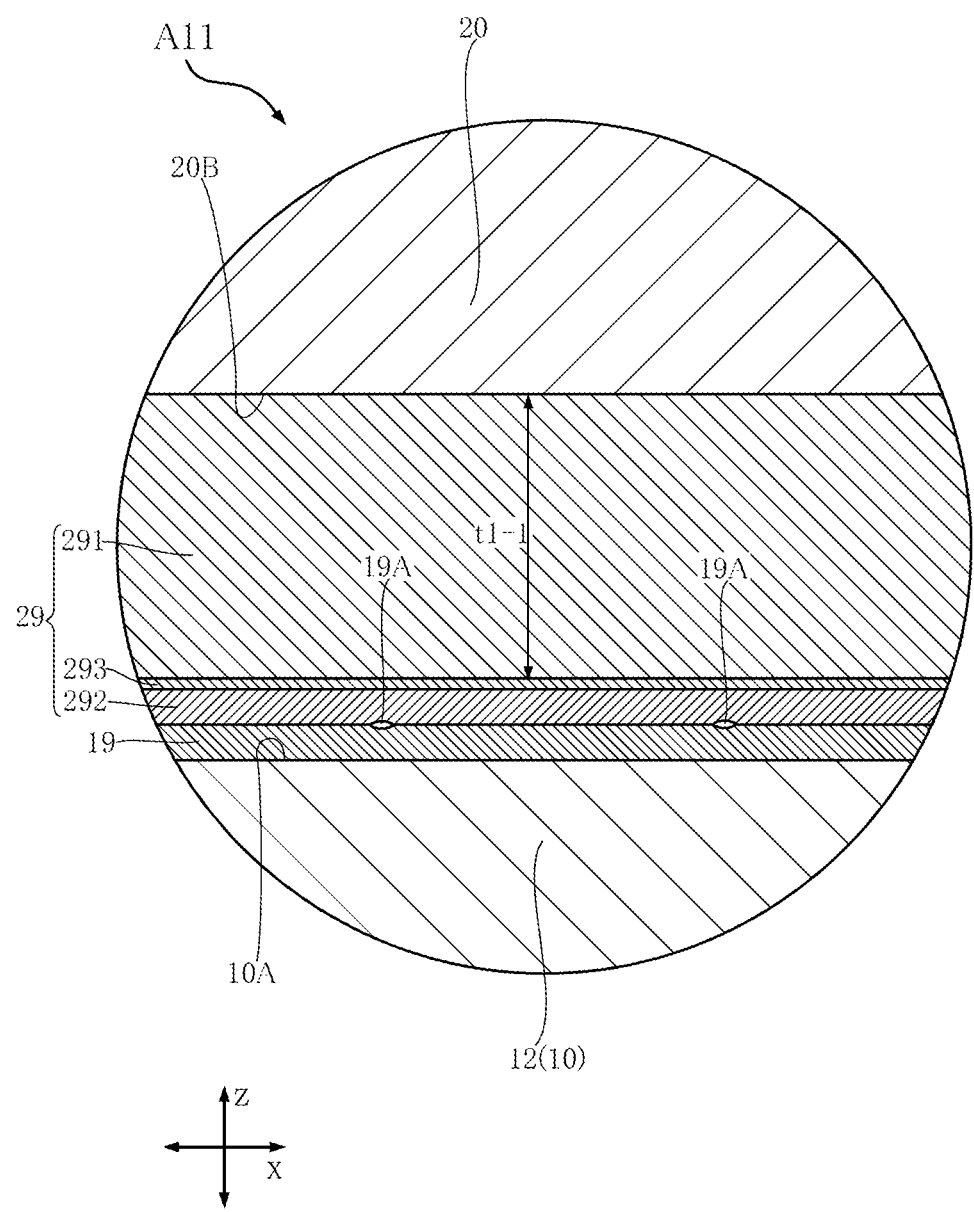
FIG. 10C is a partially enlarged view corresponding to the configuration shown in FIG. 10B, and shows the central portion of the second metal layer as viewed along the thickness direction.
Figure 10D:
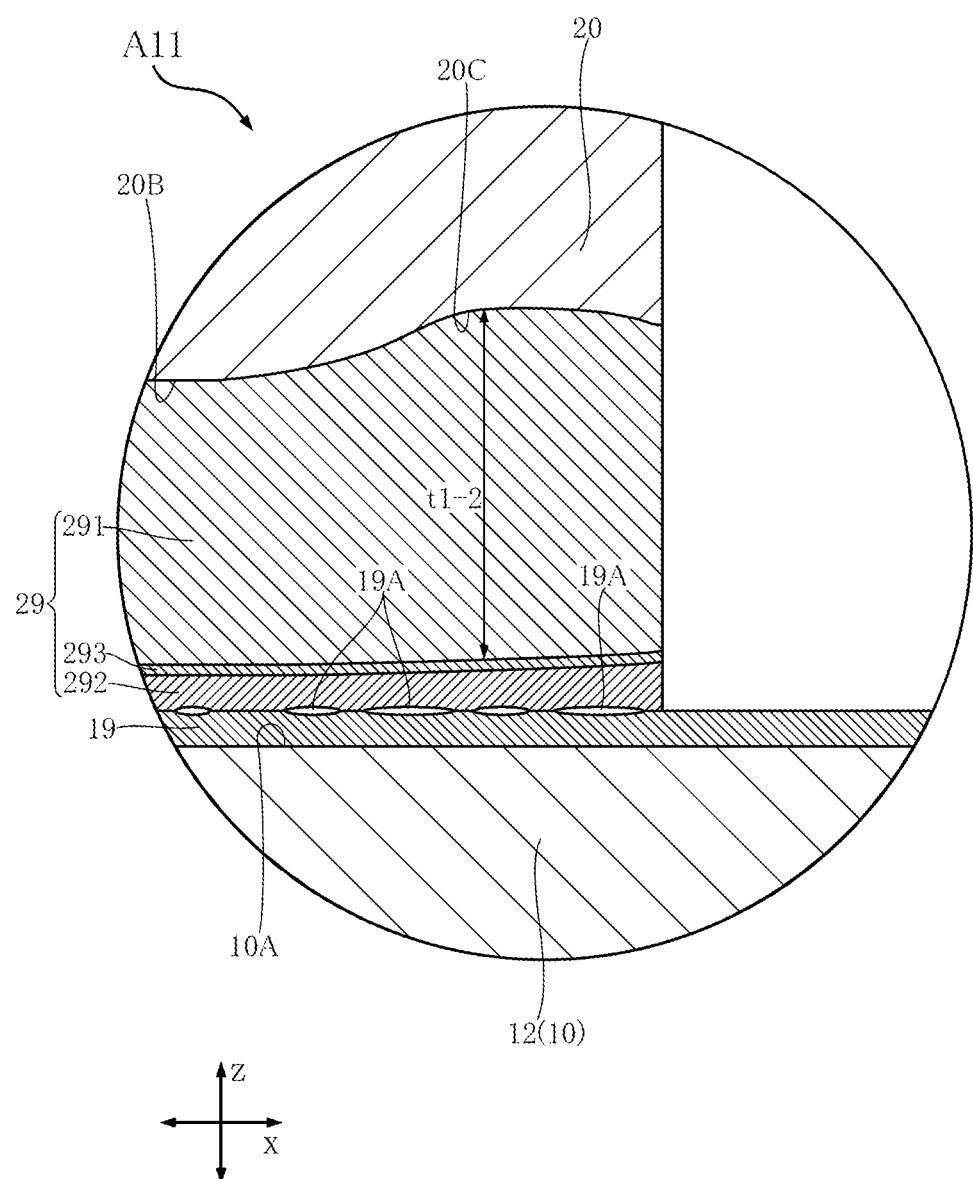
FIG. 10D is a partially enlarged view corresponding to the configuration shown in FIG. 10B, and shows the periphery portion of the second metal layer as viewed along the thickness direction.

As shown in FIG. 10B, the first metal layer 19 may be a single layer as in the case of the semiconductor device A10 shown in FIG. 9B. In this case, the first metal layer 19 contains silver as its composition.

As shown in FIGS. 10A and 10B, the second metal layer 29 of the semiconductor device A11 further includes a third layer 293 between the first layer 291 and the second layer 292. The third layer 293 contains nickel as its composition. The thickness t3 of the third layer 293 is smaller than each of the thickness t1 of the first layer 291 and the thickness t2 of the second layer 292.

The first metal layer 19 of the semiconductor device A11 is provided by forming the first layer 191, the third layer 193, and the second layer 192 in this order on the supporting surface 10A of the supporting member 10. Similarly, the second metal layer 29 of the semiconductor device A11 is provided by forming the first layer 291, the third layer 293, and the second layer 292 in this order on the reverse surface 20B of the conductive member 20. In the semiconductor device A11, the conductive member 20 is also similarly bonded to the supporting member 10 as a result of bonding between the second layer 192 of the first metal layer 19 and the second layer 292 of the second metal layer 29 by solid phase diffusion.

As shown in FIGS. 10C and 10D, the volume of each gap 19A per unit volume of the second layer 292 of the second metal layer 29 is different between the central portion of the second metal layer 29 as viewed along the thickness direction z and the periphery portion of the second metal layer 29 as viewed along the thickness direction z. The volume of each gap 19A per unit volume of the second layer 292 at the central portion is smaller than the volume of each gap 19A per unit volume of the second layer 292 at the periphery portion.

As shown in FIG. 10D, as viewed along the thickness direction z, the periphery portion of the conductive member 20 is formed with a recess 20C that is recessed from the reverse surface 20B in the thickness direction z. The recess 20C is in contact with the first layer 291 of the second metal layer 29. Furthermore, as shown in FIGS. 10C and 10D, the maximum thickness t1-1 of the central portion of the first layer 291 is smaller than the maximum thickness t1-2 of the periphery portion of the first layer 291, as viewed along the thickness direction z.

The following describes advantages of the semiconductor device A10.

The semiconductor device A10 includes the first metal layer 19 and the second metal layer 29. The first metal layer 19 covers at least a part of the supporting surface 10A of the supporting member 10. The second metal layer 29 covers the reverse surface 20B of the conductive member 20. The first metal layer 19 and the second metal layer 29 are bonded to each other by solid phase diffusion. In this way, the thickness of the conductive member 20 can be made larger than the thickness of a conventional metal foil. This makes it possible to reduce the heat resistance of the conductive member 20 per unit length in a direction perpendicular to the thickness direction z. As a result, the heat generated from the semiconductor element 40 is less likely to concentrate locally in the conductive member 20, allowing the heat to be transmitted more easily in a wider area. Furthermore, since the first metal layer 19 and the second metal layer 29 are bonded to each other by solid phase diffusion, the semiconductor device A10 is prevented from a decrease in thermal conductivity in the thickness direction z. This allows the semiconductor device A10 to have an improved heat dissipation property.

As shown in FIGS. 9A and 9B, the second metal layer 29 has the first layer 291 covering the reverse surface 20B of the conductive member 20, and the second layer 292 positioned opposite to the conductive member 20 with respect to the first layer 291 in the thickness direction z. The second layer 192 of the first metal layer 19 and the second layer 292 are bonded to each other by solid phase diffusion. The Vickers hardness of the first layer 291 is smaller than the Vickers hardness of the second layer 292. In addition, the thickness t1 of the first layer 291 of the second metal layer 29 is larger than the thickness t2 of the second layer 292 of the second metal layer 29. As such, when the first metal layer 19 and the second metal layer 29 are bonded to each other by solid phase diffusion, the stress acting on the first metal layer 19 and the second metal layer 29 from the supporting member 10 and the conductive member 20 can be alleviated. This reduces the residual stress accumulated in the first metal layer 19 and the second metal layer 29 that are bonded by solid phase diffusion, which aids in suppressing cracks from occurring in the first metal layer 19 and the second metal layer 29 during the use of the semiconductor device A10.

In the semiconductor device A10, the supporting member 10 has the first supporting plate 11 that is electrically insulative, and the second supporting plate 12 having the supporting surface 10A and formed on the first supporting plate 11. The conductive member 20 is a metal plate. The conductive member 20 is thicker than the second supporting plate 12. This makes it possible to reduce the heat resistance of the conductive member 20 per unit length in a direction perpendicular to the thickness direction z.

The supporting member 10 has the bottom surface 10B opposite to the supporting surface 10A. The semiconductor device A10 further includes the sealing resin 60 covering the conductive member 20, the semiconductor element 40, and a part of the supporting member 10. The bottom surface 10B is exposed from the sealing resin 60. This improves the heat dissipation property of the semiconductor device A10. Furthermore, the supporting member 10 is provided with the step 13A surrounding the bottom plate 13 of the supporting member 10 as viewed along the thickness direction z. The step 13A is covered with the sealing resin 60. This prevents the supporting member 10 from dropped from the sealing resin 60 even in the state where the bottom surface 10B is exposed from the sealing resin 60.

Second Embodiment

Figure 11:
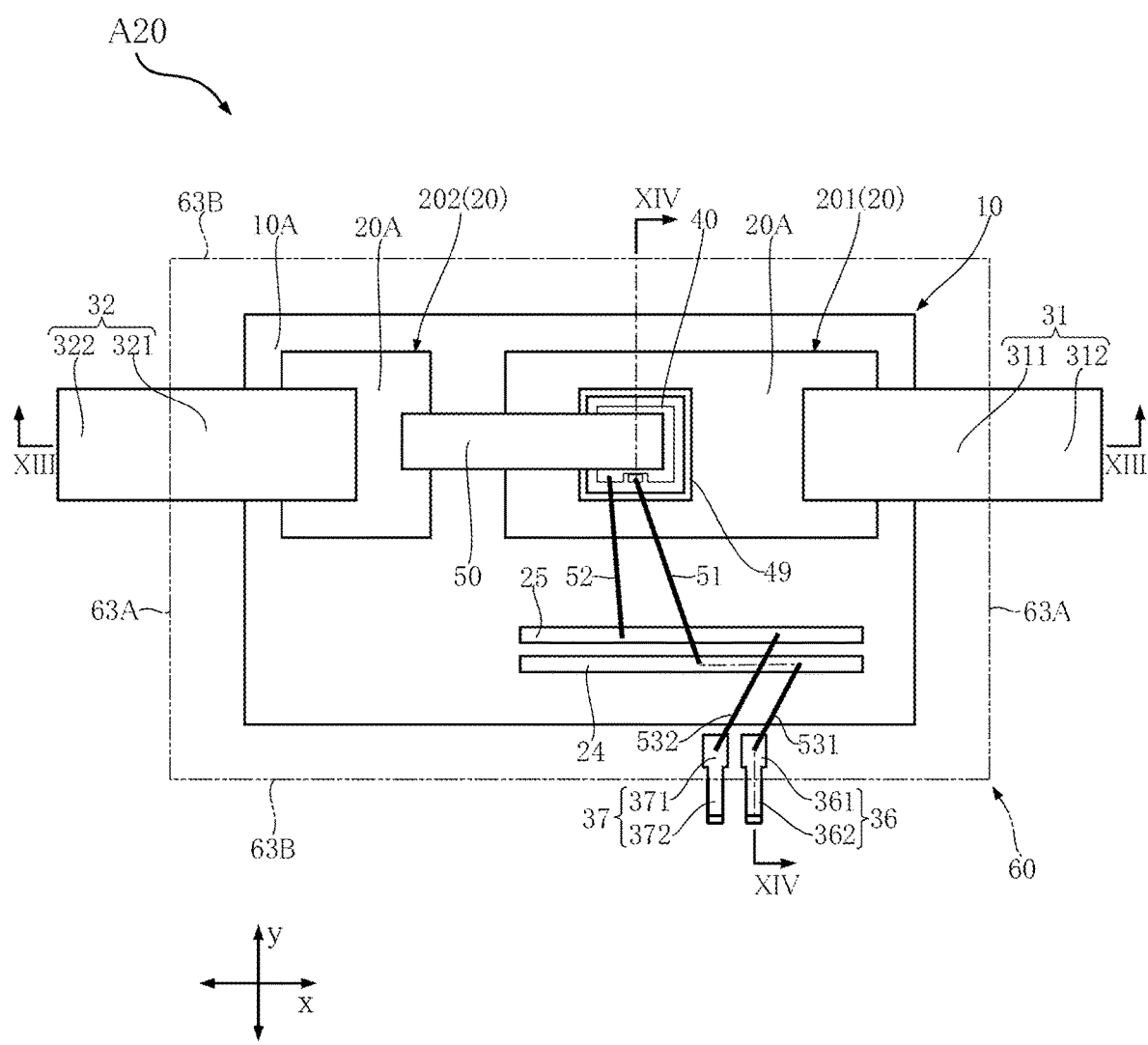
FIG. 11 is a plan view showing a semiconductor device according to a second embodiment of the present disclosure, with the sealing resin shown in phantom.
Figure 12:
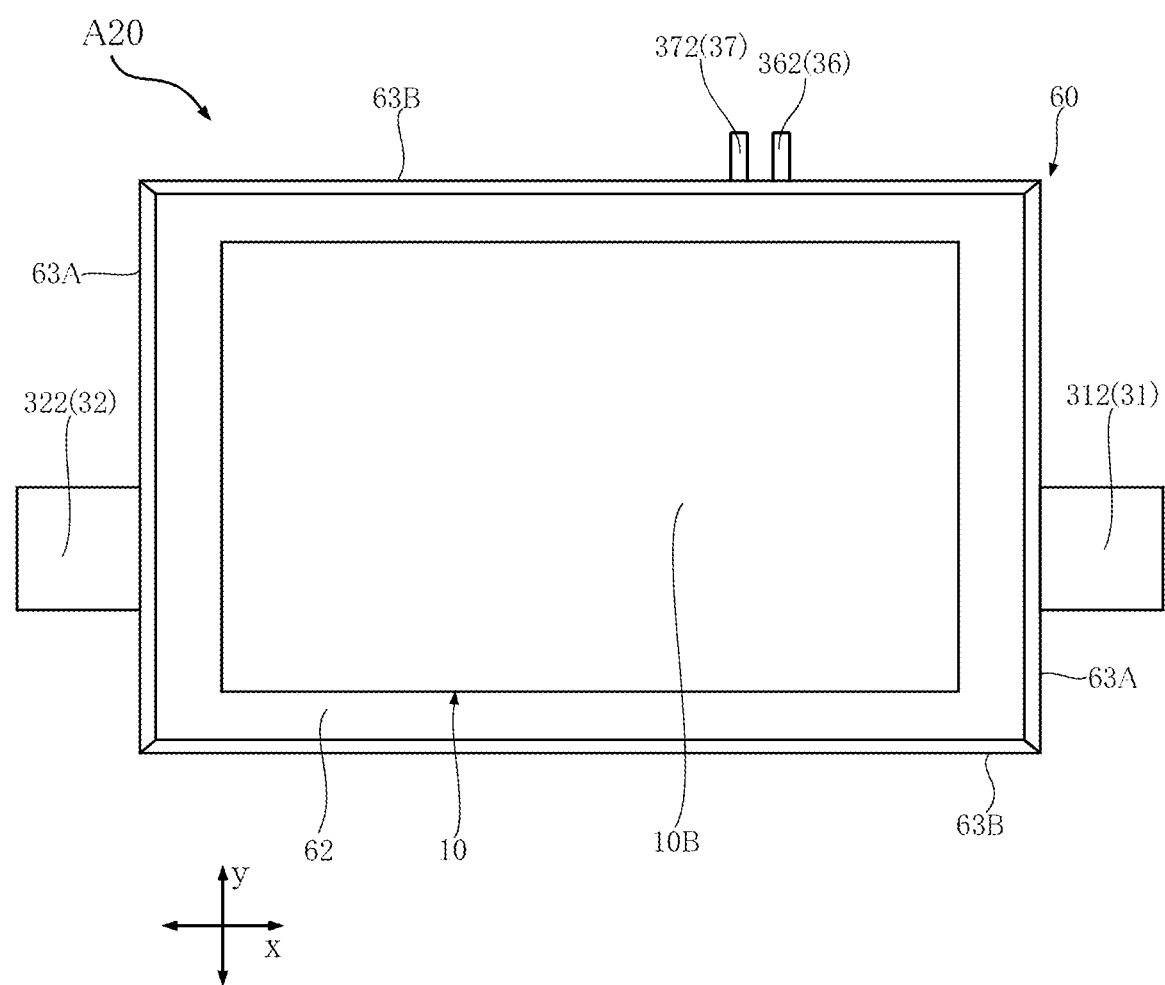
FIG. 12 is a bottom view showing the semiconductor device of FIG. 11.

A semiconductor device A20 according to a second embodiment of the present disclosure will be described with reference to FIGS. 11 to 17. In these figures, elements that are identical or similar to the elements of the semiconductor device A10 are provided with the same reference signs, and descriptions thereof are omitted. FIG. 11 shows the sealing resin 60 in phantom for convenience of understanding. The sealing resin 60 shown in phantom is indicated by an imaginary line.

The semiconductor device A20 is different from the semiconductor device A10 in the configurations of the supporting member 10 and the conductive member 20.

Figure 13:
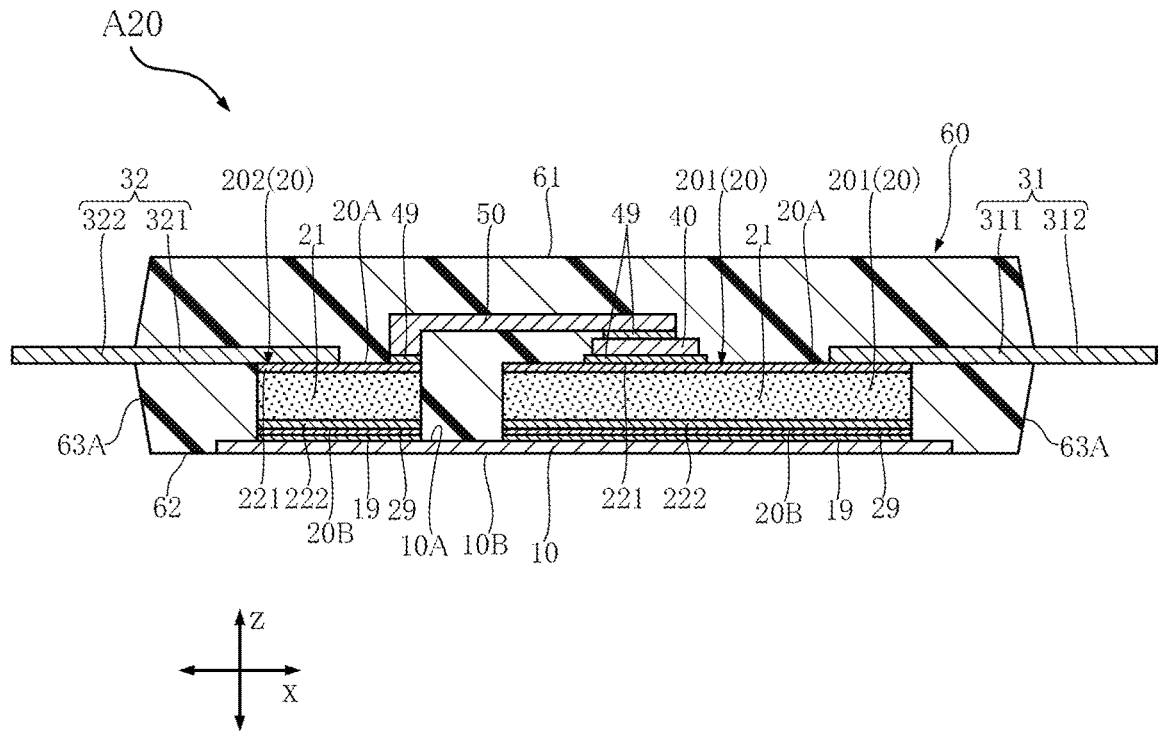
FIG. 13 is a cross-sectional view along line XIII-XIII in FIG. 11.

In the semiconductor device A20, the supporting member 10 is an insulating plate. As shown in FIGS. 11 to 14, the insulating plate includes a supporting surface 10A and a bottom surface 10B. Accordingly, the supporting member 10 is not provided with the step 13A, unlike the supporting member 10 of the semiconductor device A10. The insulating plate is made of a ceramic material having excellent thermal conductivity. An example of the ceramic material is aluminum nitride (AlN). As shown in FIG. 13, the supporting surface 10A of the supporting member 10 has areas that overlap with the conductive member 20 as viewed along the thickness direction z, and the first metal layer 19 covers the areas of the supporting surface 10A.

Figure 14:
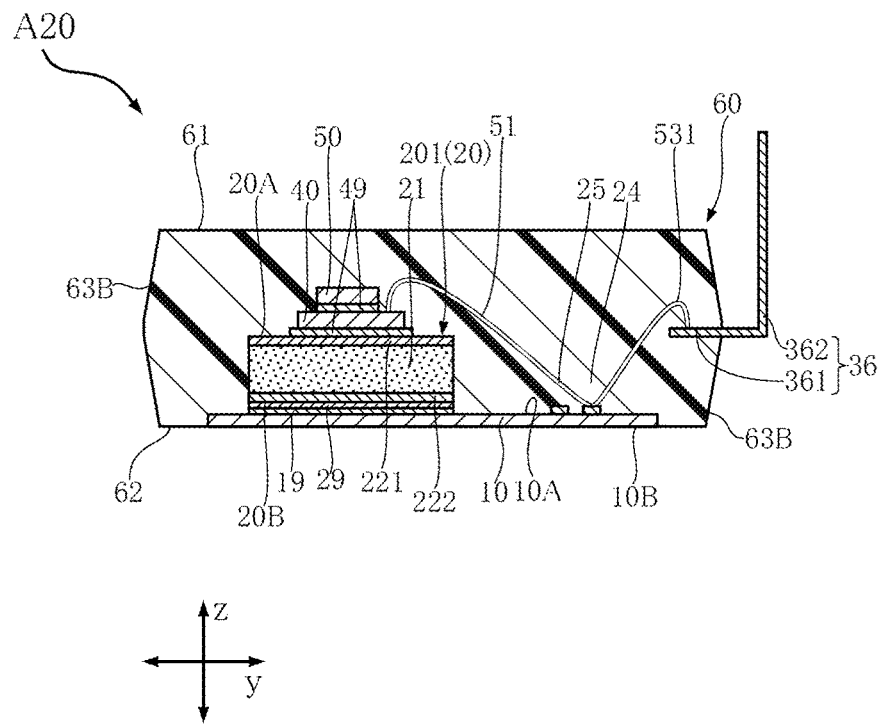
FIG. 14 is a cross-sectional view along line XIV-XIV in FIG. 11.
Figure 15:
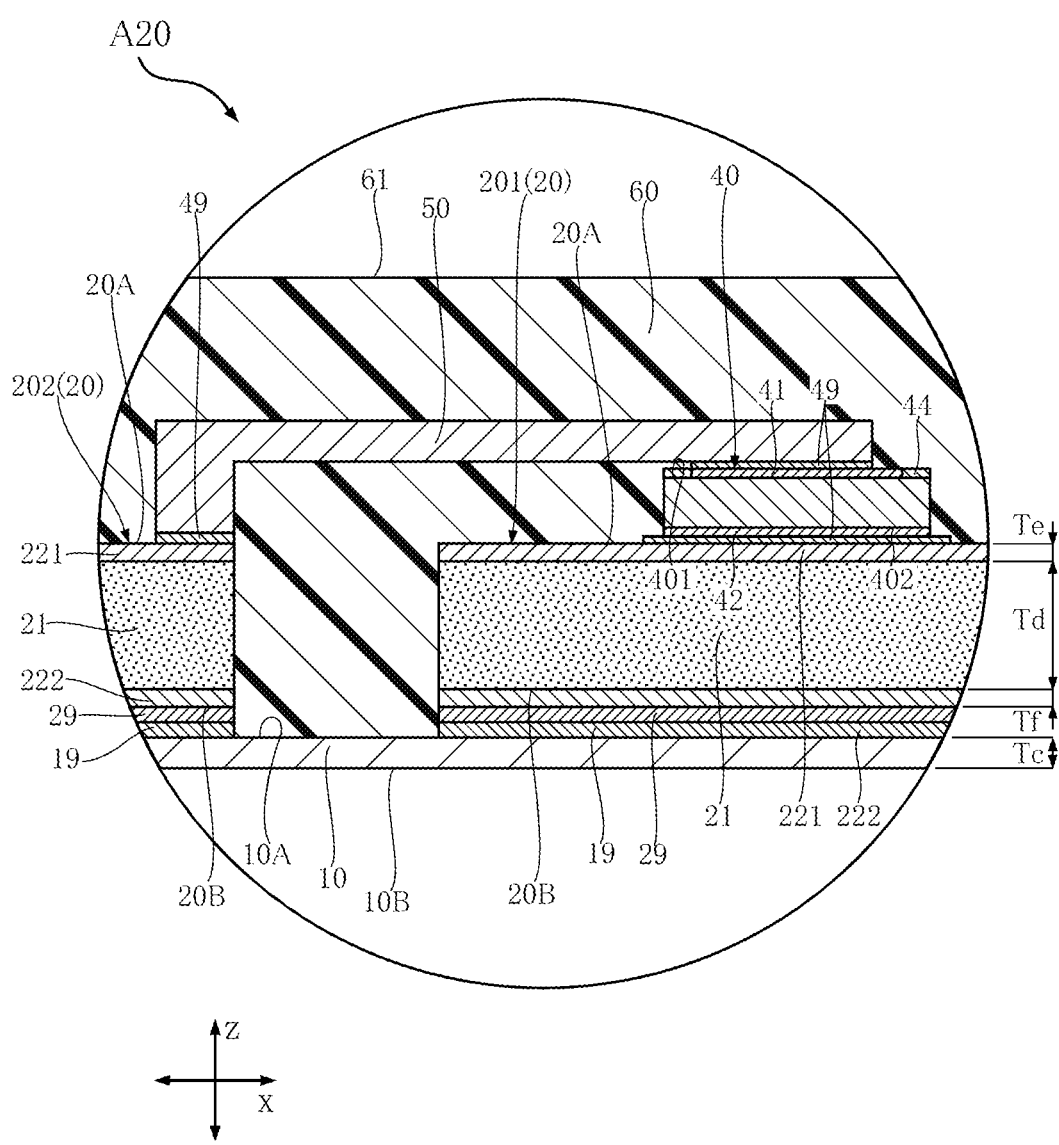
FIG. 15 is a partially enlarged view of FIG. 13.
Figure 16:
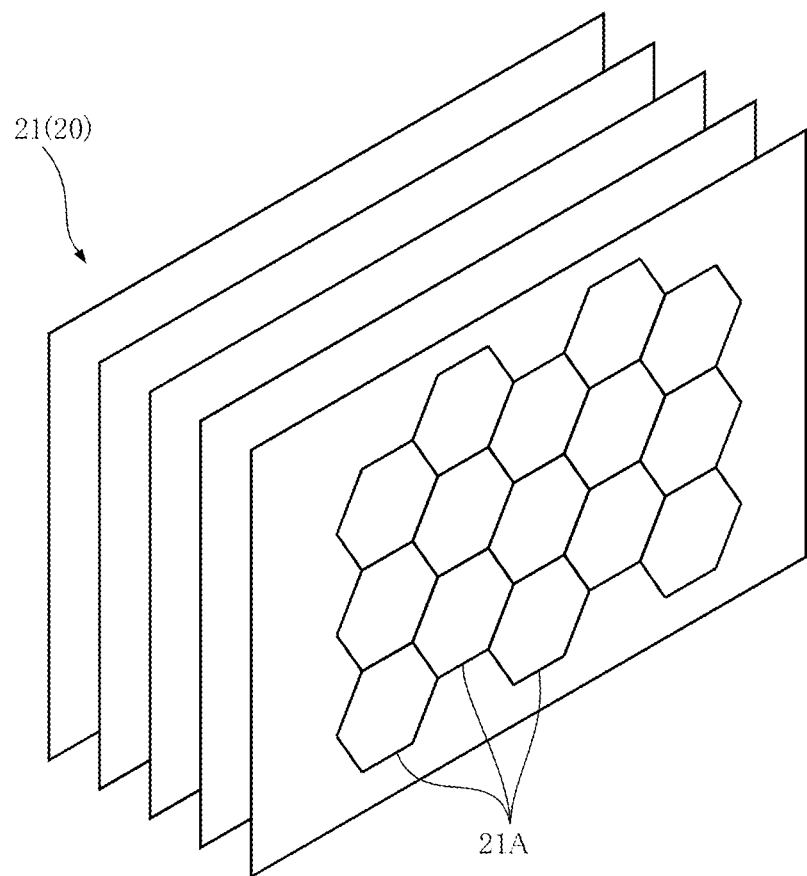
FIG. 16 is a schematic view showing the crystal configuration of graphite that constitutes a base layer of a conductive member in the semiconductor device shown in FIG. 11.

As shown in FIGS. 13 and 14, the conductive member 20 includes a base layer 21, a first wiring layer 221, and a second wiring layer 222. The base layer 21 occupies most of the volume of the conductive member 20. The base layer 21 contains carbon as its composition. In the semiconductor device A20, the base layer 21 is made of graphite. Alternatively, the base layer 21 may be made of carbon fiber reinforced plastic (CFRP). As shown in FIG. 16, the in-plane direction of the graphite, which is the direction in which graphite crystals 21A continue, is along the direction z or x. The out-of-plane direction of the graphite, which is the direction in which the graphite crystals 21A are stacked, is along a direction perpendicular to the thickness direction z. In the example of the semiconductor device A20, the out-of-plane direction of the graphite is the second direction y. Accordingly, the Young's modulus of the base layer 21 in the in-plane direction, i.e., in the thickness direction z, can be four times or more of the Young's modulus of copper (1000 GPa or more). The Young's modulus of the base layer 21 in the out-of-plane direction is 30 to 40 GPa. As shown in FIG. 15, the thickness Td of the base layer 21 is larger than the thickness Tc of the supporting member 10.

As shown in FIGS. 13 and 14, the first wiring layer 221 includes an obverse surface 20A and is formed on the base layer 21. The second wiring layer 222 includes a reverse surface 20B, and is formed on the base layer 21. Accordingly, the base layer 21 is positioned between the first wiring layer 221 and the second wiring layer 222. The first wiring layer 221 and the second wiring layer 222 are metal foils made of copper or a copper alloy. As shown in FIG. 15, the thickness Te of the first wiring layer 221 and the thickness Tf of the second wiring layer 222 are each smaller than the thickness Td of the base layer 21. In the conductive member 20, the second wiring layer 222, the base layer 21, and the first wiring layer 221 are formed in this order from the reverse surface 20B to the obverse surface 20A.

Figure 17:
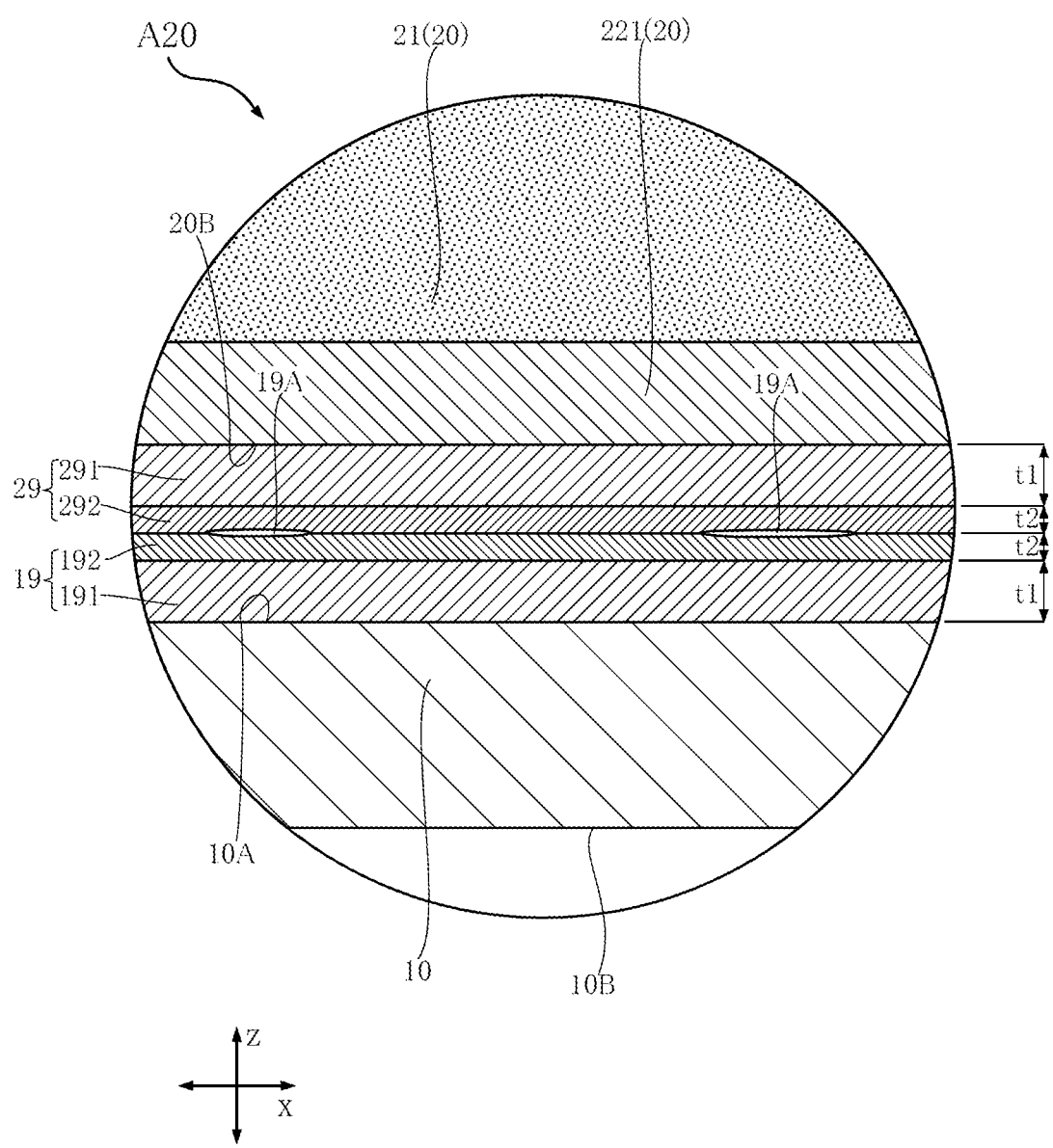
FIG. 17 is a partially enlarged view of FIG. 15.

As shown in FIG. 17, the first metal layer 19 and the second metal layer 29 have the same configurations as those in the semiconductor device A10 (see FIG. 9A).

The following describes advantages of the semiconductor device A20.

The semiconductor device A20 includes the first metal layer 19 and the second metal layer 29. The first metal layer 19 covers at least a part of the supporting surface 10A of the supporting member 10. The second metal layer 29 covers the reverse surface 20B of the conductive member 20. The first metal layer 19 and the second metal layer 29 are bonded to each other by solid phase diffusion. This allows the semiconductor device A20 to have an improved heat dissipation property.

In the semiconductor device A20, the supporting member 10 is an insulating plate. The conductive member 20 includes the first wiring layer 221 having the obverse surface 20A, the second wiring layer 222 having the reverse surface 20B, and the base layer 21 between the first wiring layer 221 and the second wiring layer 222. The base layer 21 is made of graphite. The in-plane direction of the graphite is along the thickness direction z. The base layer 21 is thicker than the supporting member 10. This makes it possible to reduce the heat resistance of the conductive member 20 per unit length in the thickness direction z, as well as in a direction perpendicular to the thickness direction z (first direction x in the example of the semiconductor device A20). The thermal conductivity of the graphite in the in-plane direction is approximately four times as large as the thermal conductivity of copper (398 W/(m·K)). This makes it possible to further improve the heat dissipation property of the semiconductor device A20 as compared to the semiconductor device A10.

The density of the base layer 21 made of graphite is approximately ¼ of the density of copper (8.92 g/cm$^3$). As such, the semiconductor device A20 can be more lightweight than the semiconductor device A10.

Third Embodiment

Figure 18:
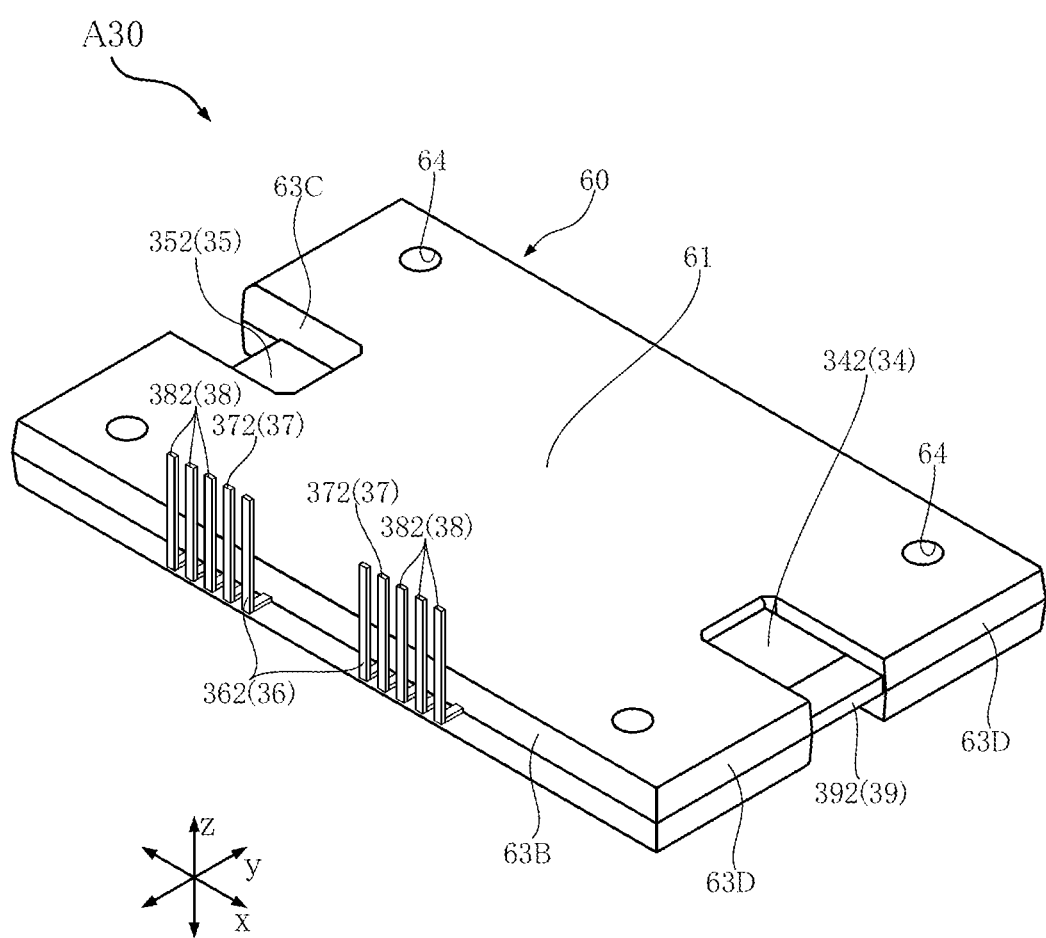
FIG. 18 is a perspective view showing a semiconductor device according to a third embodiment of the present disclosure.
Figure 19:
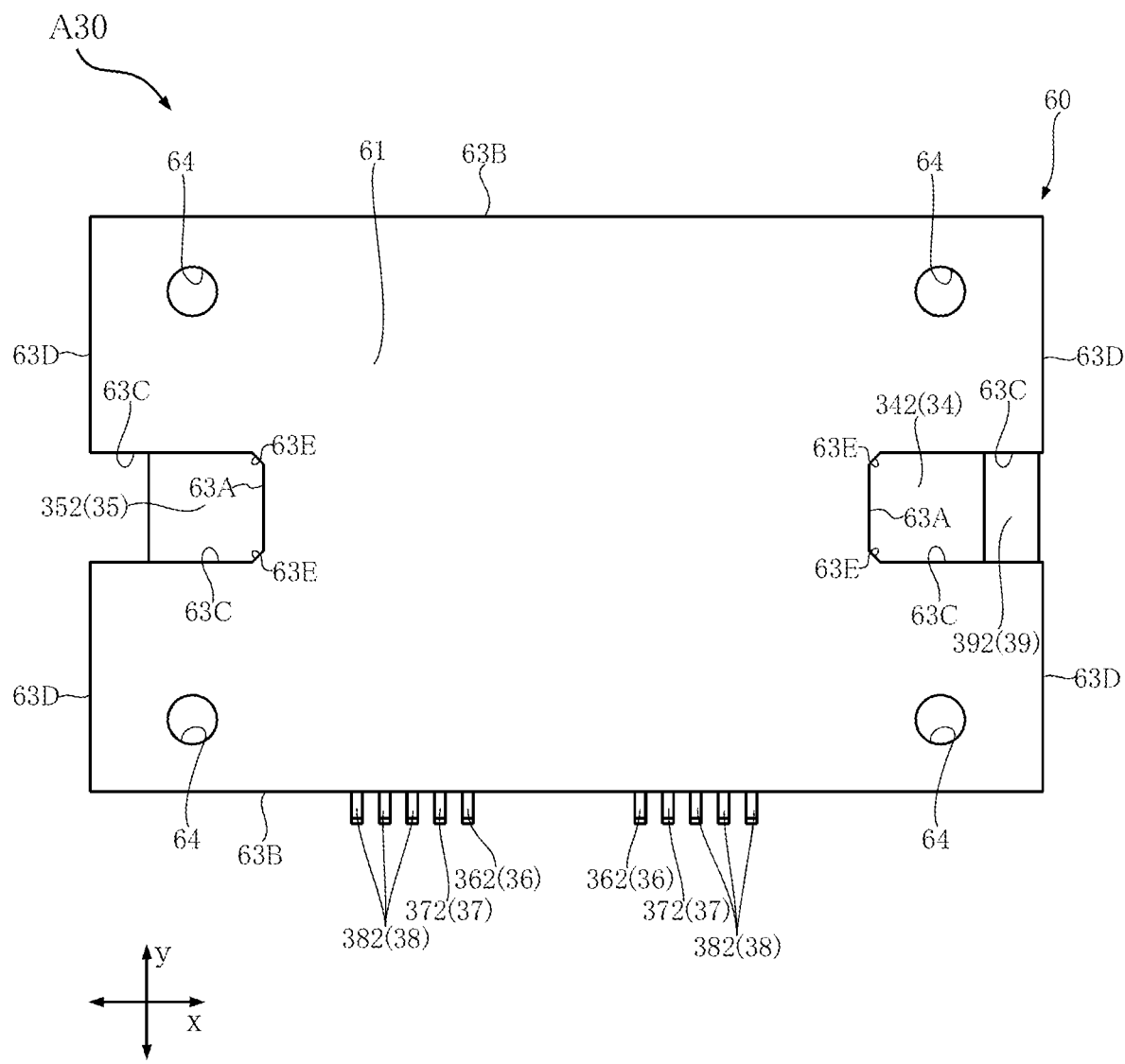
FIG. 19 is a plan view showing the semiconductor device of FIG. 18.
Figure 20:
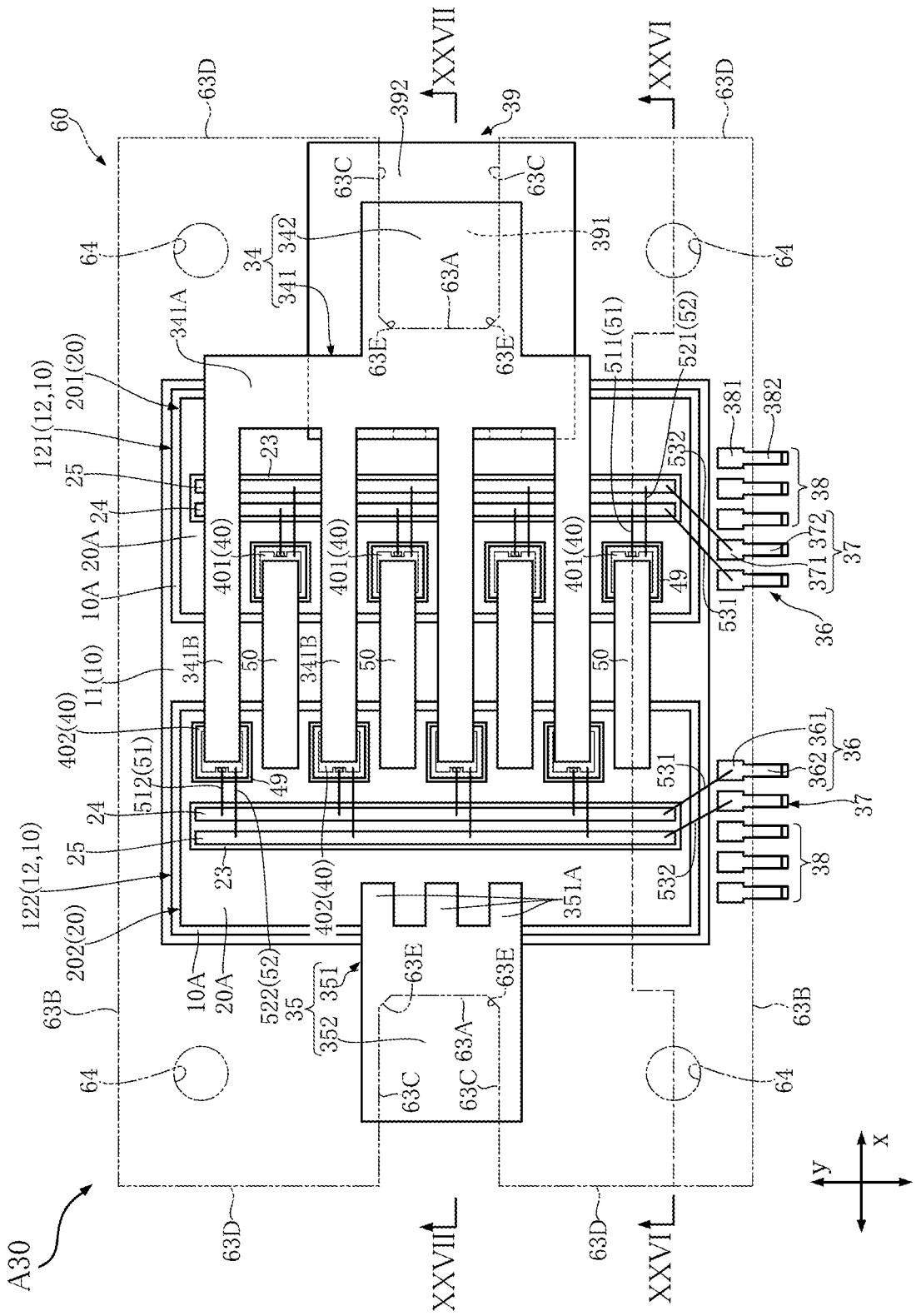
FIG. 20 is a plan view corresponding to FIG. 19 and showing a sealing resin in phantom.
Figure 21:
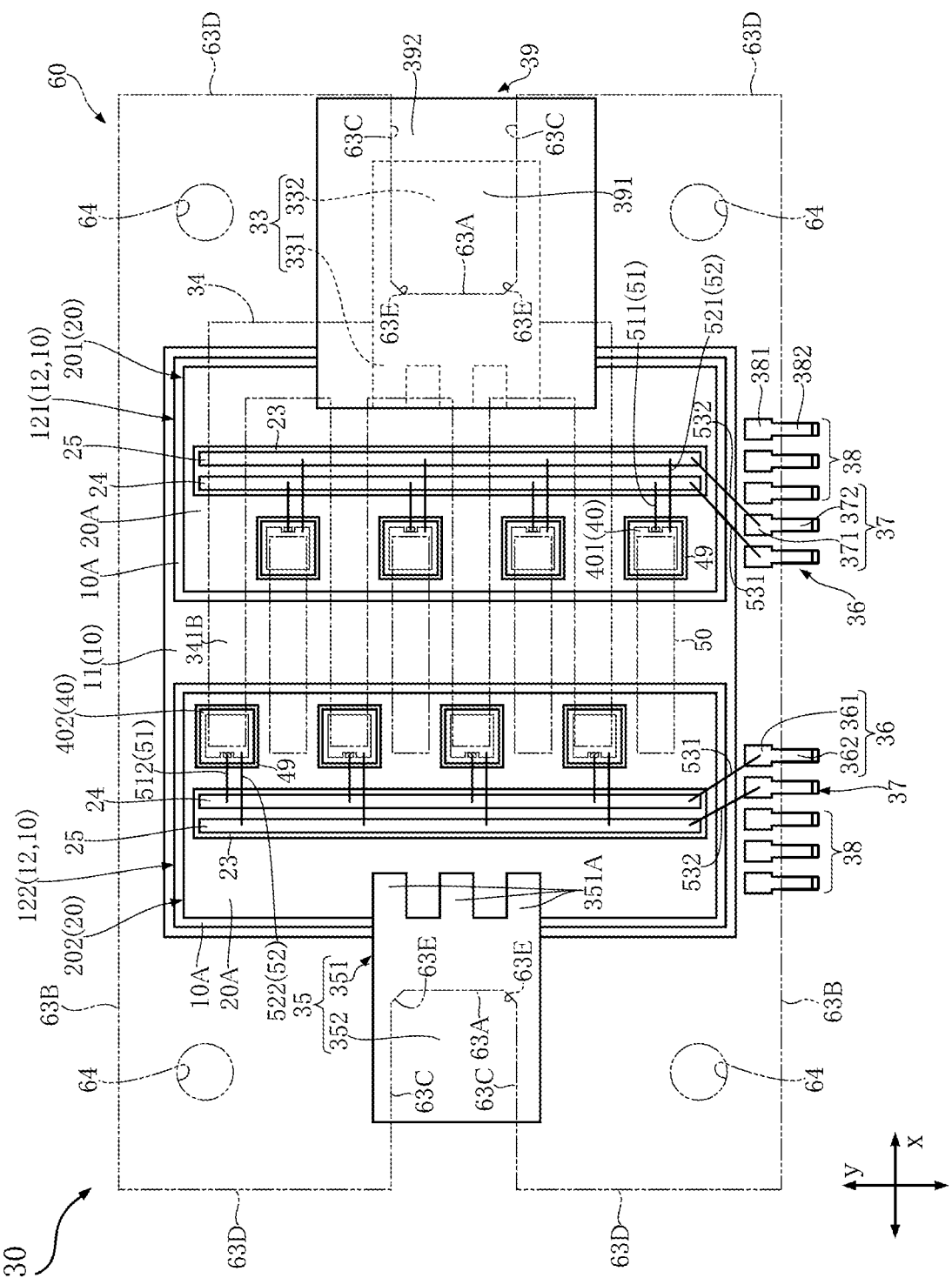
FIG. 21 is a plan view showing the semiconductor device in FIG. 20 but shows a second input terminal and a plurality of conduction members in phantom.

A semiconductor device A30 according to a third embodiment of the present disclosure will be described with reference to FIGS. 18 to 29. In these figures, elements that are identical or similar to the elements of the semiconductor device A10 are provided with the same reference signs, and descriptions thereof are omitted. FIG. 20 shows the sealing resin 60 in phantom for convenience of understanding. FIG. 21 corresponds to FIG. 20 but shows a second input terminal 34 and a plurality of conduction members 50 in phantom for convenience of understanding. In FIGS. 20 and 21, these elements are indicated by imaginary lines.

The semiconductor device A30 includes a supporting member 10, a first metal layer 19, a conductive member 20, a second metal layer 29, a first input terminal 33, a second input terminal 34, an output terminal 35, an insulating member 39, a plurality of semiconductor elements 40, a plurality of conduction members 50, and a sealing resin 60. The semiconductor device A30 further includes a pair of insulating layers 23, a pair of gate layers 24, a pair of detection layers 25, a pair of gate terminals 36, a pair of detection terminals 37, a plurality of dummy terminals 38, a plurality of gate wires 51, a plurality of detection wires 52, a pair of first wires 531, and a pair of second wires 532. The semiconductor device A30 is different from the semiconductor device A10 in the configurations except for the first metal layer 19, the conductive member 20, and the second metal layer 29. As shown in FIGS. 18 and 19, the semiconductor device A30 has a rectangular shape as viewed along the thickness direction z.

Figure 26:
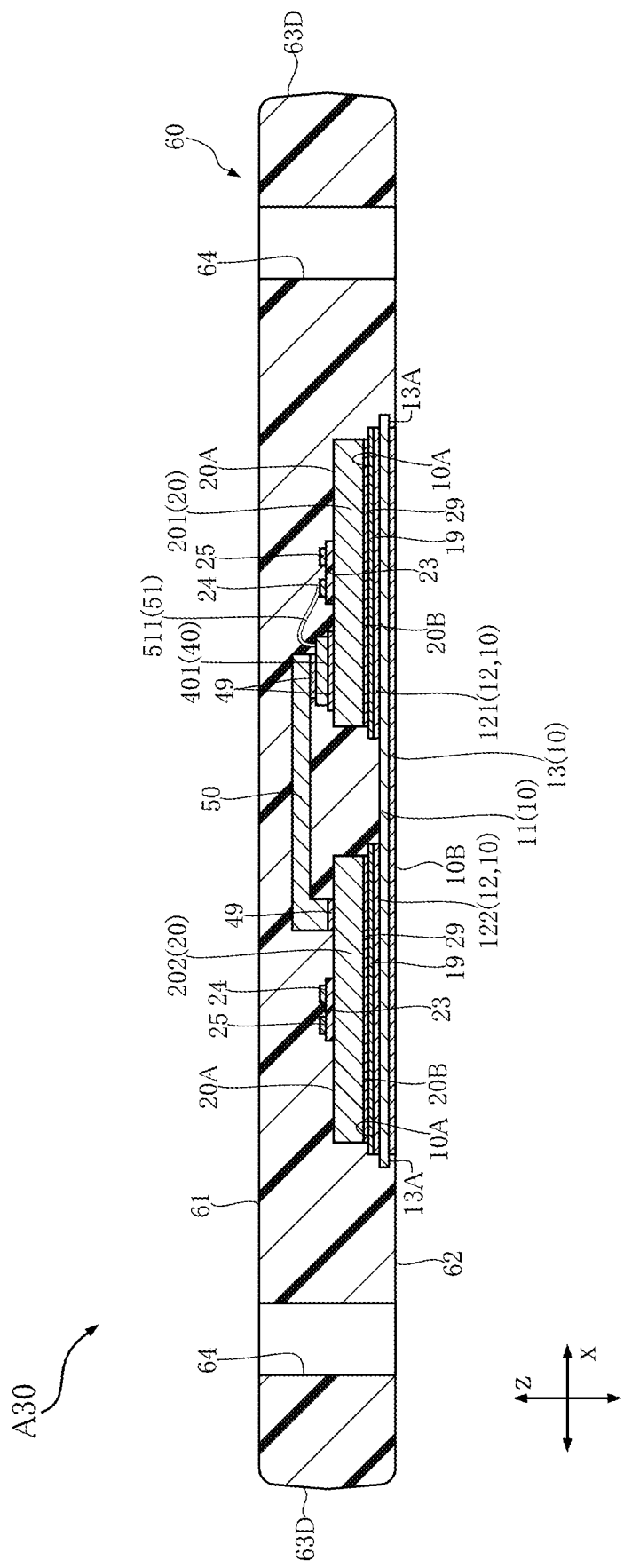
FIG. 26 is a cross-sectional view along line XXVI-XXVI in FIG. 20.
Figure 27:
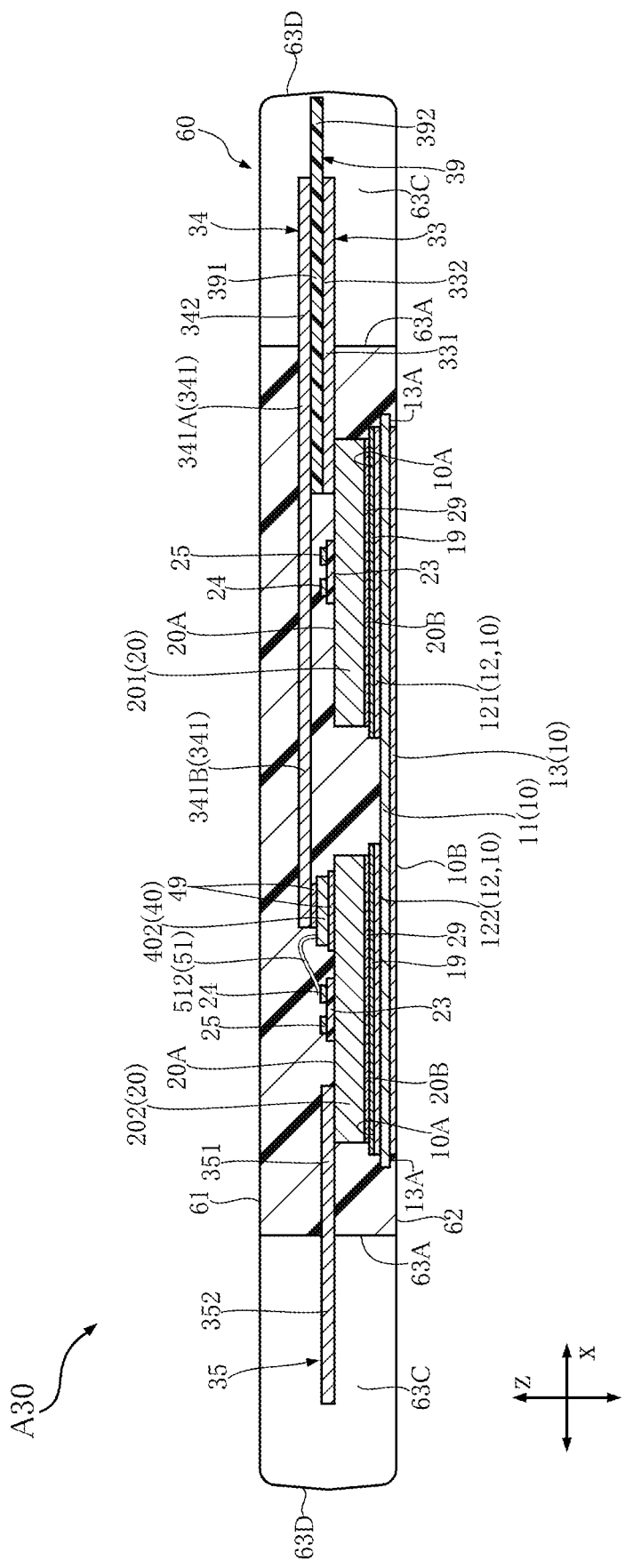
FIG. 27 is a cross-sectional view along line XXVII-XXVII in FIG. 20.

As shown in FIG. 20, the second supporting plate 12 of the supporting member 10 includes only a first region 121 and a second region 122. As shown in FIGS. 26 and 27, the first metal layer 19 covers the supporting surface 10A of each of the first region 121 and the second region 122. The first region 121 is bonded to the first conductive portion 201. The second region 122 is bonded to the second conductive portion 202.

The first metal layer 19 and the second metal layer 29 have the same configurations as those in the semiconductor device A10 (see FIGS. 9A and 9B). Note that the first metal layer 19 and the second metal layer 29 in the semiconductor device A30 may instead have the same configurations as those in the semiconductor device A11 (see FIGS. 10A and 10B).

As shown in FIG. 21, the pair of insulating layers 23 are arranged on the respective obverse surfaces 20A of the first conductive portion 201 and the second conductive portion 202. The pair of insulating layers 23 are separated apart from each other in the first direction x. Each of the pair of insulating layers 23 has a strip shape extending in the second direction y. The insulating layer 23 on the first side in the first direction x is arranged on the obverse surface 20A of the first conductive portion 201. The insulating layer 23 on the second side in the first direction x is arranged on the obverse surface 20A of the second conductive portion 202.

As shown in FIG. 21, the pair of gate layers 24 are arranged on the pair of insulating layers 23. Each of the pair of gate layers 24 has a strip shape extending in the second direction y.

As shown in FIG. 21, the pair of detection layers 25 are arranged on the pair of insulating layers 23. Each of the pair of detection layers 25 has a strip shape extending in the second direction y. On the insulating layer 23 positioned on the first side in the first direction x, the detection layer 25 is offset further toward the first side in the first direction x than the gate layer 24. On the insulating layer 23 positioned on the second side in the first direction x, the detection layer 25 is offset further toward the second side in the first direction x than the gate layer 24.

As shown in FIGS. 20 and 21, the first input terminal 33 and the second input terminal 34 are positioned on the first side in the first direction x. DC power targeted for conversion is input to the first input terminal 33 and the second input terminal 34. The first input terminal 33 is a positive electrode (P terminal). The second input terminal 34 is a negative electrode (N terminal). As shown in FIG. 27, the second input terminal 34 is separated apart from the first input terminal 33, the first conductive portion 201, and the second conductive portion 202 in the thickness direction z. Each of the first input terminal 33 and the second input terminal 34 is a metal plate made of copper or a copper alloy.

As shown in FIG. 21, the first input terminal 33 has a first connecting portion 331 and a first terminal portion 332. In the first input terminal 33, the boundary surface between the first connecting portion 331 and the first terminal portion 332 is the surface that is along the second direction y and the thickness direction z, and that includes the first side surface 63A of the sealing resin 60 positioned on the first side in the first direction x. The entirety of the first connecting portion 331 is covered with the sealing resin 60. The area of the first connecting portion 331 on the second side in the first direction x has a comb-like shape. The comb-like area is connected to the obverse surface 20A of the first conductive portion 201 by solder bonding or ultrasonic bonding. As such, the first input terminal 33 is electrically connected to the first conductive portion 201.

Figure 22:
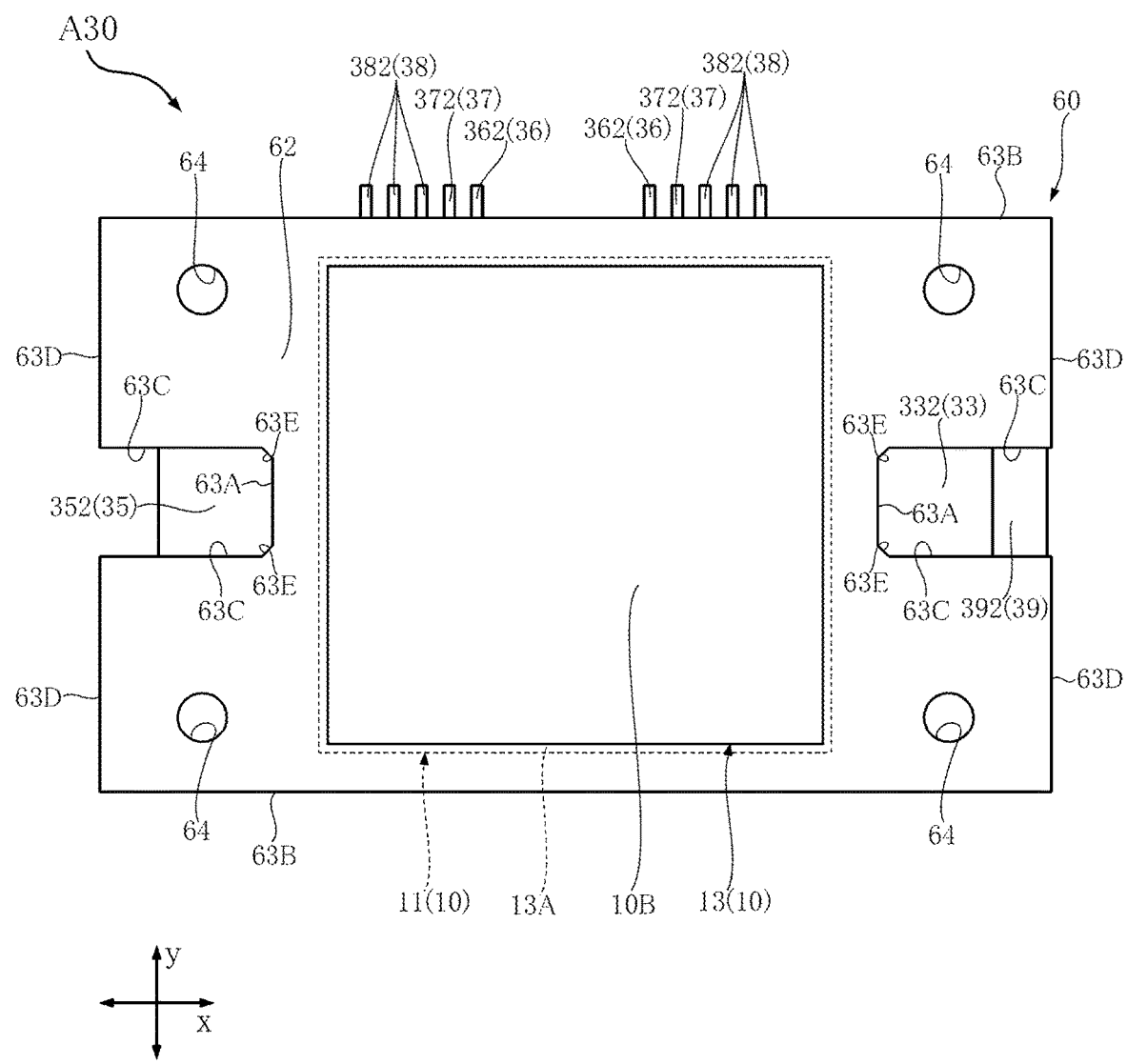
FIG. 22 is a bottom view showing the semiconductor device of FIG. 18.

As shown in FIGS. 21 and 22, the first terminal portion 332 extends from the sealing resin 60 toward the first side in the first direction x. The first terminal portion 332 has a rectangular shape as viewed along the thickness direction z. Both sides of the first terminal portion 332 in the second direction y are covered with the sealing resin 60. The other portion of the first terminal portion 332 is exposed from the sealing resin 60. As a result, the first input terminal 33 is supported by both of the first conductive portion 201 and the sealing resin 60.

As shown in FIG. 20, the second input terminal 34 has a second connecting portion 341 and a second terminal portion 342. The boundary surface between the second connecting portion 341 and the second terminal portion 342 of the second input terminal 34 is the same as the boundary surface of the first connecting portion 331 and the first terminal portion 332 of the first input terminal 33.

Figure 29:
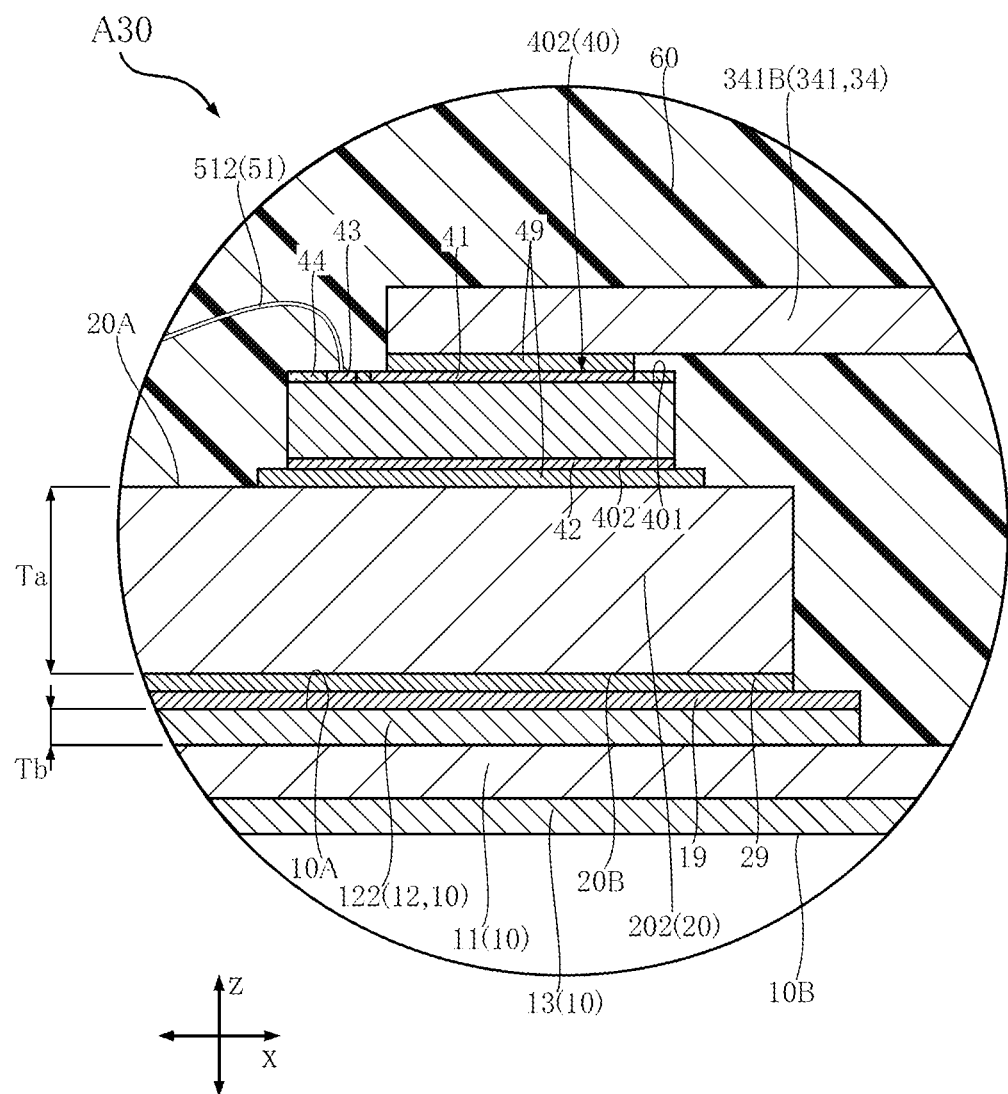
FIG. 29 is a partially enlarged view of FIG. 27.

As shown in FIG. 20, the second connecting portion 341 has a joining portion 341A and a plurality of extending portions 341B. The joining portion 341A has a strip shape extending in the second direction y. The end of the joining portion 341A on the first side in the first direction x is connected to the second terminal portion 342. The plurality of extending portions 341B extend from the joining portion 341A toward the second side in the first direction x. Each of the plurality of extending portions 341B has a strip shape extending in the first direction x. As shown in FIG. 29, the ends of the plurality of extending portions 341B on the second side in the first direction x are connected to first electrodes 41 of a plurality of second elements 402 (details of which are described below) via bonding layers 49. As a result, the second input terminal 34 is electrically connected to the first electrodes 41 of the plurality of second elements 402.

As shown in FIGS. 19 and 20, the second terminal portion 342 extends from the sealing resin 60 toward the first side in the first direction x. The second terminal portion 342 has a rectangular shape as viewed along the thickness direction z. Both sides of the second terminal portion 342 in the second direction y are covered with the sealing resin 60. The other portion of the second terminal portion 342 is exposed from the sealing resin 60. As shown in FIGS. 20 and 21, the second terminal portion 342 overlaps with the first terminal portion 332 of the first input terminal 33 as viewed along the thickness direction z. As shown in FIG. 27, the second terminal portion 342 is separated apart from the first terminal portion 332 toward the side in the thickness direction z in which the supporting surface 10A of the supporting member 10 faces. In the example of the semiconductor device A30, the second terminal portion 342 has the same shape as the first terminal portion 332.

As shown in FIG. 27, the insulating member 39 is positioned between the first input terminal 33 and the second input terminal 34 in the thickness direction z. The insulating member 39 is a flat plate that is electrically insulative. One example of the insulating member 39 is an insulating sheet. As viewed along the thickness direction z, the entirety of the first input terminal 33 overlaps with the insulating member 39. As for the second input terminal 34, a part of the joining portion 341A of the second connecting portion 341 and the entirety of the second terminal portion 342 overlap with the insulating member 39, as viewed along the thickness direction z. These portions that overlap with the insulating member 39 as viewed along the thickness direction z are in contact with the insulating member 39. As a result, the first input terminal 33 and the second input terminal 34 are insulated from each other. Parts of the insulating member 39 (a part on the second side in the first direction x and parts on both sides in the second direction y) are covered with the sealing resin 60.

As shown in FIGS. 21 and 27, the insulating member 39 has an intervening portion 391 and an extending portion 392. The intervening portion 391 is provided between the first terminal portion 332 of the first input terminal 33 and the second terminal portion 342 of the second input terminal 34. The extending portion 392 extends from the intervening portion 391 toward the first side in the first direction x further than the first terminal portion 332 and the second terminal portion 342. Both sides of the extending portion 392 in the second direction y are covered with the sealing resin 60.

As shown in FIG. 20, the output terminal 35 is positioned on the second side in the first direction x. AC power resulting from the power conversion by the plurality of semiconductor elements 40 is output from the output terminal 35. The output terminal 35 is a metal plate made of copper or a copper alloy. The output terminal 35 has a connecting portion 351 and a terminal portion 352. The boundary surface between the connecting portion 351 and the terminal portion 352 is the surface that is along the second direction y and the thickness direction z, and that includes the first side surface 63A of the sealing resin 60 positioned on the second side in the first direction x. The entirety of the connecting portion 351 is covered with the sealing resin 60. The connecting portion 351 includes a comb-like portion 351A on the first side in the first direction x. The comb-like portion 351A is connected to the obverse surface 20A of the second conductive portion 202 by solder bonding or ultrasonic bonding. As a result, the output terminal 35 is electrically connected to the second conductive portion 202. As shown in FIGS. 19 and 20, the terminal portion 352 extends from the sealing resin 60 toward the second side in the first direction x. The terminal portion 352 has a rectangular shape as viewed along the thickness direction z. Both sides of the terminal portion 352 in the second direction y are covered with the sealing resin 60. The other portion of the terminal portion 352 is exposed from the sealing resin 60. As a result, the output terminal 35 is supported by both of the second conductive portion 202 and the sealing resin 60.

The plurality of semiconductor elements 40 include a plurality of first elements 401 and a plurality of second elements 402. The plurality of first elements 401 and the plurality of second elements 402 are identical to the semiconductor elements in the semiconductor device A10 described above. Thus, descriptions of the respective configurations of the plurality of first elements 401 and the plurality of second elements 402 are omitted.

As shown in FIG. 20, the plurality of first elements 401 are bonded to the obverse surface 20A of the first conductive portion 201. The plurality of first elements 401 are arranged at predetermined intervals along the second direction y. The plurality of first elements 401 constitute an upper arm circuit of the semiconductor device A30. In the first conductive portion 201, the plurality of first elements 401 are offset further toward the second side in the first direction x than the insulating layer 23.

As shown in FIG. 20, the plurality of second elements 402 are bonded to the obverse surface 20A of the second conductive portion 202. The plurality of second elements 402 are arranged at predetermined intervals along the second direction y. The plurality of second elements 402 constitute a lower arm circuit of the semiconductor device A30. In the second conductive portion 202, the plurality of second elements 402 are offset further toward the first side in the first direction x than the insulating layer 23.

As shown in FIG. 20, the plurality of first elements 401 and the plurality of second elements 402 are in a staggered arrangement on the conductive member 20 as a whole. In the illustrate example, the semiconductor device A30 includes four first elements 401 and four second elements 402. The number of the first elements 401 and the number of the second elements 402 are not limited to the above, and can be varied according to the performance required for the semiconductor device A30.

Figure 28:
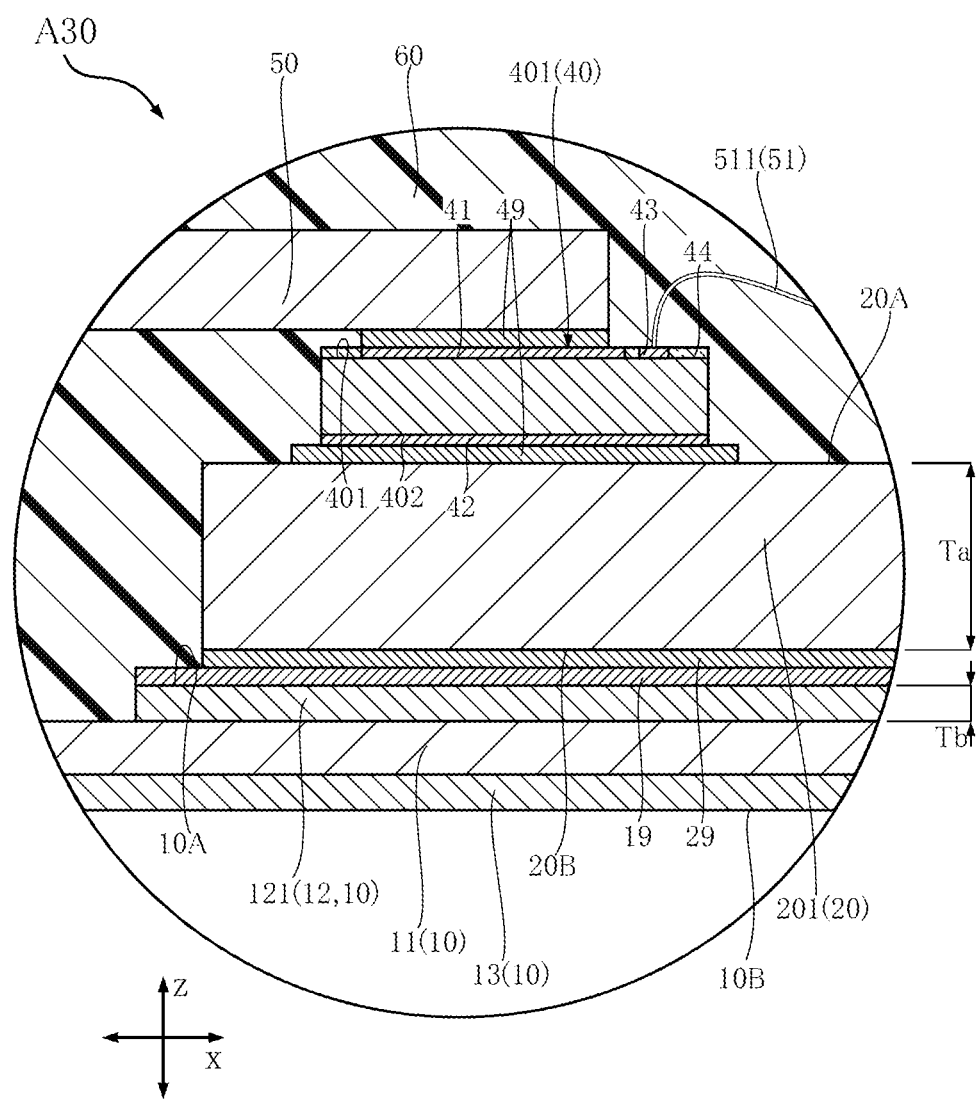
FIG. 28 is a partially enlarged view of FIG. 26.

As shown in FIGS. 26 and 28, the plurality of conduction members 50 are connected to the first electrodes 41 of the plurality of first elements 401 and the obverse surface 20A of the second conductive portion 202. The ends of the plurality of conduction members 50 positioned on the first side in the first direction x are connected to the first electrodes 41 of the plurality of first elements 401 via the bonding layers 49. The ends of the plurality of conduction members 50 positioned on the second side in the first direction x are connected to the obverse surface 20A of the second conductive portion 202 via the bonding layers 49. As a result, the first electrodes 41 of the plurality of first elements 401 are electrically connected to the second conductive portion 202.

The plurality of gate wires 51 include a plurality of first gate wires 511 and a plurality of second gate wires 512. As shown in FIG. 20, the plurality of first gate wires 511 are connected to the gate electrodes 43 of the plurality of first elements 401 and to one gate layer 24 positioned on the obverse surface 20A of the first conductive portion 201. As a result, the gate electrodes 43 of the plurality of first elements 401 are electrically connected to the gate layer 24. As shown in FIG. 20, the plurality of second gate wires 512 are connected to the gate electrodes 43 of the plurality of second elements 402 and to the other gate layer 24 positioned on the obverse surface 20A of the second conductive portion 202. As a result, the gate electrodes 43 of the plurality of second elements 402 are electrically connected to the gate layer 24.

The plurality of detection wires 52 include a plurality of first detection wires 521 and a plurality of second detection wires 522. As shown in FIG. 20, the plurality of first detection wires 521 are connected to the first electrodes 41 of the plurality of first elements 401 and to one detection layer 25 positioned on the obverse surface 20A of the first conductive portion 201. As a result, the first electrodes 41 of the plurality of first elements 401 are electrically connected to the detection layer 25. As shown in FIG. 20, the plurality of second detection wires 522 are connected to the first electrodes 41 of the plurality of second elements 402 and to the other detection layer 25 positioned on the obverse surface 20A of the second conductive portion 202. As a result, the first electrodes 41 of the plurality of second elements 402 are electrically connected to the detection layer 25.

As shown in FIG. 20, the pair of gate terminals 36, the pair of detection terminals 37, and the plurality of dummy terminals 38 are adjacent to the conductive member 20 in the second direction y. These terminals are arranged along the first direction x. In the semiconductor device A30, the pair of gate terminals 36, the pair of detection terminals 37, and the plurality of dummy terminals 38 are formed by the same lead frame.

As shown in FIG. 20, one of the pair of gate terminals 36 is adjacent to the first conductive portion 201, and the other is adjacent to the second conductive portion 202. A gate voltage for driving either the plurality of first elements 401 or the plurality of second elements 402 is applied to each of the pair of gate terminals 36.

As shown in FIG. 20, each of the pair of detection terminals 37 is adjacent to a respective one of the pair of gate terminals 36 in the first direction x. Via each of the detection terminals 37, voltage (corresponding to the source current)

is applied to the first electrodes 41 of either the first elements 401 or the second elements 402.

Figure 23:
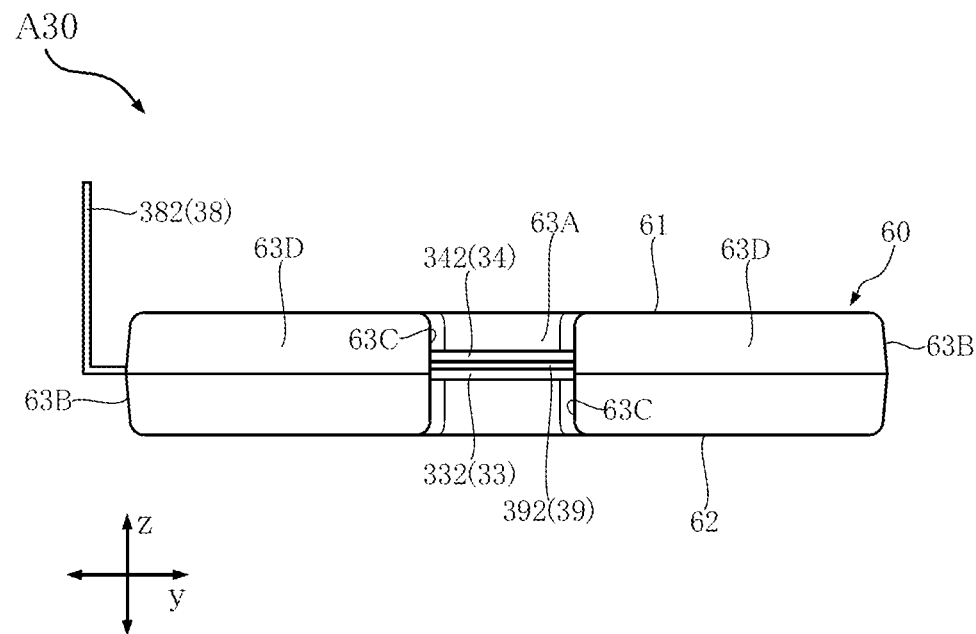
FIG. 23 is a right side view showing the semiconductor device of FIG. 18.
Figure 24:
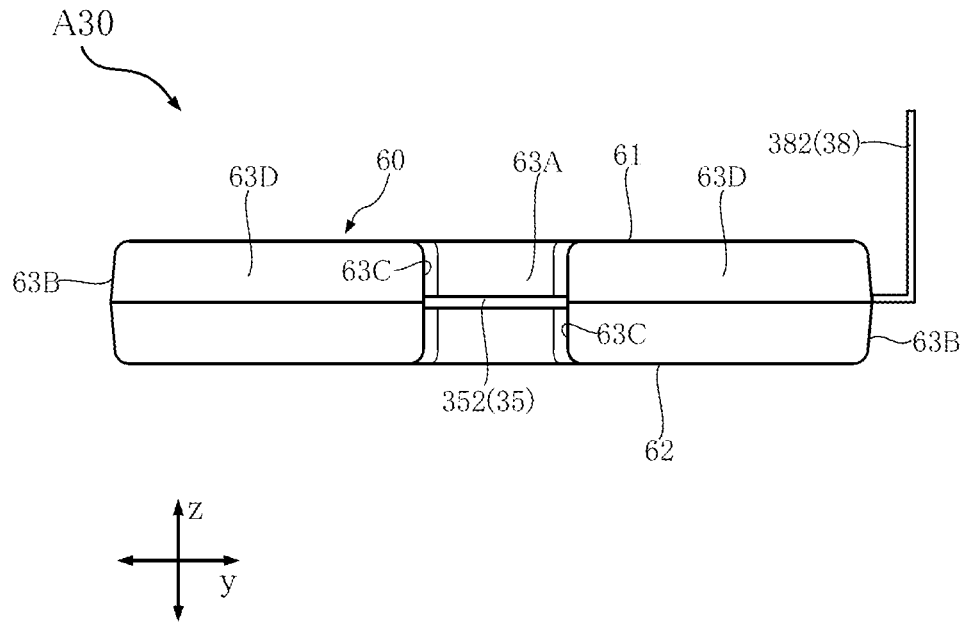
FIG. 24 is a left side view showing the semiconductor device of FIG. 18.
Figure 25:
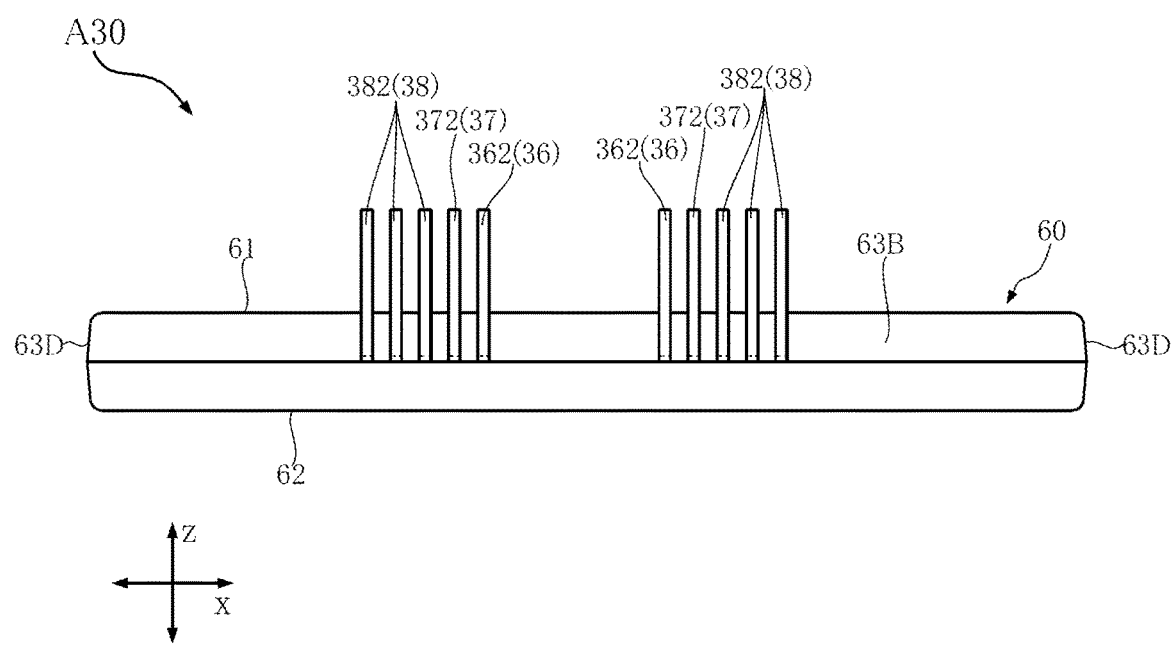
FIG. 25 is a front view showing the semiconductor device of FIG. 18.

As shown in FIG. 20, the plurality of dummy terminals 38 are positioned opposite to the gate terminals 36 with respect to the detection terminals 37 in the first direction x. In the illustrated example, the semiconductor device A30 includes six dummy terminals 38. Three of these dummy terminals 38 are located on the first side in the first direction x. The other three dummy terminals 38 are located on the second side in the first direction x. Note that the number of the dummy terminals 38 is not limited to this. Furthermore, the semiconductor device A30 may not include any dummy terminals 38. Each of the dummy terminals 38 has a connecting portion 381 and a terminal portion 382. The connecting portion 381 is covered with the sealing resin 60. As a result, the plurality of dummy terminals 38 are supported by the sealing resin 60. The surface of the connecting portion 381 may be silver-plated, for example. The terminal portion 382 is connected to the connecting portion 381 and exposed from the sealing resin 60 (see FIGS. 20 and 25). As shown in FIGS. 23 and 24, the terminal portion 382 has an L shape as viewed along the first direction x. Each of the terminal portions 362 of the pair of gate terminals 36 and the terminal portions 372 of the pair of detection terminals 37 has the same shape as the terminal portion 382.

As shown in FIG. 20, the pair of first wires 531 are connected to the pair of gate terminals 36 and the pair of gate layers 24, respectively. As a result, one gate terminal 36 adjacent to the first conductive portion 201 is electrically connected to the gate electrodes 43 of the plurality of first elements 401. The other gate terminal 36 adjacent to the second conductive portion 202 is electrically connected to the gate electrodes 43 of the plurality of second elements 402.

As shown in FIG. 20, the pair of second wires 532 are connected to the pair of detection terminals 37 and the pair of detection layers 25, respectively. As a result, one detection terminal 37 adjacent to the first conductive portion 201 is electrically connected to the first electrodes 41 of the plurality of first elements 401. The other detection terminal 37 adjacent to the second conductive portion 202 is electrically connected to the first electrodes 41 of the plurality of first elements 401.

As shown in FIGS. 26 and 27, the sealing resin 60 covers the supporting member 10, a part of the first input terminal 33, a part of the second input terminal 34, a part of the output terminal 35, the conductive member 20, the plurality of semiconductor elements 40, and the plurality of conduction members 50. Furthermore, the sealing resin 60 covers the pair of insulating layers 23, the pair of gate layers 24, the pair of detection layers 25, the plurality of gate wires 51, the plurality of detection wires 52, the pair of first wires 531, and the pair of second wires 532. The sealing resin 60 also covers respective parts of the pair of gate terminals 36, the pair of detection terminals 37, and the plurality of dummy terminals 38. As shown in FIGS. 19 to 25, the sealing resin 60 has a top surface 61, a bottom surface 62, a pair of first side surfaces 63A, a pair of second side surfaces 63B, a plurality of third side surfaces 63C, a plurality of fourth side surfaces 63D, a plurality of beveled portions 63E, and a plurality of mounting holes 64.

As shown in FIGS. 26 and 27, the top surface 61 faces the same side as the supporting surface 10A of the supporting member 10 in the thickness direction z. The bottom surface 62 faces away from the top surface 61 in the thickness direction z. As shown in FIG. 22, the bottom surface 10B of the bottom plate 13 (supporting member 10) is exposed from the bottom surface 62. The bottom surface 62 has a frame shape surrounding the bottom plate 13.

As shown in FIGS. 19 to 24, and FIG. 27, the first side surfaces 63A are each connected to the top surface 61 and the bottom surface 62, and face in the first direction x. The first terminal portion 332 of the first input terminal 33 and the second terminal portion 342 of the second input terminal 34 extend outward along the first direction x from the first side surface 63A positioned on the first side in the first direction x. The terminal portion 352 of the output terminal 35 extends outward along the first direction x from the first side surface 63A positioned on the second side in the first direction x. Accordingly, respective parts of the first input terminal 33 and the second input terminal 34 are exposed from the sealing resin 60 on the first side in the first direction x. Also, a part of the output terminal 35 is exposed from the sealing resin 60 on the second side in the first direction x.

As shown in FIGS. 19 to 25, the pair of second side surfaces 63B are connected to both of the top surface 61 and the bottom surface 62, and face in the second direction y. The terminal portions 362 of the pair of gate terminals 36, the terminal portions 372 of the pair of detection terminals 37, and the terminal portions 382 of the plurality of dummy terminals 38 are exposed from one of the pair of second side surfaces 63B.

As shown in FIGS. 19 to 24, and FIG. 27, the plurality of third side surfaces 63C are connected to both of the top surface 61 and the bottom surface 62, and face in the second direction y. The plurality of third side surfaces 63C include a pair of third side surfaces 63C positioned on the first side in the first direction x, and a pair of third side surfaces 63C positioned on the second side in the first direction x. The pair of third side surfaces 63C on each of the first side and the second side in the first direction x face each other in the second direction y. Furthermore, the pair of third side surfaces 63C on each of the first side and the second side in the first direction x are connected to the respective ends of the corresponding first side surface 63A in the second direction y.

As shown in FIGS. 19 to 27, the plurality of fourth side surfaces 63D are connected to the top surface 61 and the bottom surface 62, and face in the first direction x. The plurality of fourth side surfaces 63D are offset from the pair of first side surfaces 63A in the first direction x toward the outer side of the semiconductor device A30. The plurality of fourth side surfaces 63D include a first pair of fourth side surfaces 63D positioned on the first side in the first direction x, and a second pair of fourth side surfaces 63D positioned on the second or opposite side in the first direction x. Each fourth side surface 63D of the respective pairs in the first direction x has two opposite ends in the second direction y, one of which is connected to one of the two second side surfaces 63B, and the other of which is connected to one of the corresponding two third side surfaces 63C.

As shown in FIGS. 19 and 22, each of the plurality of beveled portions 63E is positioned on the boundary between one of the first side surfaces 63A and one of the third side surfaces 63C. As viewed along the thickness direction z, each of the plurality of beveled portions 63E is inclined relative to the first direction x and the second direction y.

As shown in FIG. 26, the plurality of mounting holes 64 penetrate through the sealing resin 60 from the top surface 61 to the bottom surface 62 in the thickness direction z. The plurality of mounting holes 64 are used when the semiconductor device A30 is attached to a heat sink. As shown in FIGS. 19 and 22, each of the edges of the plurality of mounting holes 64 has a circular shape as viewed along the thickness direction z. The plurality of mounting holes 64 are positioned at four corners of the sealing resin 60 as viewed along the thickness direction z.

The following describes advantages of the semiconductor device A30.

The semiconductor device A30 includes the first metal layer 19 and the second metal layer 29. The first metal layer 19 covers the supporting surface 10A of the supporting member 10. The second metal layer 29 covers the reverse surface 20B of the conductive member 20. The first metal layer 19 and the second metal layer 29 are bonded to each other by solid phase diffusion. This allows the semiconductor device A30 to have an improved heat dissipation property.

In the semiconductor device A30, the plurality of semiconductor elements 40 include the plurality of first elements 401 and the plurality of second elements 402. The plurality of first elements 401 are bonded to the first conductive portion 201. The plurality of second elements 402 are bonded to the second conductive portion 202. Since the first metal layer 19 and the second metal layer 29 are bonded to each other by solid phase diffusion, each of the first conductive portion 201 and the second conductive portion 202 can be designed to have a thickness larger than the thickness of the second supporting plate 12. This allows the entirety of the conductive member 20 to which the plurality of semiconductor elements 40 are bonded to have an improved heat dissipation property.

The first input terminal 33 and the second input terminal 34 are positioned on the first side in the first direction x. The first input terminal 33 and the second input terminal 34 are separated apart from each other in the thickness direction z. As viewed along the thickness direction z, at least a part (second terminal portion 342) of the second input terminal 34 overlaps with the first input terminal 33. As a result, the self-inductance of the first input terminal 33 can be reduced by the magnetic field generated from the second input terminal 34 during use of the semiconductor device A30, and the semiconductor device A30 is thus prevented from a decrease in power conversion efficiency.

Fourth Embodiment

Figure 30:
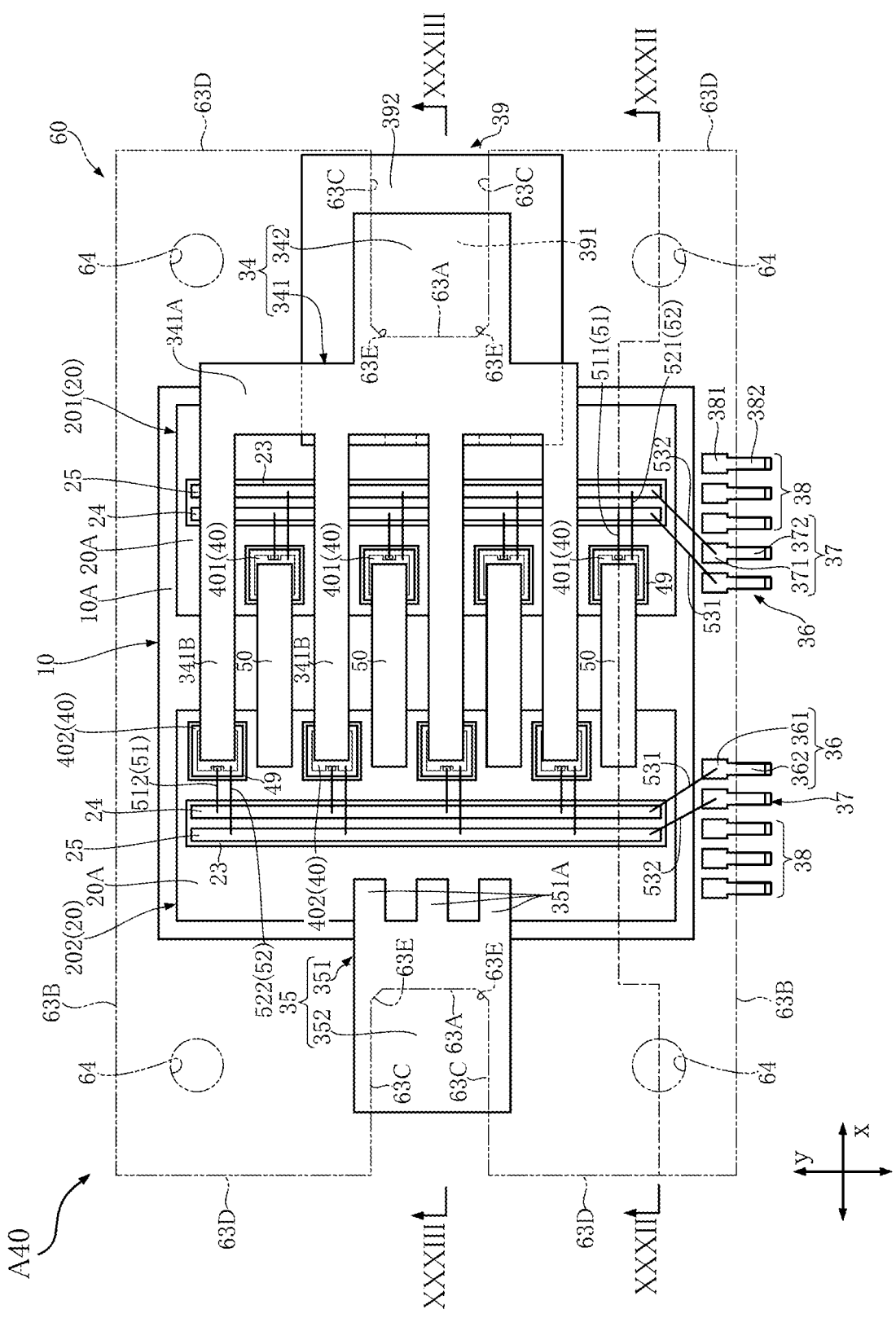
FIG. 30 is a plan view showing a semiconductor device according to a fourth embodiment of the present disclosure, and shows the sealing resin in phantom.
Figure 31:
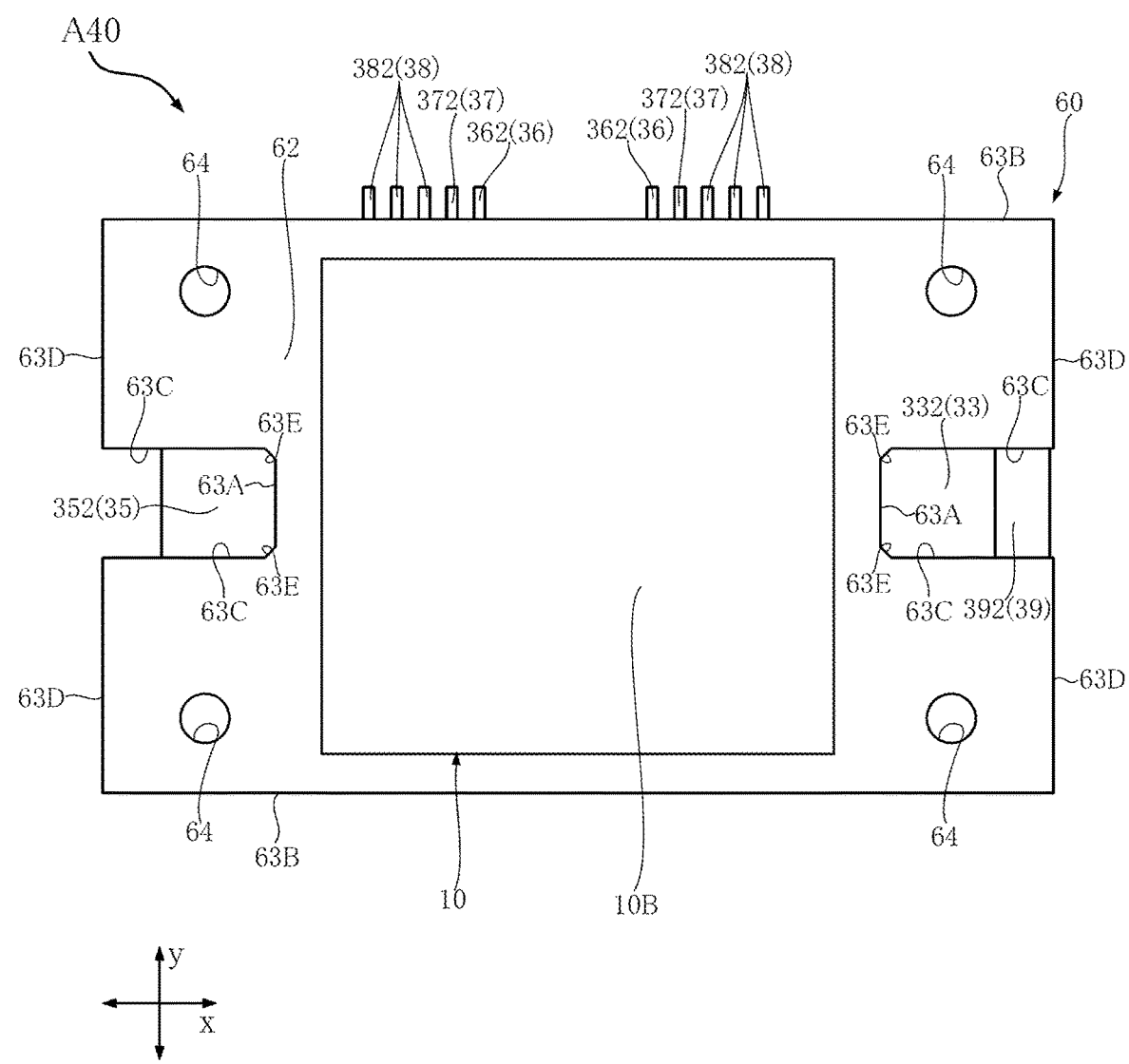
FIG. 31 is a bottom view showing the semiconductor device of FIG. 30.

A semiconductor device A40 according to a fourth embodiment of the present disclosure will be described with reference to FIGS. 30 to 35. In these figures, elements that are identical or similar to the elements of the semiconductor device A10 are provided with the same reference signs, and descriptions thereof are omitted. FIG. 30 shows the sealing resin 60 in phantom for convenience of understanding. The sealing resin 60 shown in phantom is indicated by an imaginary line.

The semiconductor device A40 is different from the semiconductor device A30 in the configurations of the supporting member 10 and the conductive member 20.

Figure 32:
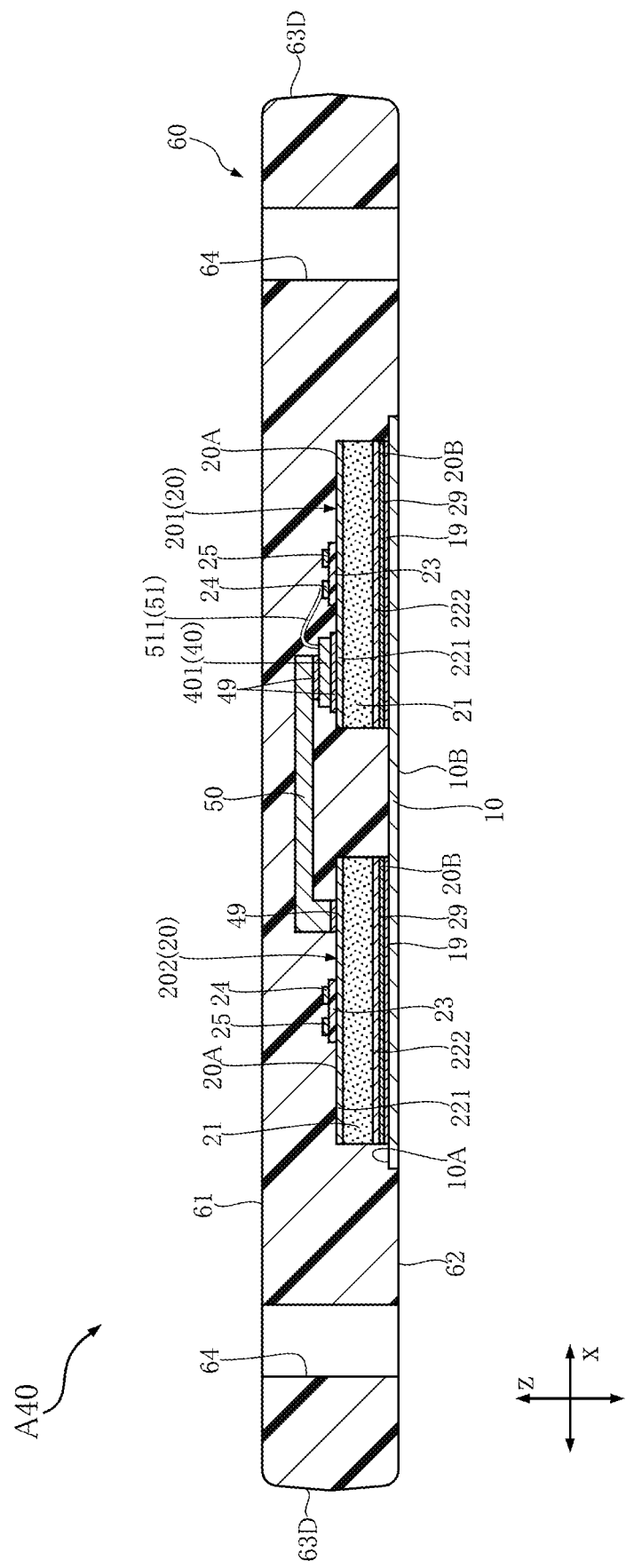
FIG. 32 is a cross-sectional view along line XXXII-XXXII in FIG. 30.
Figure 33:
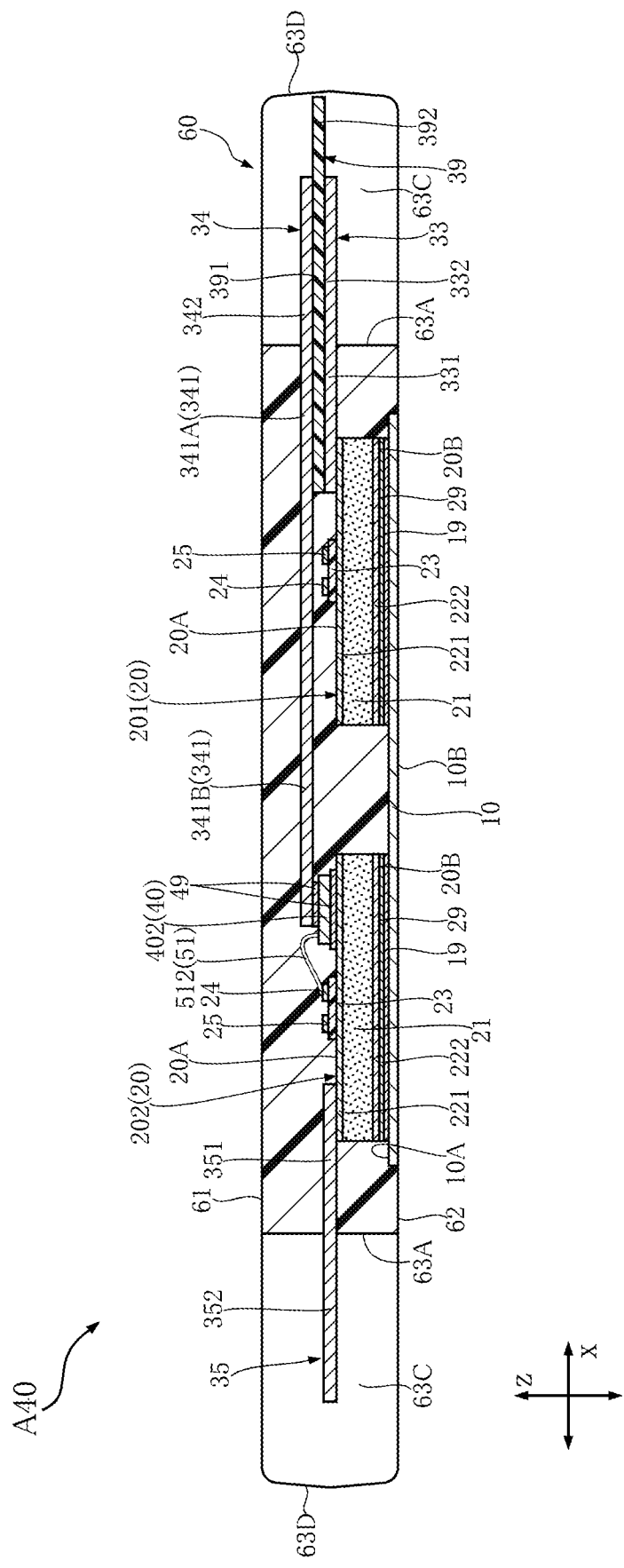
FIG. 33 is a cross-sectional view along line XXXIII-XXXIII in FIG. 30.
Figure 34:
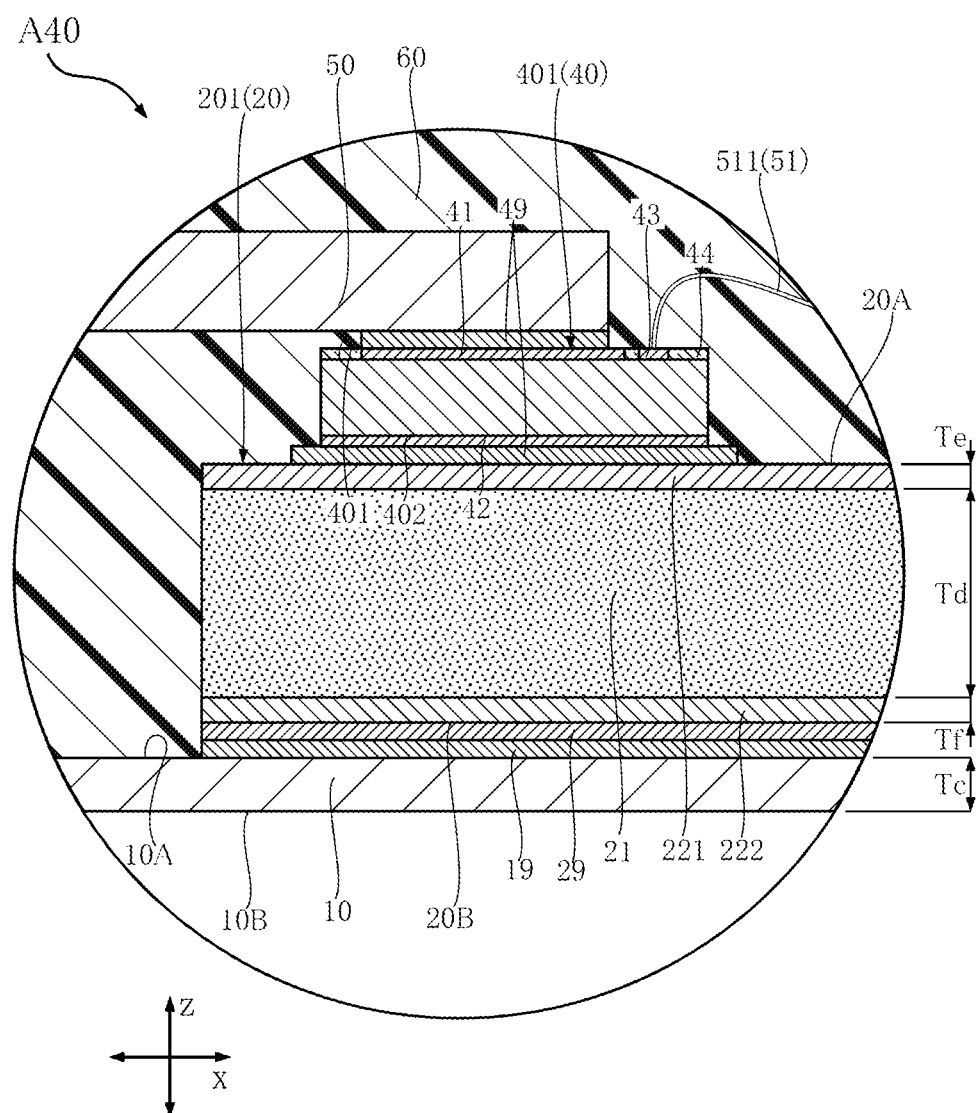
FIG. 34 is a partially enlarged view of FIG. 32.
Figure 35:
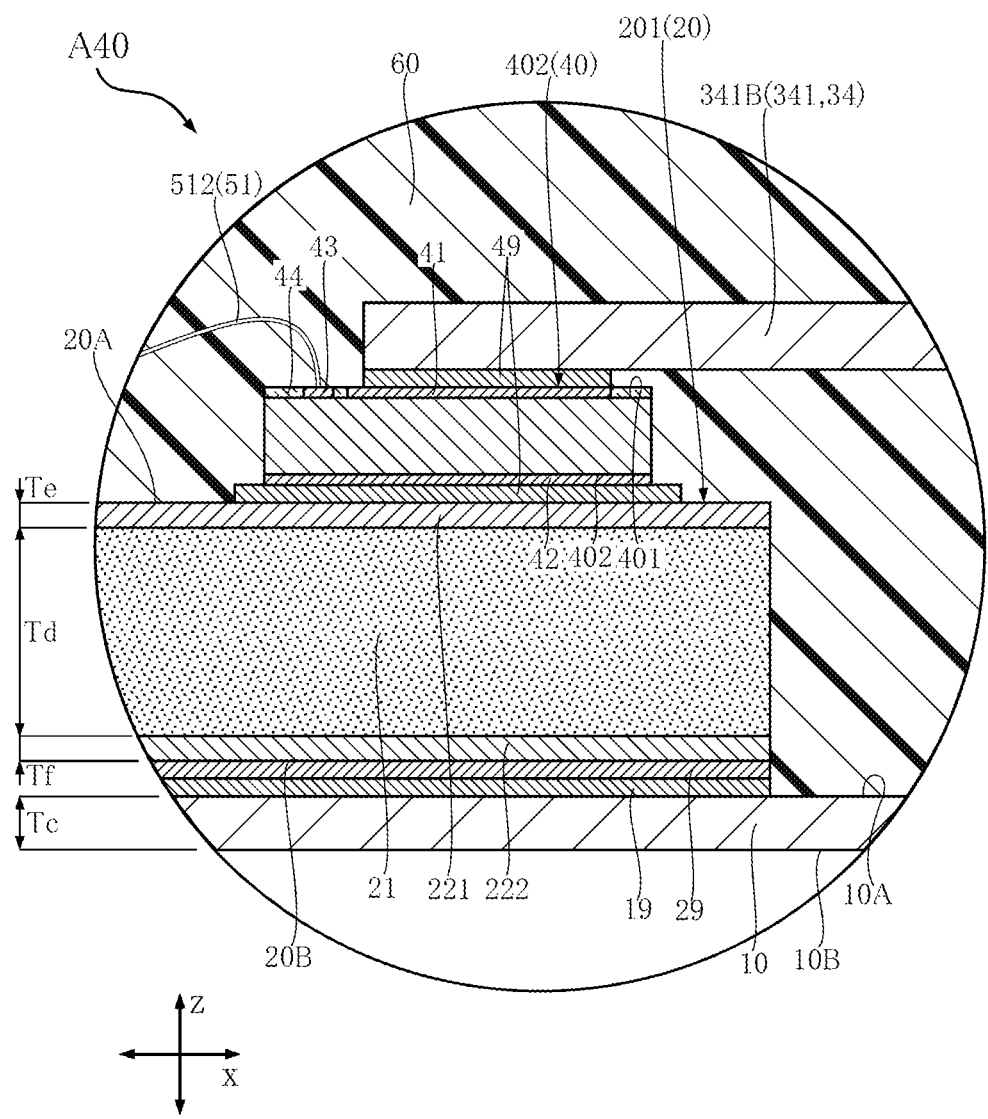
FIG. 35 is a partially enlarged view of FIG. 33.

In the semiconductor device A40, the supporting member 10 is an insulating plate. As shown in FIGS. 30 to 34, the insulating plate includes a supporting surface 10A and a bottom surface 10B. As shown in FIGS. 32 and 33, the supporting surface 10A of the supporting member 10 has areas that overlap with the conductive member 20 as viewed along the thickness direction z, and the first metal layer 19 covers the areas of the supporting surface 10A. Other than these points, the configuration of the supporting member 10 is the same as that of the supporting member 10 in the semiconductor device A20, and descriptions of such configuration is thus omitted.

As shown in FIGS. 32 to 35, the conductive member 20 includes a base layer 21, a first wiring layer 221, and a second wiring layer 222. The base layer 21 occupies most of the volume of the conductive member 20. The base layer 21 contains carbon as its composition. In the semiconductor device A40, the base layer 21 is made of graphite. The first wiring layer 221 includes an obverse surface 20A, and is formed on the base layer 21. The second wiring layer 222 includes a reverse surface 20B, and is formed on the base layer 21. Accordingly, the base layer 21 is positioned between the first wiring layer 221 and the second wiring layer 222. Other than these points, the configuration of the conductive member 20 is the same as that of the conductive member 20 in the semiconductor device A20, and descriptions of such configuration is thus omitted.

The first metal layer 19 and the second metal layer 29 have the same configurations as those in the semiconductor device A20 (see FIG. 17).

The following describes advantages of the semiconductor device A40.

The semiconductor device A40 includes the first metal layer 19 and the second metal layer 29. The first metal layer 19 covers at least a part of the supporting surface 10A of the supporting member 10. The second metal layer 29 covers the reverse surface 20B of the conductive member 20. The first metal layer 19 and the second metal layer 29 are bonded to each other by solid phase diffusion. This allows the semiconductor device A40 to have an improved heat dissipation property.

In the semiconductor device A40, the supporting member 10 is an insulating plate. The conductive member 20 includes the first wiring layer 221 having the obverse surface 20A, the second wiring layer 222 having the reverse surface 20B, and the base layer 21 between the first wiring layer 221 and the second wiring layer 222. The base layer 21 is made of graphite. The in-plane direction of the graphite is along the thickness direction z. The base layer 21 is thicker than the supporting member 10. This makes it possible to further improve the heat dissipation property of the semiconductor device A40 as compared to the semiconductor device A30. The density of the base layer 21 made of graphite is approximately ¼ of the density of copper. As such, the semiconductor device A40 can be more lightweight than the semiconductor device A30.

Fifth Embodiment

Figure 36:
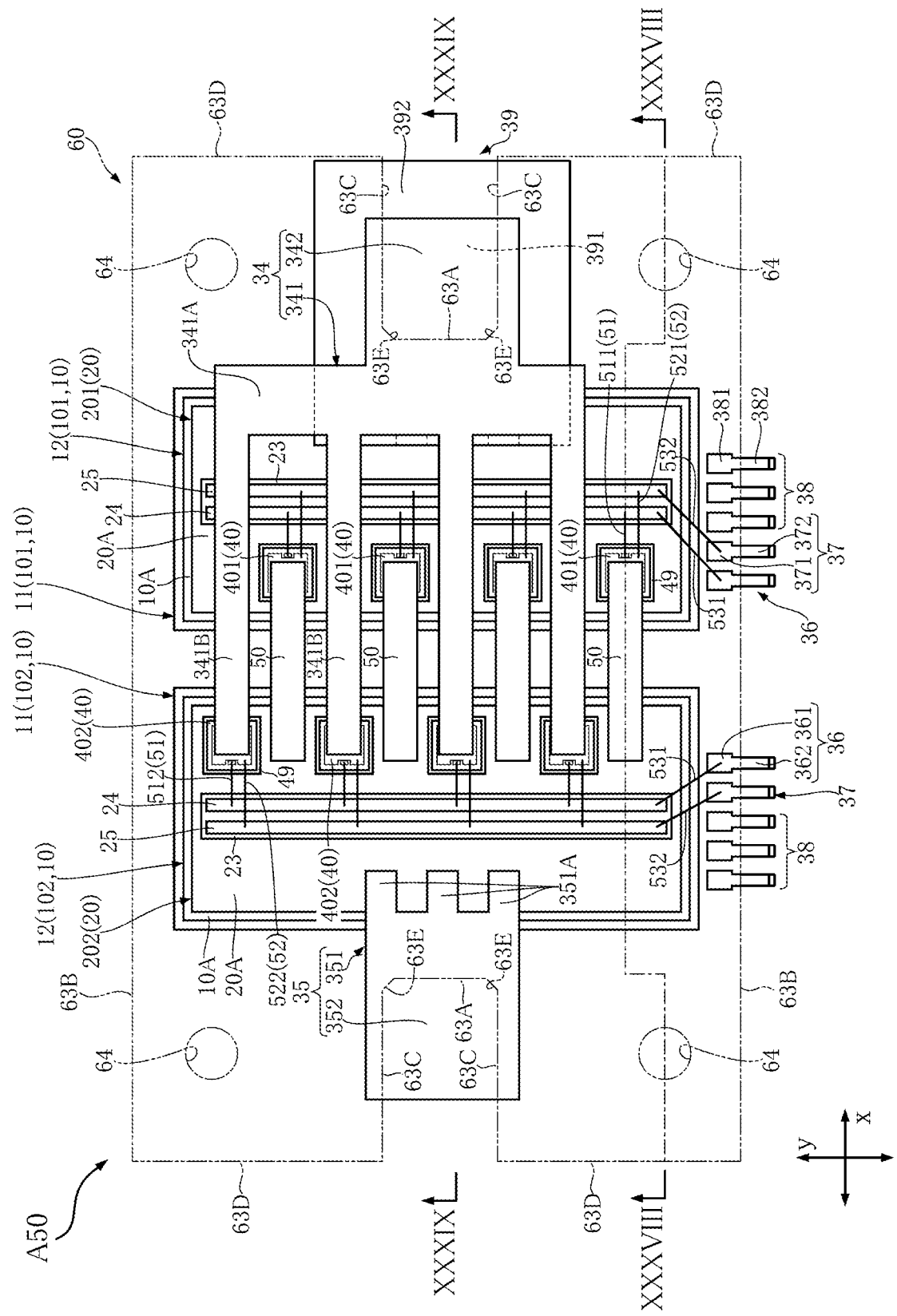
FIG. 36 is a plan view showing a semiconductor device according to a fifth embodiment of the present disclosure, with a sealing resin shown in phantom.

A semiconductor device A50 according to a fifth embodiment of the present disclosure will be described with reference to FIGS. 36 to 39. In these figures, elements that are identical or similar to the elements of the semiconductor device A10 are provided with the same reference signs, and descriptions thereof are omitted. FIG. 36 shows the sealing resin 60 in phantom for convenience of understanding. The sealing resin 60 shown in phantom is indicated by an imaginary line.

The semiconductor device A50 is different from the semiconductor device A30 in the configuration of the supporting member 10.

Figure 37:
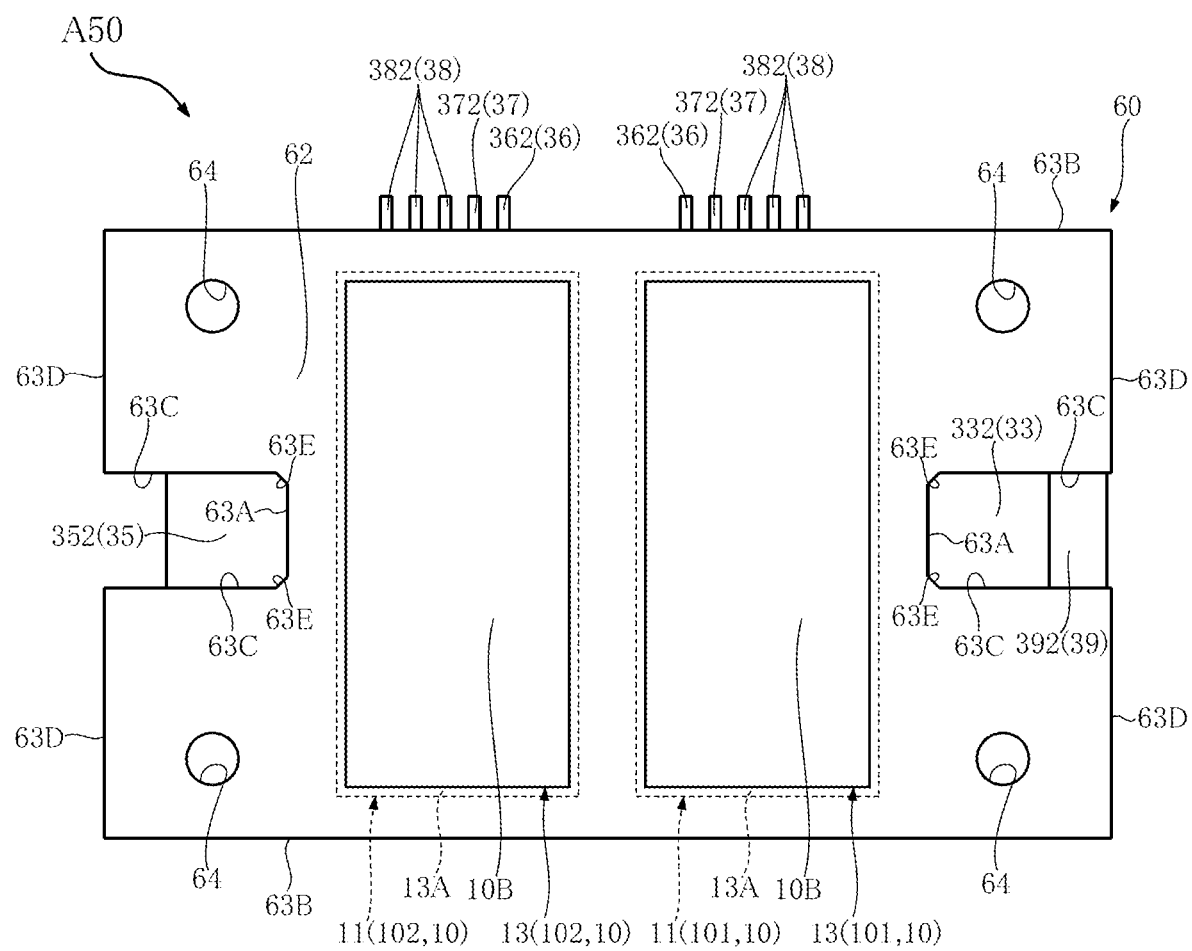
FIG. 37 is a bottom view showing the semiconductor device of FIG. 36.
Figure 38:
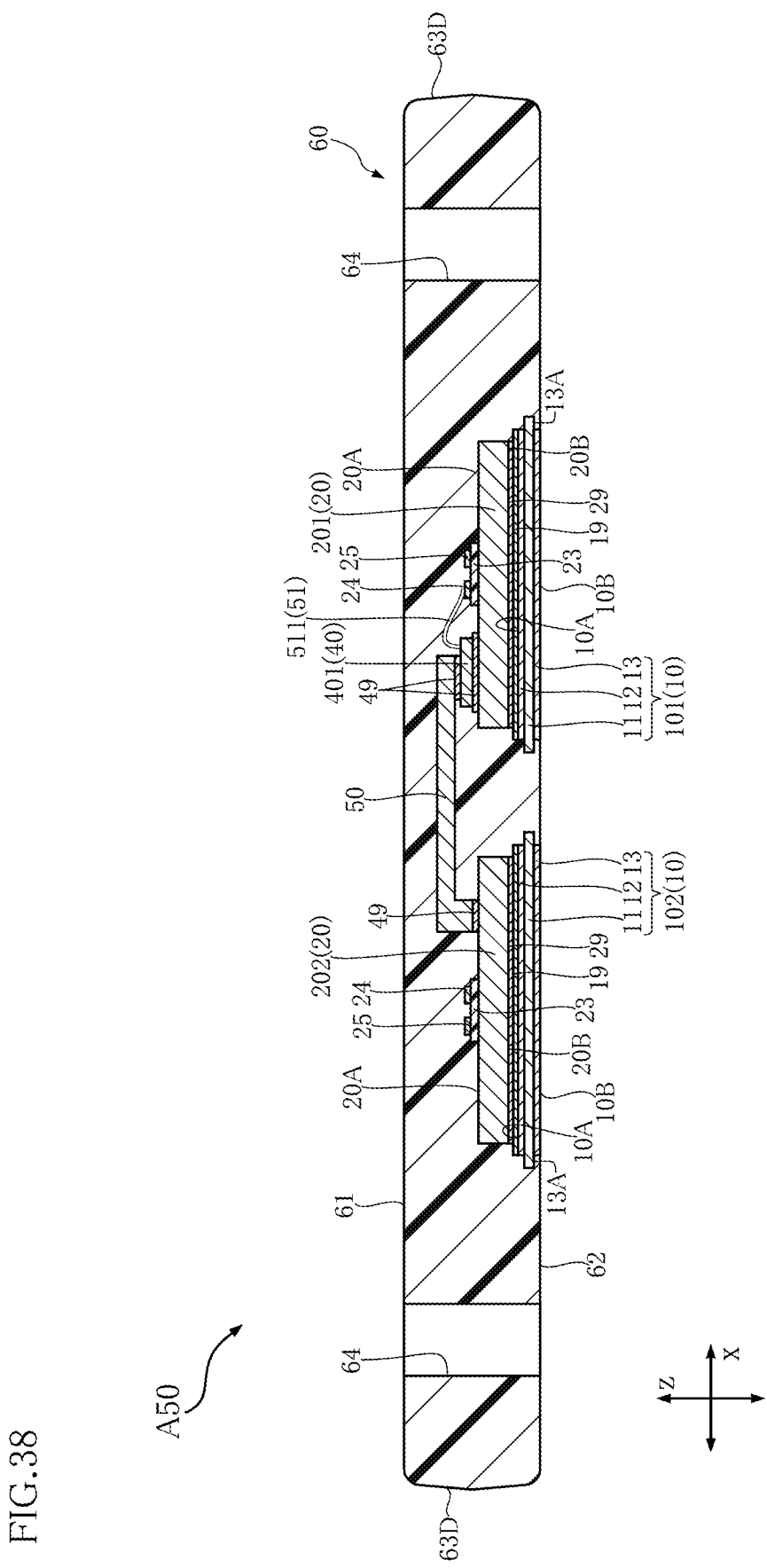
FIG. 38 is a cross-sectional view along line XXXVIII-XXXVIII in FIG. 36.
Figure 39:
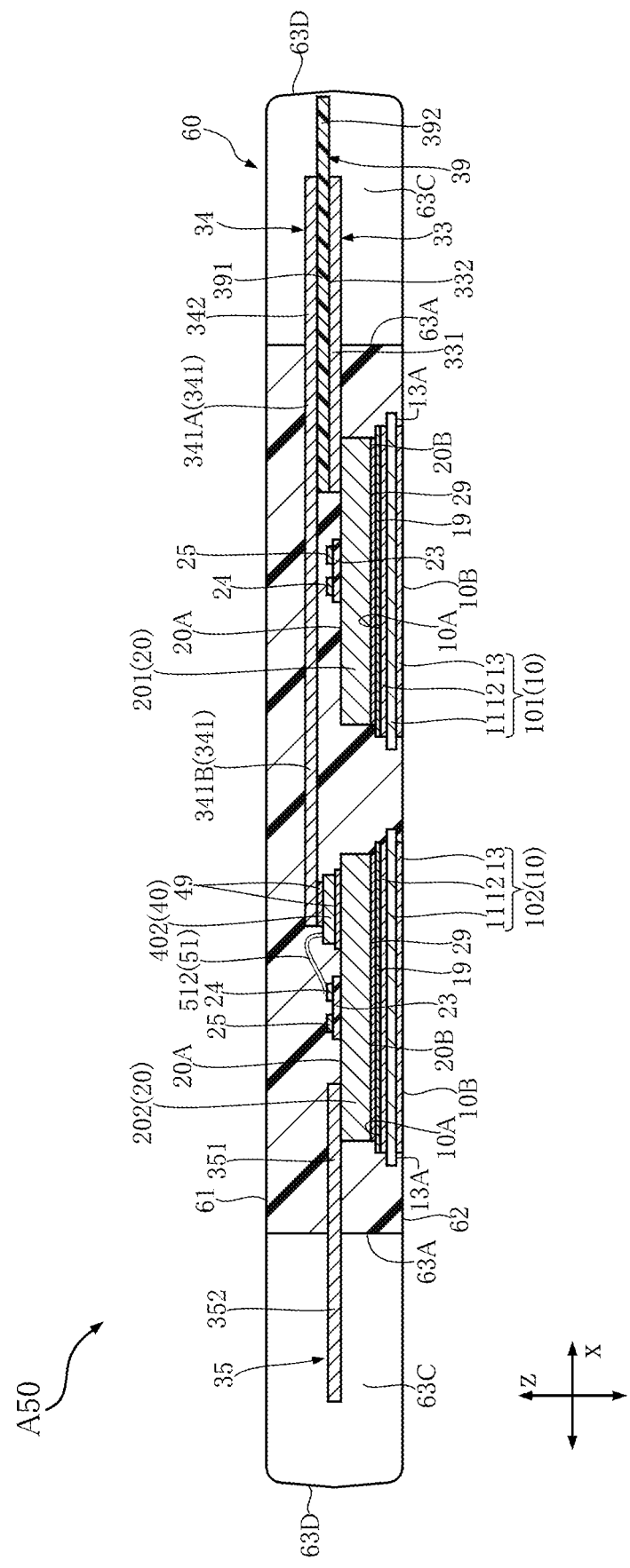
FIG. 39 is a cross-sectional view along line XXXIX-XXXIX in FIG. 36.

As shown in FIGS. 36 to 39, the supporting member 10 includes a first supporting portion 101 and a second supporting portion 102 that are separated apart from each other in the first direction x. Each of the first supporting portion 101 and the second supporting portion 102 includes a first supporting plate 11, a second supporting plate 12, and a bottom plate 13. As shown in FIGS. 38 and 39, the first metal layer 19 covers the supporting surface 10A of each of the first supporting portion 101 and the second supporting portion 102. The first conductive portion 201 is bonded to the second supporting plate 12 of the first supporting portion 101. The second conductive portion 202 is boned to the second supporting plate 12 of the second supporting portion 102.

As shown in FIG. 37, the bottom surface 10B of each of the first supporting portion 101 and the second supporting portion 102 is exposed from the bottom surface 62 of the sealing resin 60. As viewed along the thickness direction, a part of the bottom surface 62 is positioned between the bottom surface 10B of the first supporting portion 101 and the bottom surface 10B of the second supporting portion 102.

The following describes advantages of the semiconductor device A50.

The semiconductor device A50 includes the first metal layer 19 and the second metal layer 29. The first metal layer 19 covers the supporting surface 10A of the supporting member 10. The second metal layer 29 covers the reverse surface 20B of the conductive member 20. The first metal layer 19 and the second metal layer 29 are bonded to each other by solid phase diffusion. This allows the semiconductor device A50 to have an improved heat dissipation property.

In the semiconductor device A50, the supporting member 10 includes the first supporting portion 101 and the second supporting portion 102. The first supporting portion 101 and the second supporting portion 102 are separated apart from each other. The first conductive portion 201 is bonded to the first supporting portion 101. The second conductive portion 202 is bonded to the second supporting portion 102. When the sealing resin 60 is formed during the manufacturing of the semiconductor device A50, the semiconductor device A50 is warped in the thickness direction z due to the shrinkage of the sealing resin 60. The configuration as described above can suppress such shrinkage.

Sixth Embodiment

Figure 40:
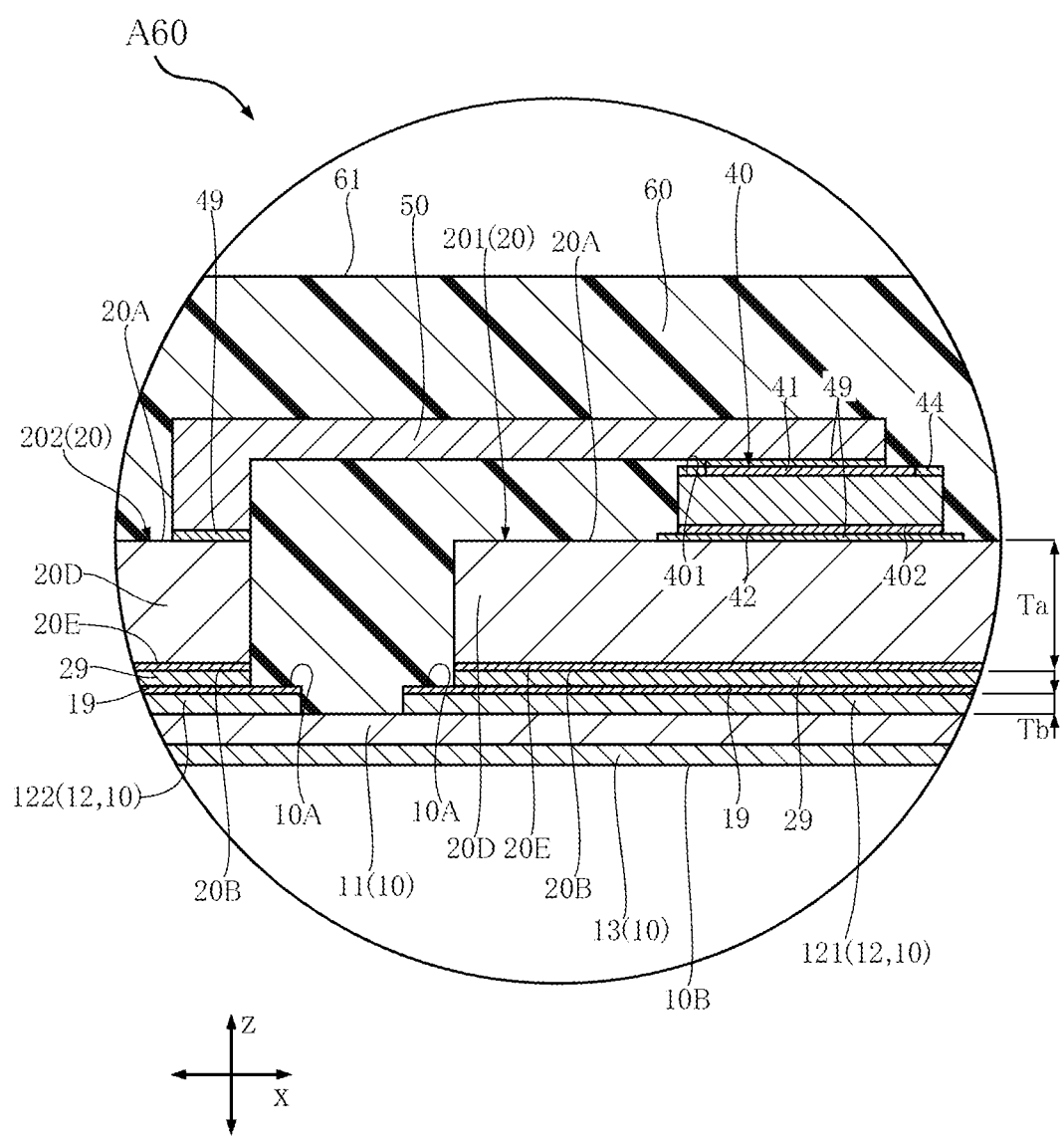
FIG. 40 is a partially enlarged cross-sectional view showing a semiconductor device according to a sixth embodiment of the present disclosure.

A semiconductor device A60 according to a sixth embodiment of the present disclosure will be described with reference to FIGS. 40 to 43B. In these figures, elements that are identical or similar to the elements of the semiconductor device A10 are provided with the same reference signs, and descriptions thereof are omitted. FIG. 40 corresponds to FIG. 8.

The semiconductor device A60 is different from the semiconductor device A10 in the configurations of the conductive member 20 and the second metal layer 29.

As shown in FIG. 40, the conductive member 20 (the first conductive portion 201 and the second conductive portion 202) has a body layer 20D and a bonding layer 20E. The body layer 20D includes an obverse surface 20A. The body layer 20D is a metal plate made of copper or a copper alloy. The bonding layer 20E includes a reverse surface 20B and is formed on the body layer 20D. The bonding layer 20E contains silver as its composition. The bonding layer 20E is thinner than the body layer 20D. The bonding layer 20E is provided by forming a film on the body layer 20D. The film may be formed by a sputtering method or a vacuum deposition method, for example.

Figure 41:
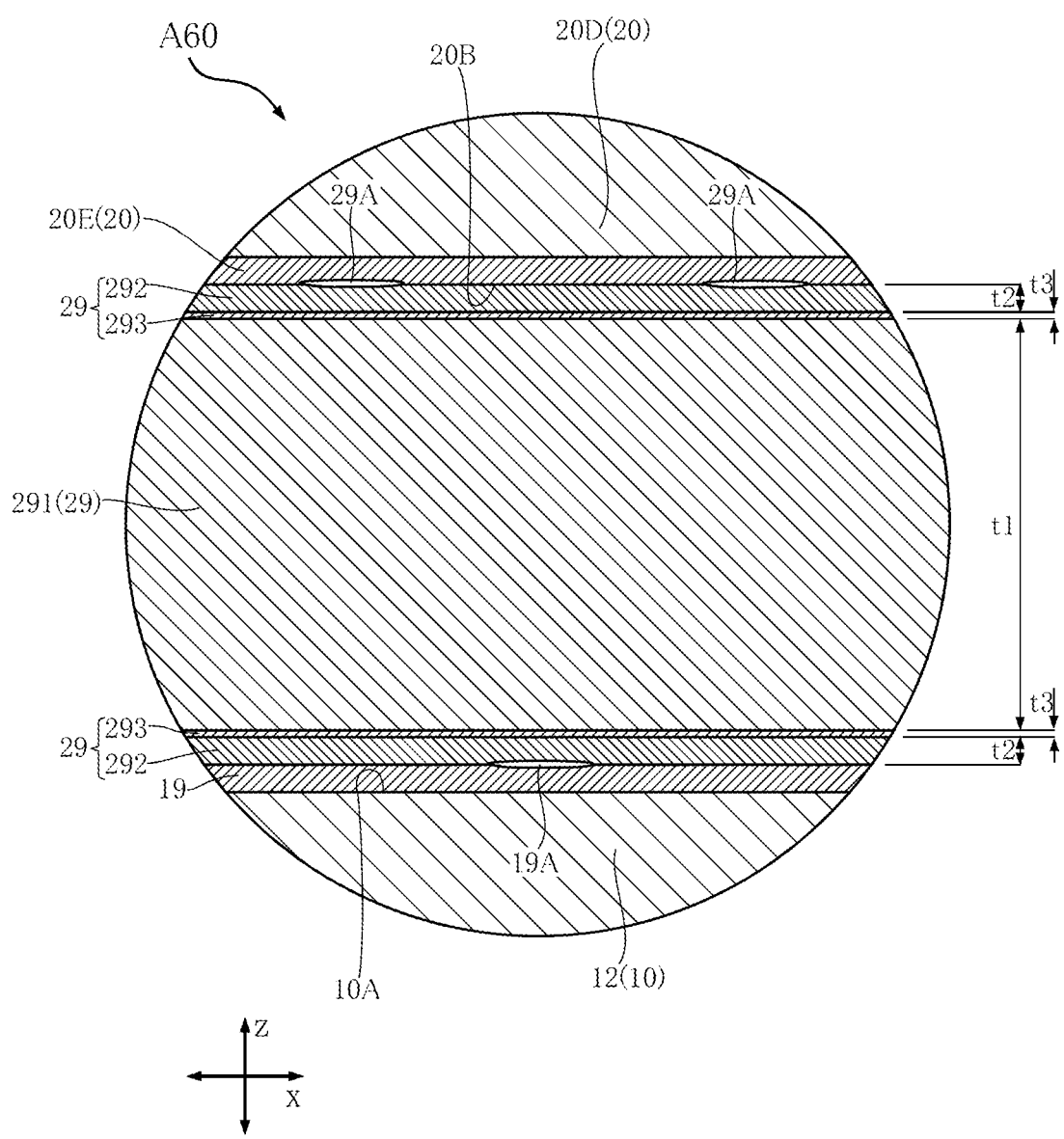
FIG. 41 is a partially enlarged view of FIG. 40.

As shown in FIG. 41, the second metal layer 29 includes a first layer 291, a pair of second layers 292, and a pair of third layers 293. The first layer 291 contains aluminum as its composition. The first layer 291 is an aluminum foil, for example. The thickness t1 of the first layer 291 is larger than the thickness t1 of the first layer 291 in the semiconductor device A10. The pair of second layers 292 flank the first layer 291 in the thickness direction z. Each of the pair of second layers 292 contains silver as its composition. The Vickers hardness of the first layer 291 is smaller than the Vickers hardness of each of the pair of second layers 292. Furthermore, the first layer 291 is thicker than each of the pair of second layers 292. Each of the pair of third layers 293 is provided between the first layer 291 and a different one of the pair of second layers 292. Each of the pair of third layers 293 contains nickel as its composition. The thickness t3 of each of the pair of third layers 293 is smaller than the thickness t1 of the first layer 291, and is also smaller than the thickness t2 of each of the pair of second layers 292. The second metal layer 29 is provided by forming one third layer 293 and one second layer 292 in this order on each side of the first layer 291. The film may be formed by a sputtering method or a vacuum deposition method, for example.

As shown in FIG. 41, the first metal layer 19 is a single layer as in the case of the semiconductor device A10 shown in FIG. 9B. In this case, the first metal layer 19 contains silver as its composition.

In the semiconductor device A60, the reverse surface 20B of the conductive member 20 and one of the pair of second layers 292 are bonded to each other by solid phase diffusion. As a result, gaps 29A are formed between the bonding layer 20E of the conductive member 20 and the one second layer 292. Furthermore, the first metal layer 19 and the other one of the pair of second layers 292 are bonded to each other by solid phase diffusion. As a result, the gaps 19A are formed between the first metal layer 19 and the other second layer 292.

Figure 42A:
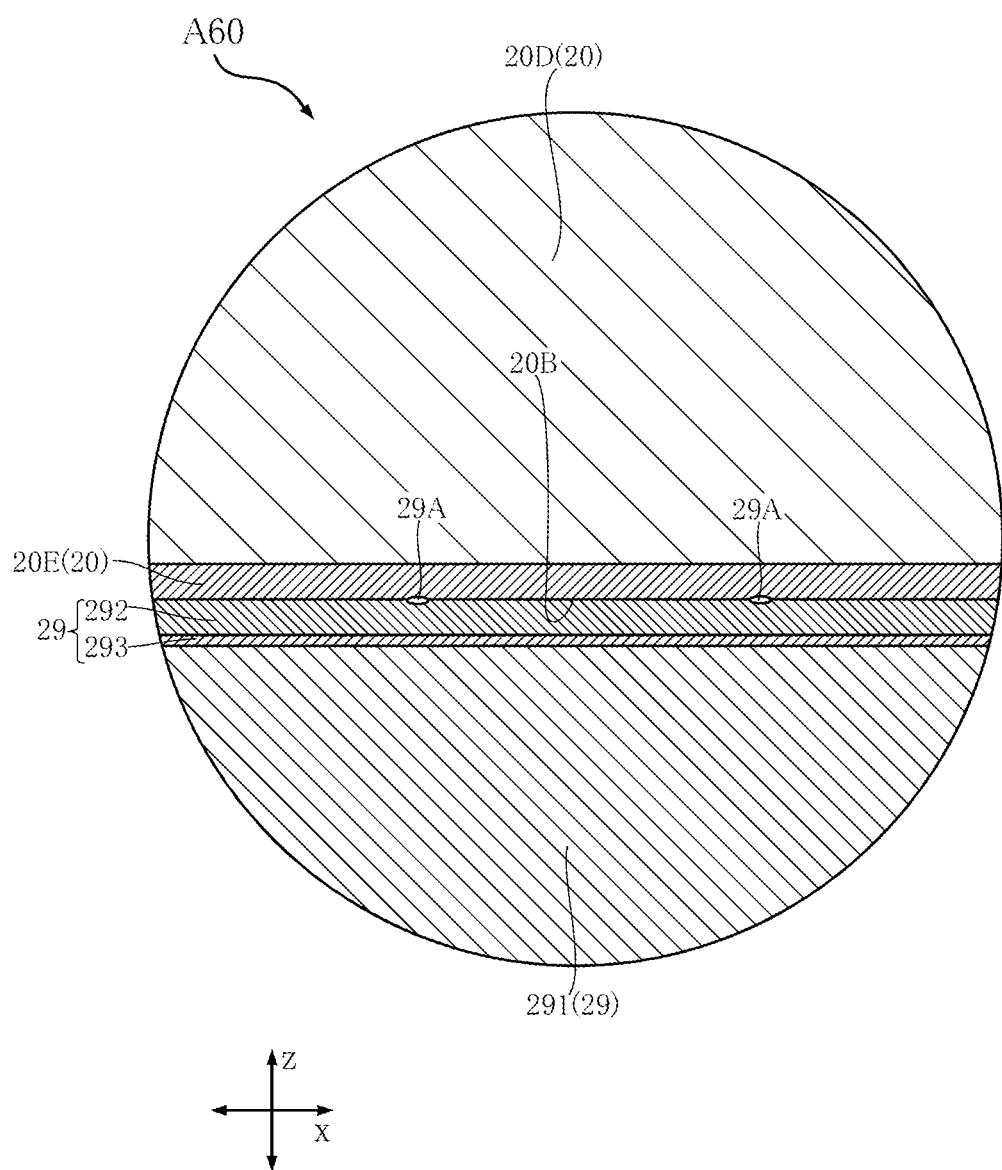
FIG. 42A is a partially enlarged view corresponding to the configuration shown in FIG. 41, and shows the upper end of a central portion of a second metal layer as viewed along the thickness direction.
Figure 42B:
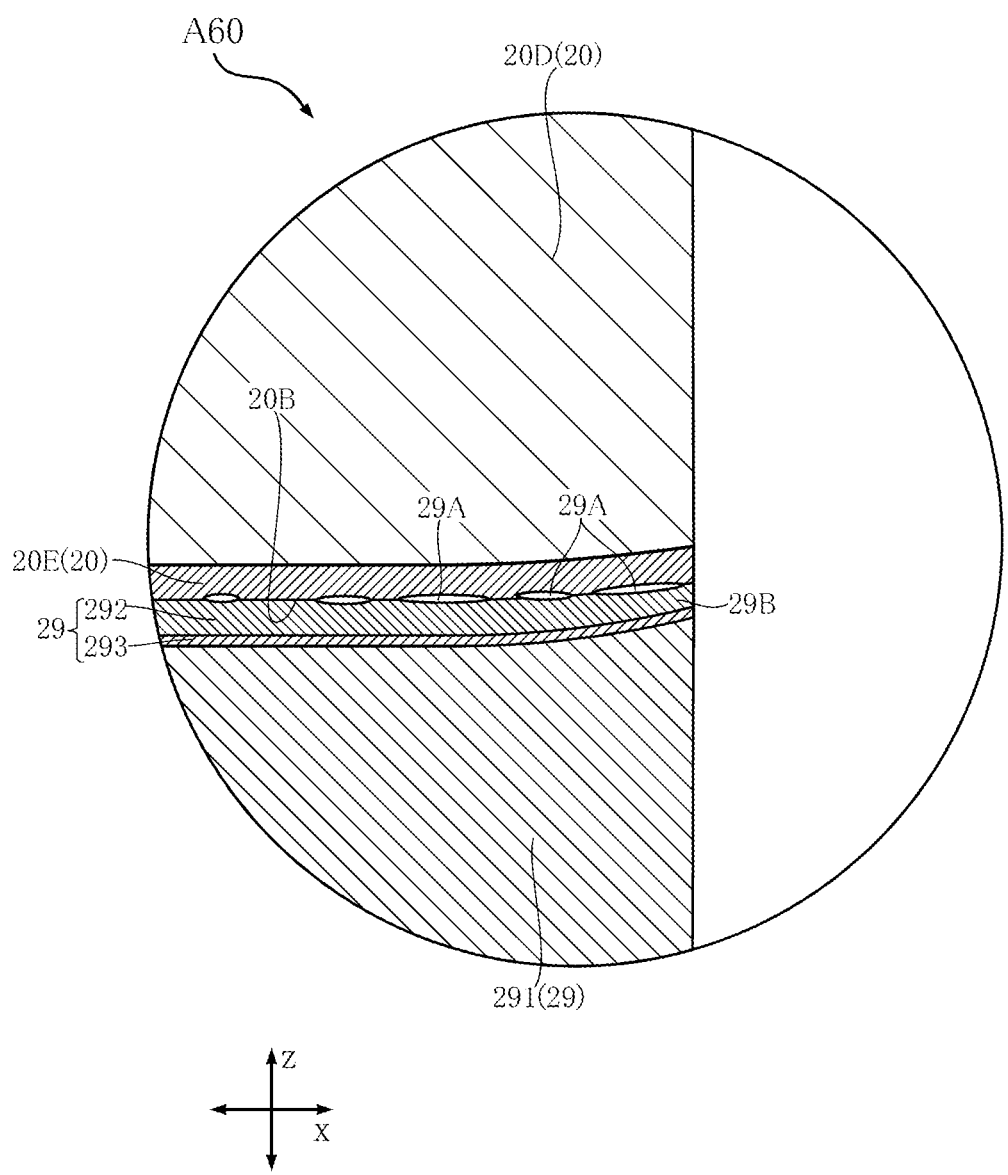
FIG. 42B is a partially enlarged view corresponding to the configuration shown in FIG. 41, and shows the upper end of a periphery portion of the second metal layer as viewed along the thickness direction.

As shown in FIGS. 42A and 42B, the volume of each gap 29A per unit volume of the one second layer 292 is different between the central portion of the one second layer 292 as viewed along the thickness direction z and the periphery portion of the one second layer 292 as viewed along the thickness direction z. The volume of each gap 29A per unit volume of the one second layer 292 at the central portion is smaller than the volume of each gap 29A per unit volume of the one second layer 292 at the periphery portion.

Figure 43A:
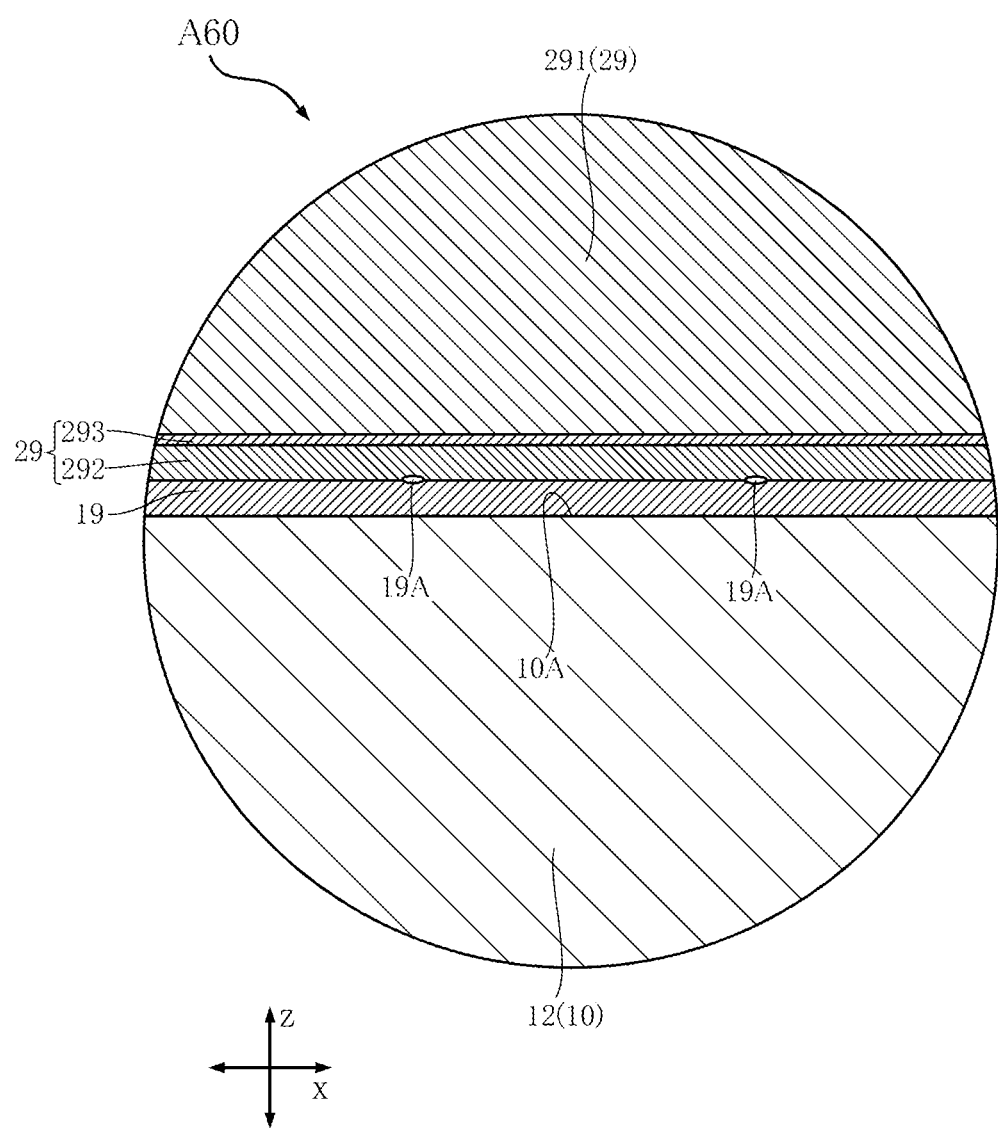
FIG. 43A is a partially enlarged view corresponding to the configuration shown in FIG. 41, and shows the lower end of the central portion of the second metal layer as viewed along the thickness direction.
Figure 43B:
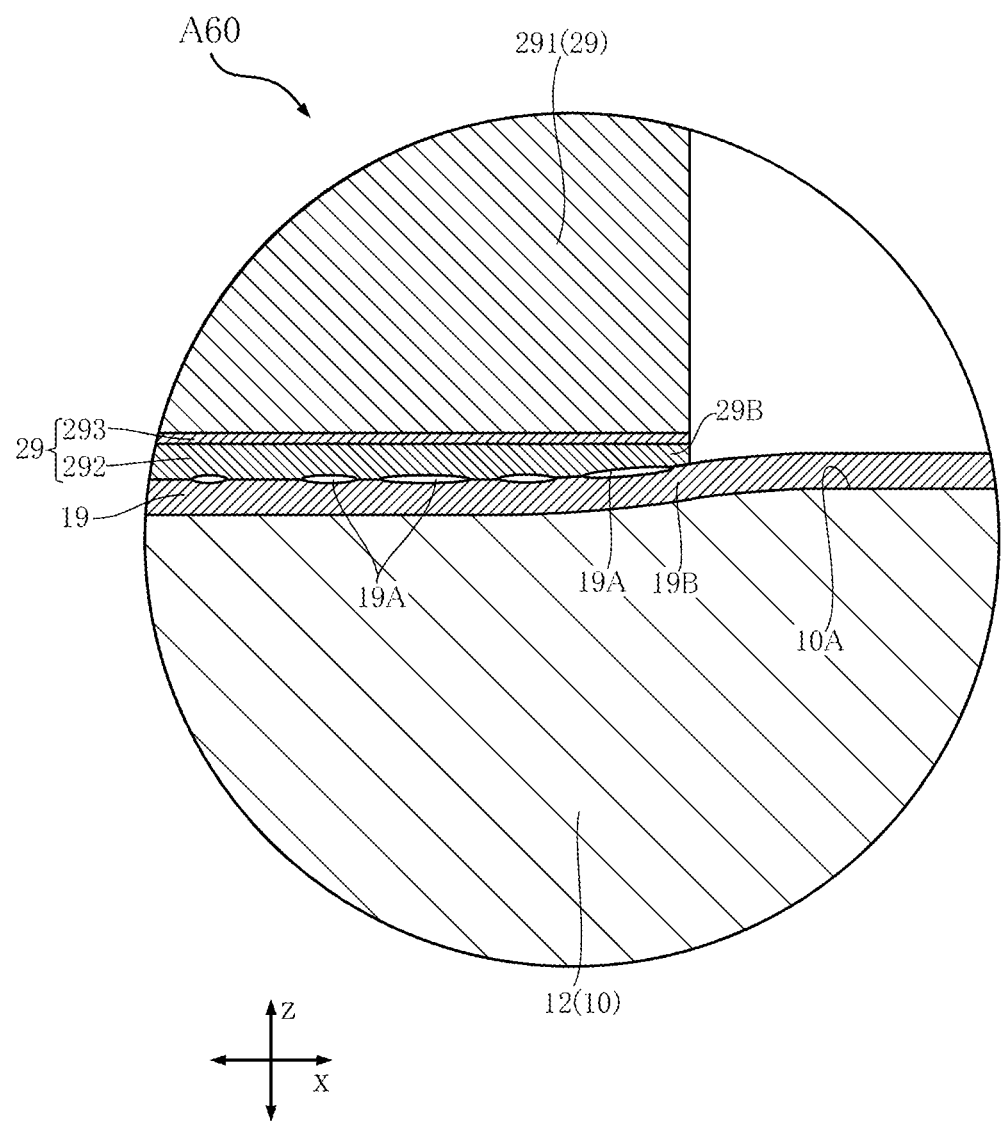
FIG. 43B is a partially enlarged view corresponding to the configuration shown in FIG. 41, and shows the lower end of the periphery portion of the second metal layer as viewed along the thickness direction.

As shown in FIGS. 43A and 43B, the volume of each gap 19A per unit volume of the other second layer 292 is different between the central portion of the other second layer 292 as viewed along the thickness direction z and the periphery portion of the other second layer 292 as viewed along the thickness direction z. The volume of each gap 19A per unit volume of the other second layer 292 at the central portion is smaller than the volume of each gap 19A per unit volume of the other second layer 291 at the periphery portion.

As shown in FIG. 43B, a part of the first metal layer 19, which is in contact with the periphery portion of the second metal layer 29 as viewed along the thickness direction z, is formed with a first curved portion 19B curved in the thickness direction z. In the semiconductor device A60, the first curved portion 19B is curved toward the second metal layer 29 in the thickness direction z. Furthermore, one of the pair of second layers 292 of the second metal layer 29, which is in contact with the first metal layer 19 as viewed along the thickness direction z, is formed with a second curved portion 29B. The second curved portion 29B is positioned at the periphery portion of the second layer 292 and curved in the thickness direction z. The second curved portion 29B is curved toward the same side as the first curved portion 19B is curved in the thickness direction z. In the semiconductor device A60, the second curved portion 29B is curved toward the first layer 291 of the second metal layer 29 in the thickness direction z.

As shown in FIG. 42B, the other one of the pair of second layers 292 of the second metal layer 29, which is in contact with the bonding layer 20E of the conductive member 20 as viewed along the thickness direction z, is formed with a second curved portion 29B. The second curved portion 29B is formed at the periphery of the other second layer 292. In the semiconductor device A60, the second curved portion 29B is curved toward the conductive member 20 in the thickness direction z.

The following describes advantages of the semiconductor device A60.

The semiconductor device A60 includes the first metal layer 19 and the second metal layer 29. The first metal layer 19 covers the supporting surface 10A of the supporting member 10. The second metal layer 29 covers the reverse surface 20B of the conductive member 20. The first metal layer 19 and the second metal layer 29 are bonded to each other by solid phase diffusion. This allows the semiconductor device A60 to have an improved heat dissipation property.

The present disclosure is not limited to the embodiments described above. Various design changes can be made to the specific configurations of the elements disclosed herein.

Various embodiments of the present disclosure may be defined according to the following clauses.

Clause 1. A semiconductor device comprising:
a supporting member having a supporting surface facing in a thickness direction;
a conductive member having an obverse surface facing a same side as the supporting surface faces in the thickness direction, and a reverse surface opposite to the obverse surface, the conductive member being bonded to the supporting member such that the reverse surface faces the supporting surface;
a semiconductor element bonded to the obverse surface; and
a first metal layer covering at least a part of the supporting surface, and a second metal layer covering the reverse surface,
wherein the first metal layer and the second metal layer are bonded to each other by solid phase diffusion.

Clause 2. The semiconductor device according to clause 1, wherein the second metal layer includes a first layer covering the reverse surface, and a second layer opposite to the conductive member with respect to the first layer, and
the first metal layer and the second layer are bonded to each other by solid phase diffusion.

Clause 3. The semiconductor device according to clause 2, wherein the first layer is thicker than the second layer, and
a Vickers hardness of the first layer is smaller than a Vickers hardness of the second layer.

Clause 4. The semiconductor device according to clause 3, wherein as viewed along the thickness direction, a periphery portion of the conductive member is formed with a recess that is recessed from the reverse surface in the thickness direction, and
the recess is in contact with the first layer.

Clause 5. The semiconductor device according to clause 4, wherein as viewed along the thickness direction, a maximum thickness of a central portion of the first layer is smaller than a maximum thickness of a periphery portion of the first layer.

Clause 6. The semiconductor device according to any of clauses 2 to 5, wherein the first metal layer includes a third layer between the first layer and the second layer, and
the third layer is thinner than each of the first layer and the second layer.

Clause 7. The semiconductor device according to clause 1, wherein the second metal layer includes a first layer, and a pair of second layers flanking the first metal layer in the thickness direction,
the reverse surface and one of the pair of second layers are bonded to each other by solid phase diffusion, and
the first metal layer and another one of the pair of second layers are bonded to each other by solid phase diffusion.

Clause 8. The semiconductor device according to clause 7, wherein the first layer is thicker than each of the pair of second layers, and
a Vickers hardness of the first layer is smaller than a Vickers hardness of each of the pair of second layers.

Clause 9. The semiconductor device according to clause 8, wherein as viewed along the thickness direction, a part of the first metal layer, which is in contact with a periphery portion of the second metal layer, is formed with a first curved portion curved in the thickness direction.

Clause 10. The semiconductor device according to clause 9, wherein as viewed along the thickness direction, a periphery portion of at least one of the pair of second layers is formed with a second curved portion curved in the thickness direction, and
the second curved portion is curved toward a same side as the first curved portion is curved in the thickness direction.

Clause 11. The semiconductor device according to any of clauses 7 to 10, wherein the first metal layer includes a pair of third layers each provided between the first layer and a different one of the pair of second layers, and
each of the pair of third layers is thinner than each of the first layer and the pair of second layers.

Clause 12. The semiconductor device according to any of clauses 2 to 11, wherein the supporting member includes a first supporting plate that is electrically insulative, and a second supporting plate having the supporting surface and formed on the first supporting plate, the second supporting plate being made of a metal,
the conductive member is a metal plate, and
the conductive member is thicker than the second supporting plate.

Clause 13. The semiconductor device according to clause 2 or 3, wherein the supporting member is an insulating plate,
the conductive member includes a first wiring layer having the obverse surface, a second wiring layer having the reverse surface, and a base layer provided between the first wiring layer and the second wiring layer and containing carbon, and
the base layer is thicker than the supporting member.

Clause 14. The semiconductor device according to clause 13, wherein the base layer is made of single-crystal graphite, and
an in-plane direction of the graphite is along the thickness direction.

Clause 15. The semiconductor device according to any of clauses 12 to 14, further comprising a sealing resin that covers the conductive member, the semiconductor element, and a part of the supporting member,
wherein the supporting member has a bottom surface opposite to the supporting surface, and
the bottom surface is exposed from the sealing resin.

The invention claimed is:

1. A semiconductor device comprising:
a supporting member having a supporting surface facing in a thickness direction;
a conductive member having an obverse surface facing a same side as the supporting surface faces in the thickness direction, and a reverse surface opposite to the obverse surface, the conductive member being bonded to the supporting member such that the reverse surface faces the supporting surface;
a semiconductor element bonded to the obverse surface; and
a first metal layer covering at least a part of the supporting surface, and a second metal layer covering the reverse surface,
wherein the first metal layer and the second metal layer are bonded to each other,
the supporting member includes a first supporting plate that is electrically insulative, and a second supporting plate having the supporting surface and formed on the first supporting plate, the second supporting plate being made of a metal,
the conductive member is a metal plate, and
the conductive member is thicker than the second supporting plate.

2. The semiconductor device according to claim 1, wherein the second metal layer includes a first layer covering the reverse surface, and a second layer positioned opposite to the conductive member with respect to the first layer, and
the first metal layer and the second layer are bonded to each other by solid phase diffusion.

3. The semiconductor device according to claim 2, wherein the first layer is thicker than the second layer, and
a Vickers hardness of the first layer is smaller than a Vickers hardness of the second layer.

4. The semiconductor device according to claim 3, wherein as viewed along the thickness direction, a periphery portion of the conductive member is formed with a recess that is recessed from the reverse surface in the thickness direction, and
the recess is in contact with the first layer.

5. The semiconductor device according to claim 4, wherein as viewed along the thickness direction, a maximum thickness of a central portion of the first layer is smaller than a maximum thickness of a periphery portion of the first layer.

6. The semiconductor device according to claim 2, wherein the first metal layer includes a third layer between the first layer and the second layer, and
the third layer is thinner than each of the first layer and the second layer.

7. The semiconductor device according to claim 1, wherein the second metal layer includes a first layer, and a pair of second layers flanking the first metal layer in the thickness direction,
the reverse surface and one of the pair of second layers are bonded to each other by solid phase diffusion, and
the first metal layer and another one of the pair of second layers are bonded to each other by solid phase diffusion.

8. The semiconductor device according to claim 7, wherein the first layer is thicker than each of the pair of second layers, and
a Vickers hardness of the first layer is smaller than a Vickers hardness of each of the pair of second layers.

9. The semiconductor device according to claim 8, wherein as viewed along the thickness direction, a part of the first metal layer, which is in contact with a periphery portion of the second metal layer, is formed with a first curved portion curved in the thickness direction.

10. The semiconductor device according to claim 9, wherein as viewed along the thickness direction, a periphery portion of at least one of the pair of second layers is formed with a second curved portion curved in the thickness direction, and
the second curved portion is curved toward the same side as the first curved portion is curved in the thickness direction.

11. The semiconductor device according to claim 7, wherein the first metal layer includes a pair of third layers each provided between the first layer and a different one of the pair of second layers, and
each of the pair of third layers is thinner than each of the first layer and the pair of second layers.

12. A semiconductor device comprising:
a supporting member having a supporting surface facing in a thickness direction;
a conductive member having an obverse surface facing a same side as the supporting surface faces in the thickness direction, and a reverse surface opposite to the obverse surface, the conductive member being bonded to the supporting member such that the reverse surface faces the supporting surface;
a semiconductor element bonded to the obverse surface; and
a first metal layer covering at least a part of the supporting surface, and a second metal layer covering the reverse surface,
wherein the first metal layer and the second metal layer are bonded to each other,
the supporting member is an insulating plate,
the conductive member includes a first wiring layer having the obverse surface, a second wiring layer having the reverse surface, and a base layer provided between the first wiring layer and the second wiring layer and containing carbon, and
the base layer is thicker than the supporting member.

13. The semiconductor device according to claim 12, wherein the base layer is made of graphite, and
an in-plane direction of the graphite is along the thickness direction.

14. The semiconductor device according to claim 1, further comprising a sealing resin that covers the conductive member, the semiconductor element, and a part of the supporting member,
wherein the supporting member has a bottom surface opposite to the supporting surface, and
the bottom surface is exposed from the sealing resin.

15. A semiconductor device comprising:
a supporting member having a supporting surface facing in a thickness direction;
a conductive member having an obverse surface facing a same side as the supporting surface faces in the thickness direction, and a reverse surface opposite to the obverse surface, the conductive member being bonded to the supporting member such that the reverse surface faces the supporting surface;
a semiconductor element bonded to the obverse surface;
a first metal layer covering at least a part of the supporting surface, and a second metal layer covering the reverse surface;

a strip-shaped metal lead or a plurality of wires electrically connected to an obverse surface electrode of the semiconductor element;
a sealing resin;
an additional conductive member having an obverse surface and a reverse surface; and
an additional semiconductor element bonded to the obverse surface of the additional conductive member,
wherein the first metal layer and the second metal layer are bonded to each other by solid phase diffusion,
the additional conductive member is bonded to the supporting member such that the reverse surface of the additional conductive member faces the supporting surface,
the semiconductor element is a MOSFET made of a semiconductor material mainly composed of silicon carbide,
the semiconductor element has a first surface and a second surface respectively facing opposite to each other in the thickness direction,
a source current runs on the first surface,
a drain current runs on the second surface, and
the second surface is conductively connected to the obverse surface of the conductive member.

16. The semiconductor device according to claim 12, wherein the second metal layer includes a first layer covering the reverse surface, and a second layer positioned opposite to the conductive member with respect to the first layer, and
the first metal layer and the second layer are bonded to each other by solid phase diffusion.

* * * * *